US007009884B2

(12) United States Patent
Yaoi et al.

(10) Patent No.: US 7,009,884 B2
(45) Date of Patent: Mar. 7, 2006

(54) SEMICONDUCTOR STORAGE DEVICE, DISPLAY DEVICE AND PORTABLE ELECTRONIC EQUIPMENT

(75) Inventors: Yoshifumi Yaoi, Yamatokooriyama (JP); Hiroshi Iwata, Nara-ken (JP); Akihide Shibata, Nara (JP); Yoshinao Morikawa, Ikoma (JP); Masaru Nawaki, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 59 days.

(21) Appl. No.: 10/848,260

(22) Filed: May 19, 2004

(65) Prior Publication Data

US 2005/0001243 A1 Jan. 6, 2005

(30) Foreign Application Priority Data

May 20, 2003 (JP) .............................. 2003-141908

(51) Int. Cl.
*G11C 16/06* (2006.01)
(52) U.S. Cl. ........................ 365/185.22; 365/185.05; 365/185.15
(58) Field of Classification Search ........... 365/185.22, 365/185.05, 185.14
See application file for complete search history.

(56) References Cited

U.S. PATENT DOCUMENTS 5,523,972 A 6/1996 Rashid et al.

| | | | | |
|---|---|---|---|---|
| 5,748,535 A | * | 5/1998 | Lin et al. ................ | 365/185.05 |
| 6,400,604 B1 | * | 6/2002 | Noda ..................... | 365/185.22 |
| 6,628,546 B1 | * | 9/2003 | Ogura et al. ........... | 365/185.14 |

FOREIGN PATENT DOCUMENTS

| | | |
|---|---|---|
| JP | 5-81072 B2 | 11/1993 |
| JP | 5-304277 A | 11/1993 |
| JP | 9-97849 A | 4/1997 |
| JP | 9-116119 A | 5/1997 |
| JP | 2001-156188 A | 6/2001 |
| JP | 2001-230332 A | 8/2001 |
| WO | 99/07000 A2 | 2/1999 |

* cited by examiner

*Primary Examiner*—Huan Hoang
(74) *Attorney, Agent, or Firm*—Birch Stewart Kolasch & Birch

(57) ABSTRACT

A semiconductor storage device includes a memory cell array 21 in which a plurality of memory elements are arranged and a program verify circuit 30. The memory element 1, 33 includes a gate electrode 104 formed on a semiconductor layer 102 via a gate insulator 103, a channel region arranged below the gate electrode 104, diffusion regions 107a, 107b that are located on opposite sides of the channel region and have a conductive type opposite to that of the channel region, and memory function bodies 109 that are located on opposite sides of the gate electrode 104 and have a function of retaining electric charge. A program load register 32 of the program verify circuit 30 eliminates a state that a memory element 33 which has initially been verified as having been correctly programmed needs to be further programmed.

22 Claims, 25 Drawing Sheets ic equipment including such a semiconductor storage
SEMICONDUCTOR STORAGE DEVICE, DISPLAY DEVICE AND PORTABLE ELECTRONIC EQUIPMENT This nonprovisional application claims priority under 35 U.S.C. §119(a) on patent application No. 2003-141908 filed in Japan on May 20, 2003, the entire contents of which are hereby incorporated by reference.

BACKGROUND OF THE INVENTION

The present invention relates to a semiconductor storage device and portable electronic equipment. The invention relates, more specifically, to a semiconductor storage device that has a memory cell array in which nonvolatile memory elements constructed of field-effect transistors including memory function bodies having a function to retain electric charge or polarization are arranged and to portable electronic equipment including such a semiconductor storage device.

Conventionally, a flash memory has typically been used as a nonvolatile semiconductor storage device.

In this flash memory, as shown in FIG. 34, a floating gate 902, an insulation film 907 and a word line (control gate) 903 are formed in this order via a gate insulation film 908 on a semiconductor substrate 901, and a source line 904 and a bit line 905 are formed on both sides of the floating gate 902, constituting a memory cell. Around this memory cell are formed element isolation regions 906 (refer to Japanese Patent Laid-Open Publication No. HEI 5-304277).

The memory cell retains storage as the quantity of charge in the floating gate 902. In the memory cell array constructed by arranging the memory cells, the desired memory cell can be subjected to rewrite and read operations by selecting the specified word line and bit line and applying a predetermined voltage to the lines.

The flash memory as described above exhibits a drain current Id to gate voltage Vg characteristic indicated by the solid line curve and the dashed line curve in FIG. 35 when the quantity of charges in the floating gate 902 changes. That is, if the quantity of negative charges in the floating gate 902 is increased, then the characteristic curve changes from the characteristic indicated by the solid line curve to the characteristic indicated by the broken line curve in FIG. 41, and the Id-Vg curve is displaced roughly parallel in a direction in which the gate voltage Vg increases with respect to same drain current Id, and the threshold voltage increases.

However, the flash memory as described above has been functionally required to arrange the insulation film 907 that isolates the floating gate 902 from the word line 903 and had difficulties in reducing the thickness of the gate insulation film 908 to prevent the leak of charges from the floating gate 902. Thus, the need for the insulator 907 and the gate insulator 908 each having a specified thickness would be an obstacle to miniaturization of memory cells.

SUMMARY OF THE INVENTION

Accordingly, an embodiment of the present invention provides a semiconductor storage device and portable electronic equipment including nonvolatile memory elements that are easy to miniaturize.

According to an embodiment of the present invention, there is provided a semiconductor storage device comprising a memory cell array having a plurality of memory elements, and a program verify circuit for controlling application of programming voltages into the plurality of memory elements, wherein each of the memory elements comprises:
a gate electrode formed on a semiconductor layer via a gate insulator;
a channel region arranged below the gate electrode via the gate insulator;
diffusion regions which are arranged on opposite sides of the channel region and which have a conductive type opposite to that of the channel region; and
memory function bodies which are formed on opposite sides of the gate electrode and which have a function of retaining electric charge or polarization, and wherein the program verify circuit comprises:
a comparator for comparing a current state of each memory element being programmed with a state to which the memory element is to be programmed; and
a program load circuit which is connected to the comparator and which stores, for each memory element, a value outputted from the comparator and indicating whether or not the memory element should be further programmed, the program load circuit including a circuit for, once the memory element has initially been verified by the comparator as having been programmed, precluding storing for each memory element a value indicating that the memory element needs to be further programmed.

According to the above-mentioned construction, the memory element of the memory cell array comprises the memory function bodies located on both sides of the gate electrode in place of the conventional floating gate, and therefore, the thickness of the gate insulator can be made thin and fine. Therefore, the semiconductor storage device can be miniaturized.

Furthermore, the formation process of the memory element is highly compatible with the formation process of ordinary transistors. Therefore, in comparison with the case where the memory cell array that employs a prior art flash memory as a nonvolatile memory element is combined with a row decoder, a column decoder, a program verify circuit and so on constructed of an ordinary transistor for consolidation, the semiconductor storage device of the present invention is allowed to remarkably reduce numbers of masks and processes. Therefore, the yield of chips is improved, and the cost can be reduced.

Furthermore, in the memory element, the memory function borne by the memory function bodies and the transistor operation function borne by the gate insulator are separated from each other. Therefore, it is easy to restrain the short-channel effect by reducing the film thickness of the gate insulator with a sufficient memory function possessed. Furthermore, the value of the current flowing between the diffusion regions due to rewrite largely changes in comparison with an EEPROM. Therefore, it becomes easy to distinguish between the write state and the erase state of the semiconductor storage device.

Moreover, according to the above constitution, the program load circuit includes a circuit for, once the memory element has first been verified as having been written by the comparator, excluding storage of a value showing that the memory element needs to be further written with respect to each memory element. Therefore, write (program) pulses are not applied to memory elements that have been correctly written although not having been verified because of dissipation of electric charge.

Thus, according to the semiconductor storage device of an embodiment of the present invention, the memory elements can be programmed fast and verified fast, and yet can eliminate the possibility that overcharged memory elements may occur during the write operation.

In one embodiment, the memory function bodies owned by the memory element further include a charge retention film extended roughly parallel to a side surface of the gate electrode.

According to the aforementioned embodiment, the write speed of the memory element is increased, and the program verify operation speed can be increased. Moreover, the memory element can be programmed with high accuracy to the desired level while restraining variations in the memory effect, and the program verify operation can be completed within a short time.

Moreover, in one embodiment, a p-type highly doped region is provided adjacently to the channel side of the n-type diffusion region owned by the memory element.

According to the aforementioned embodiment, the write speed of the memory element is increased, and the program verify operation speed can be increased.

Moreover, in one embodiment, the memory element has an insulation film which insulates a film that has a surface roughly parallel to a surface of the gate insulator and a function to retain electric charge from the channel region or the semiconductor layer, and the insulation film has a film thickness thinner than a film thickness of the gate insulator and is not thinner than 0.8 nm.

According to the above-mentioned embodiment, injection of electric charge into the memory function bodies is facilitated, and the speed of write into the memory element is increased. This makes it possible to increase the program verify operation speed, achieve write with a low voltage and reduce the power consumption of the program verify operation.

Moreover, in one embodiment, at least part of the memory function bodies owned by the memory element overlaps part of the diffusion region.

According to the above-mentioned embodiment, write can be performed with a low voltage without a supplementary gate, and the power consumption of the program verify operation can be reduced.

In one embodiment, each of the memory function bodies of the memory element includes a film having a surface roughly parallel to a surface of the gate insulator and having a function of retaining electric charge.

In this embodiment, write to a desired level can be achieved with high accuracy by suppressing variations in the memory effect, and the program verify operation can be completed within a short time.

Moreover, the portable electronic equipment of embodiments of the present invention comprises the aforementioned semiconductor storage device.

According to the above-mentioned construction, the consolidation process of the memory element and the logic circuit is simple. Therefore, the manufacturing cost can be restrained, which leads to a low cost, and the operation speed of read and write can be improved.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
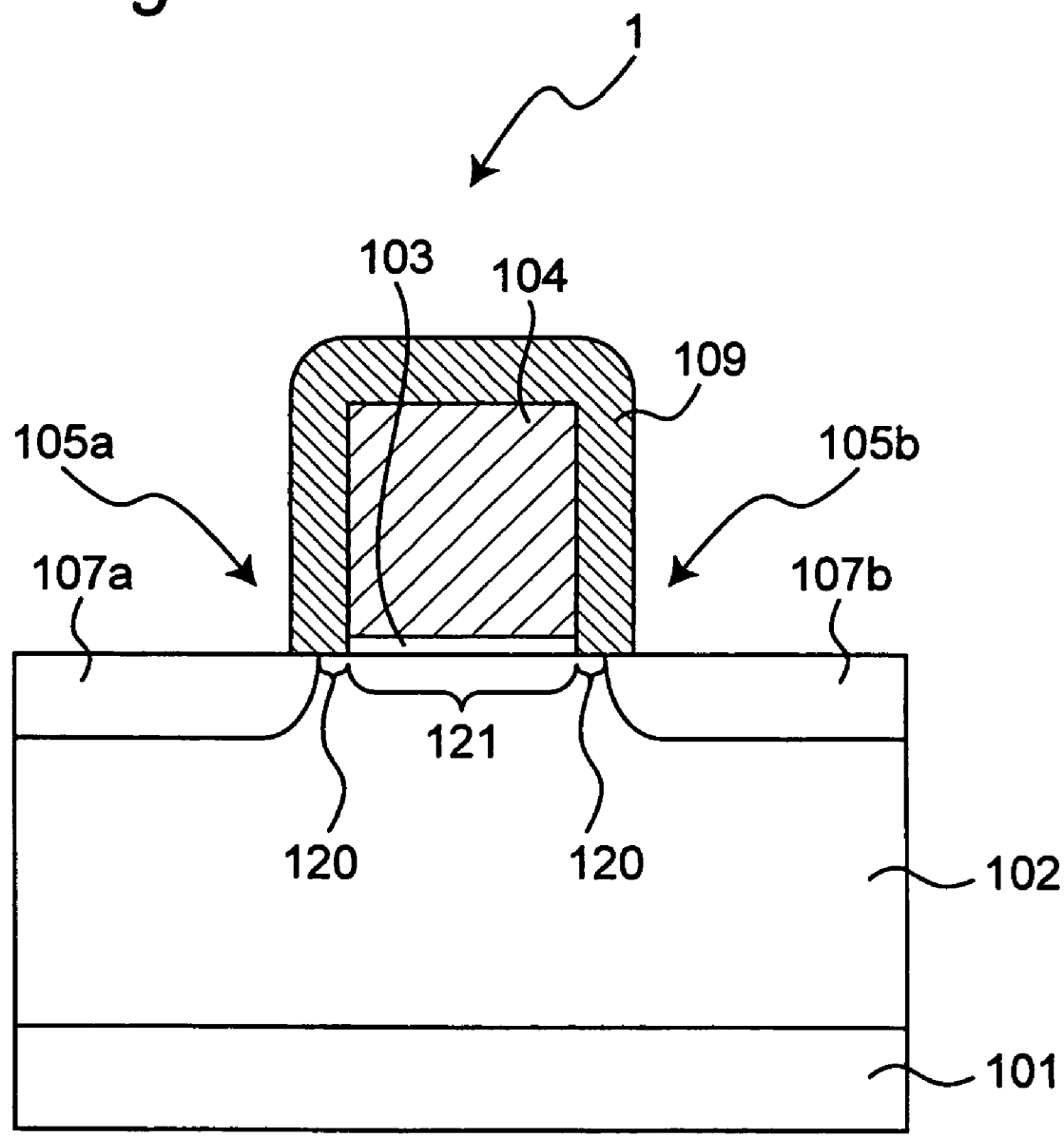
FIG. 1 is a schematic sectional view of part of a memory element in the semiconductor storage device of the first embodiment of the present invention.

An outline of a nonvolatile memory element to be employed in various embodiments of the semiconductor storage device of the present invention will be described first.

The memory element is constructed mainly of a semiconductor layer, a gate insulation film, a gate electrode, a channel region, a diffusion region and a memory function body. In this case, the channel region generally means a region of the same conductive type as that of the semiconductor layer, or a region right under the gate electrode, while the diffusion region means a region of the conductive type opposite to that of the channel region.

Specifically, the memory element, which may be constructed of one first conductive type region that is the diffusion region, a second conductive type region that is the channel region, one memory function body arranged across regions of the first and second conductive types, and an electrode provided via the gate insulation film, should properly be constructed of a gate electrode formed on the gate insulation film, two memory function bodies formed on both sides of the gate electrode, two diffusion regions arranged on both sides of the memory function body oppositely to the gate electrode, and a channel region arranged under the gate electrode.

The semiconductor device of an embodiment of the present invention should be formed as a semiconductor layer on a semiconductor substrate or preferably formed on a well region of the first conductive type formed in the semiconductor substrate.

The semiconductor substrate is not specifically limited so long as it is used for a semiconductor device, and there can be enumerated, for example, bulk substrates of elemental semiconductors of silicon, germanium and so on and compound semiconductors of silicon germanium, GaAs, InGaAs, ZnSe, GaN and so on. Moreover, it is acceptable to employ various substrates such as an SOI (Silicon on Insulator) substrate, an SOS (Silicon on Sapphire) substrate and a multi-layer SOI substrate and a glass or plastic substrate on which a semiconductor layer is possessed, as those which have a semiconductor layer on its surface. Among others, a silicon substrate, an SOI substrate on the surface of which a silicon layer is formed or the like, is preferable. The semiconductor substrate or the semiconductor layer may be single crystal (by, for example, epitaxial growth), polycrystal or amorphous although there are variations in the quantity of current flowing inside.

It is preferred that an element isolation region is formed on this semiconductor layer, and a single or multi-layer structure may be formed by a combination of the elements of transistors, capacitors, resistors and so on, circuits of these elements, semiconductor devices and layer insulation films. The element isolation region can be formed of various element isolation films such as a LOCOS (Local Oxidation of Silicon) film, a trench oxide film and an STI (Shallow Trench Isolation) film. The semiconductor layer may have the P-type or the N-type conductive type, and it is preferred that a well region of at least one first conductive type (P-type or N-type) be formed on the semiconductor layer. There can be employed a semiconductor layer and a well region whose impurity concentrations are within the ranges well known in the field. When the SOI substrate is employed as a semiconductor layer, a well region may be formed on the surface semiconductor layer, or a body region may be possessed under the channel region.

The gate insulation film is generally not specifically limited so long as it is used for a semiconductor device, and there can be employed: for example, an insulation film such as a silicon oxide film and a silicon nitride film; a single layer film or a laminate film of a high dielectric film such as an aluminum oxide film, a titanium oxide film, a tantalum oxide film and a hafnium oxide film. Among others, the silicon oxide film is preferable. The gate insulation film should have a film thickness of, for example, about 1 to 20 nm and preferably have a film thickness of about 1 to 6 nm. The gate insulation film may be formed only right under the gate electrode or formed larger (wider) than the gate electrode.

The gate electrode is formed on the gate insulation film normally in a shape for use in a semiconductor device or a shape that has a concave portion in a lower end portion. The gate electrode, which should preferably be formed in an integrated body without being separated by a single layer or multi-layer conductive film, may be arranged in a separated state by the single layer or multi-layer conductive film. Moreover, the gate electrode may have a side wall insulation film on the side wall. The gate electrode is normally not specifically limited so long as it is used for a semiconductor device, and there can be enumerated the conductive films of: for example, polysilicon; metals of copper and aluminum; high-melting-point metals of tungsten, titanium and tantalum; a single layer film or a multilayer film of high-melting-point metal and silicide thereof; and so on. The gate electrode should properly be formed with a film thickness of, for example, about 50 to 400 nm. It is to be noted that a channel region is formed under the gate electrode.

It is preferred that the gate electrode is formed only on the side wall of the memory function body described later or does not cover the upper portion of the memory function body. With this arrangement, a contact plug can be arranged closer to the gate electrode, and therefore, the miniaturization of the memory element is facilitated. Moreover, the memory element, which has a simple arrangement as described above, is easy to manufacture, and the yield can be improved.

The memory function body has at least a function to retain electric charges (hereinafter referred to as a "charge retention function"). In other words, the memory function body has a function to store and retain charges, trap charges or retain a charge polarized state. This function is fulfilled by the memory function body that includes, for example, a film or region having the charge retention function. As a material that fulfills this function, there can be enumerated: silicon nitride; silicon; silicate glass containing impurities of phosphorus, boron or the like; silicon carbide; alumina; high dielectric materials of hafnium oxide, zirconium oxide, tantalum oxide and the like; zinc oxide; ferroelectric substance; metal and so on. Therefore, the memory function body can be formed of a single layer or laminate structure of: an insulation film including a silicon nitride film; an insulation film including a conductive film or a semiconductor layer inside; an insulation film including at least one conductor or semiconductor dot; or an insulation film including a ferroelectric film in which internal charges are polarized by an electric field and the state is retained. Among others, the silicon nitride film, in which a number of levels for trapping charges exist, is therefore able to obtain a great hysteresis characteristic. Moreover, a charge retention time is long, and there occurs no problem of charge leak due to the generation of a leak path, and therefore, a retention characteristic is satisfactory. Furthermore, a silicon nitride film is preferable because it is normally used in the LSI process.

By employing the insulation film, which internally includes the film having the charge retention function, such as a silicon nitride film, as a memory function body, reliability of storage retention can be improved. The reason for the above is that the silicon nitride film is an insulator and the electric charges of the entire silicon nitride film are not lost at once even when the charge leak partially occurs in the film. Moreover, even if a distance between memory elements is reduced and mutually adjacent memory function bodies are brought in contact with each other when a plurality of memory elements are arranged, the information stored in each of the memory function bodies is not lost dissimilarly to the case where the memory function bodies are constructed of a conductor. Furthermore, the contact plug can be arranged closer to the memory function body and arranged so as to overlap with the memory function body in some cases. Therefore, the miniaturization of the memory element is facilitated.

In order to improve the reliability of storage retention, the film that has the charge retention function is not always required to have a film-like shape, and a film having the charge retention function should preferably exist discretely in the insulation film. In concrete, it is preferred that the film having the charge retention function is distributed in a dot-like form in a material that hardly retains electric charges, or, for example, silicon oxide.

When a conductive film or a semiconductor layer is employed as a charge retaining film, it is preferable to arrange the charge retaining film via an insulation film so as not to come in direct contact with neither one of the semiconductor layer (semiconductor substrate, well region, body region, source/drain region or diffusion region) and the gate electrode. As the insulation film, for example, there can be enumerated a laminate structure of a conductive film and an insulation film, a structure in which a conductive film is distributed in a dot-like form in the insulation film, a structure arranged in a part of the side wall insulation film formed on the side wall of the gate and so on.

By employing the insulation film that internally include a conductive film or a semiconductor layer as a memory function body, the amount of electric charges to be injected into the conductor or the semiconductor can be freely controlled, and a multi-value arrangement can easily be provided. Therefore, this arrangement is preferable.

Furthermore, by employing the insulation film that includes at least one conductor or semiconductor dots as a memory function body, the write and erase operations can easily be performed by direct tunneling of electric charges, and low power consumption can be achieved. Therefore, this arrangement is preferable.

Moreover, it is acceptable to use a ferroelectric film such as PZT (lead zirconate titanate) and PLZT (lead lanthanum zirconate titanate) whose polarization direction is changed by an electric field as a memory function body. In this case, electric charges are substantially generated by polarization on the surface of the ferroelectric film and retained in the state. Therefore, electric charges are supplied from outside the film that has the memory function, and a hysteresis characteristic similar to that of the film that traps electric charges can be obtained. In addition, since there is no need to inject electric charges from outside the film and the hysteresis characteristic can be obtained only by the polarization of the electric charges in the film, high-speed write and erase can be achieved. Therefore, this arrangement is preferable.

The insulation film, which constitutes the memory function body, should properly be a region for making it difficult for electric charges to escape or a film that has a function to make it difficult for electric charges to escape. As one that fulfills the function to make it difficult for electric charges to escape, a silicon oxide film and so on can be enumerated.

The charge retaining film included in the memory function body is arranged on both sides of the gate electrode directly or via an insulation film and arranged on the semiconductor layer (semiconductor substrate, well region, body region or source/drain region or diffusion region) directly or via a gate insulation film. It is preferred that the charge retaining films located on both sides of the gate electrode be formed so as to cover the whole or part of the side walls of the gate electrode directly or via an insulation film. According to an example of application, when the gate electrode has a concave portion in its lower end portion, the charge retaining film may be formed so as to be completely or partially buried in the concave portion directly or via an insulation film.

The diffusion region can be made to function as a source/drain region and has a conductive type opposite to that of the semiconductor layer or the well region. A junction of the diffusion region and the semiconductor layer or the well region should preferably have a steep slope of impurity concentration. The reason for the above is that hot electrons and hot holes are efficiently generated at a low voltage, and high-speed operation can be achieved at a lower voltage. The junction depth of the diffusion region is not specifically limited and is allowed to be properly adjusted according to the performance and so on of the semiconductor storage device desired to be obtained. When a SOI substrate is employed as a semiconductor substrate, the diffusion region may have a junction depth smaller than the film thickness of the surface semiconductor layer. However, the diffusion region should preferably have a junction depth almost equal to the film thickness of the surface semiconductor layer.

The diffusion region may be arranged so as to overlap with the gate electrode end or arranged so as to meet the gate electrode end or arranged so as to be offset with respect to the gate electrode end. In particular, in the case of offset, the easiness of inversion of the offset region under the charge retaining film is largely changed by the quantity of charges accumulated in the memory function body when the voltage is applied to the gate electrode, increasing the memory effect and reducing the short-channel effect. Therefore, this arrangement is preferable. However, since a drive current between the diffusion regions (source and drain) is significantly reduced if the offset is excessive, it is preferred that the amount of offset, i.e., a distance from one gate electrode end to the nearer diffusion region in the direction of the gate length should preferably be shorter than the thickness of the charge retaining film in the direction parallel to the gate length direction. What is particularly important in some embodiments of the invention is that at least part of the film or region having the charge retention function in the memory function body overlaps with part of the diffusion region. The reason for the above is that the essence of the memory elements that constitute the semiconductor storage device is to rewrite stored information by an electric field which is applied across the memory function body in accordance with the voltage difference between the gate electrode, and the diffusion region existing only in the side wall portion of the memory function body, and the diffusion region.

The diffusion region may be partially extended to a position higher than the surface of the channel region, i.e., the lower surface of the gate insulation film. In this case, it is proper that a conductive film integrated with this diffusion region is constructed while being laminated on the diffusion region formed in the semiconductor substrate. As the conductive film, there can be enumerated, for example, semiconductor of polysilicon, amorphous silicon or the like, silicide, aforementioned metals, high-melting-point metals and so on. Among others, polysilicon is preferable. The reason for the above is that the polysilicon, of which the impurity diffusion speed is significantly greater than that of the semiconductor layer, easily tolerates a shallowed junction depth of the diffusion region in the semiconductor layer and easily suppresses a short-channel effect. In this case, it is preferable to provide an arrangement that part of this diffusion region and the gate electrode hold at least part of the memory function body therebetween.

The memory element can be formed by the ordinary semiconductor process according to a method similar to the method of forming a side wall spacer of a single layer or laminate structure on the side wall of the gate electrode. Specifically, there can be enumerated: a method for forming a gate electrode, thereafter forming a single layer film or a multilayer film including a film having the charge retention function (hereinafter referred to as a "charge retaining film"), a charge retaining film such as a charge retaining film/insulation film, an insulation film/charge retaining film and an insulation film/charge retaining film/insulation film and leaving these films in a side wall spacer shape by etching back under appropriate conditions; a method for forming an insulation film or a charge retaining film, leaving the films in a side wall spacer shape by etching back under appropriate conditions, further forming a charge retaining film or an insulation film and leaving the films in a side wall spacer shape by etching back under appropriate conditions; a method for coating or depositing an insulation film material in which a particulate charge retaining material is distributed on a semiconductor layer including a gate electrode, and leaving the insulation film material in a side wall spacer shape by etching back under appropriate conditions; a method for forming a gate electrode, thereafter forming the single layer film or the multilayer film and carrying out patterning by using a mask and so on. Moreover, there can be enumerated a method for forming a charge retaining film, a charge retaining film/insulation film, an insulation film/charge retaining film, an insulation film/charge retaining film/insulation film and so on before forming the gate electrode, forming an opening in a region that becomes a channel region of these films, forming a gate electrode material film on the entire upper surface and patterning this gate electrode material film in a shape, which is larger than the opening and includes the opening and so on.

One example of the formation process of this memory element will be described.

First of all, a gate insulation film and a gate electrode are formed on a semiconductor substrate according to a well-known procedure. Subsequently, a silicon oxide film is formed by the thermal oxidation method to a film thickness of 0.8 to 20 nm, or more preferably to a film thickness of 3 to 10 nm or deposited by the CVD (Chemical Vapor Deposition) method on the entire upper surface of the semiconductor substrate. Next, a silicon nitride film is deposited by the CVD method to a film thickness of 2 to 15 nm or more preferably to a film thickness of 3 to 10 nm on the entire upper surface of the silicon oxide film. Further, a silicon oxide film is deposited to a film thickness of 20 to 70 nm on the entire surface of the silicon nitride film by the CVD method.

Subsequently, by etching back the silicon oxide film/silicon nitride film/silicon oxide film by anisotropic etching, a memory function body appropriate for storage is formed in a side wall spacer shape on the side wall of the gate electrode.

Subsequently, by injecting ions using the gate electrodes and the memory function body in the side wall spacer shape used as a mask, a diffusion layer region (source/drain region) is formed. Subsequently, it is proper to carry out a silicide process or an upper portion wiring process according to a well-known procedure.

When a memory cell array is constructed by arranging such memory elements, the best mode of the memory elements is to satisfy, for example, all the required conditions:

(1) the function of the word line is possessed by the integrated body of the gate electrodes of a plurality of memory elements;

(2) the memory function bodies are formed on both sides of the word line;

(3) electric charges in the memory function bodies are retained by an insulator, or in particular, a silicon nitride film;

(4) the memory function bodies are constructed of an ONO (Oxide Nitride Oxide) film, and the silicon nitride film has a surface roughly parallel to the surface of the gate insulation film;

(5) the silicon nitride film in each memory function body is separated by the word line, the channel region and the silicon oxide film;

(6) the silicon nitride film in each memory function body overlaps with the diffusion region;

(7) the thickness of the insulation film, which separates the silicon nitride film that has a surface roughly parallel to the surface of the gate insulation film from the channel region or the semiconductor layer differs from the thickness of the gate insulation film;

(8) write and erase operations of one memory element are performed by a single word line;

(9) there is no electrode (word line) that has a function to assist the write and erase operations on each memory function body; and

(10) the portion put in contact with the diffusion region right under each memory function body has a region where the impurity concentration of the conductive type opposite to the conductive type of the diffusion region is high. Beneficial results are obtained when fewer than all these requirements are satisfied. It is to be noted that the memory elements may satisfy at least one of these requirements.

The most preferable combination of the aforementioned requirements resides, for example, in that (3) electric charges in the memory function bodies are retained by an insulator, or in particular, a silicon nitride film, (6) the insulation film (silicon nitride film) in each memory function body overlaps with the diffusion region, and (9) there is no electrode (word line) that has a function to assist the write and erase operations on each memory function body.

When the requirement (3) and the requirement (9) are satisfied, the memory elements are very useful as follows. First of all, a bit line contact can be arranged closer to the memory function body located on the word line side wall, or even if the memory elements are put close to each other in distance, the plurality of memory function bodies do not interfere with one another, and the storage information can be retained. Therefore, the miniaturization of the memory elements is facilitated. When the charge retaining region in the memory function body is a conductor, interference occurs between the charge retaining regions as the distance between the memory elements is reduced by capacitive coupling, and the storage information cannot be retained.

Moreover, when the charge retaining region in the memory function body is an insulator (e.g., silicon nitride film), there is no need to make each memory function body independent of each memory cell. For example, the memory function bodies formed on both sides of one word line shared by a plurality of memory cells are not required to be isolated every memory cell, and it is possible to share the memory function bodies formed on both sides of one word line by a plurality of memory cells that share the word line. Therefore, the photoetching process for isolating the memory function bodies become unnecessary, and the manufacturing process is simplified. Furthermore, the position alignment margin of the photolithography process and the film etching margin become unnecessary. Therefore, the margin between the memory cells can be reduced. Therefore, even if the formation is carried out on the same microfabrication level, the memory cell occupation area can be miniaturized in comparison with the case where the charge retaining region in the memory function body is a conductor (e.g., polycrystalline silicon film). When the charge retaining region in the memory function body is a conductor, there is needed a photoetching process for separating the memory function bodies every memory cell, and there are needed a photo position alignment margin and a film etching margin.

Furthermore, since there is a simple element structure that has no electrode having the function to assist the write and erase operations on the memory function bodies, the number of processes is reduced, and the yield can be improved. Therefore, consolidation with the transistors that constitute a logic circuit and an analog circuit can be facilitated, and an inexpensive semiconductor storage device can be obtained.

Moreover, the device is more useful when the requirements (3) and (9) are satisfied and the requirement (6) is satisfied. That is, by making the charge retaining region and the diffusion region in each memory function body overlap with each other, the write and erase operations can be performed at a very low voltage. In concrete, the write and erase operations can be performed at a low voltage of not higher than 5 V. This operation produces a very large effect in terms of circuit design. There is no need to make a high voltage in a chip dissimilarly to the flash memory, and therefore, the charge pump circuit, which requires an enormous occupation area, can be eliminated or reduced in scale. Particularly, when a small-scale capacity memory for adjustment is built in a logic LSI, the occupation area of the memory section is dominated by the occupation area of the peripheral circuit for driving the memory cells than the memory cells. Therefore, it is most effective to eliminate or reduce the scale of the memory cell voltage booster circuit in order to reduce the chip size.

When the requirement (3) is not satisfied or when electric charges are retained by a conductor in the memory function body, the write operation can be performed even when the requirement (6) is not satisfied, or when the conductor in the memory function body and the diffusion region do not overlap with each other. This is because the conductor in the memory function body executes write assist by capacitive coupling with the gate electrode.

Moreover, when the requirement (9) is not satisfied, or when there is an electrode that has the function to assist the write and erase operations on the memory function body, the write operation can be performed even when the requirement (6) is not satisfied, or when the insulator in the memory function body and the diffusion region do not overlap with each other.

In the semiconductor storage device of an embodiment of the present invention, the memory element may be connected in series to a transistor on one side or both sides or consolidated with a logic transistor on an identical chip. In the above case, the semiconductor device, or in particular, the memory element can be formed through processes that has very high affinity for the formation processes of ordinary standard transistors of transistors, logic transistors and the like, and therefore, they can be concurrently formed. Therefore, the process of consolidating the memory elements with the transistors or the logic transistors becomes very simple, and an inexpensive consolidated device can be obtained.

The memory element can store binary or more information in one memory function body, and this allows the element to function as a memory element that stores four values or more information. The memory element may store only binary information. Moreover, it is possible to make the memory element function as a memory cell that has both the functions of a select transistor and a memory transistor by the variable resistor effect of the memory function body.

By being combined with a logic element, a logic circuit or the like, the semiconductor storage device can be effectively widely applied to data processing systems of personal computers, notebook type computers, laptop type computers, personal assistant/transmitters, mini computers, workstations, mainframes, multi-processor computers or any other types of computers; electronic components that constitute a data processing system, such as CPU's, memories and data storage devices; communication equipment such as telephones, PHS's (Personal Handy phone Systems), modems and routers; image display equipment such as display panels and projectors; business machines such as printers, scanners and copiers; imaging equipment such as video cameras and digital cameras; amusement equipment such as game machines and music players; information equipment of portable information terminals, watches and electronic dictionaries; car equipment such as car navigation systems and car audio devices; AV (Audio Visual) equipment for recording and reproducing information of animations, still pictures and music; electrical appliances such as washing machines, microwave ovens, refrigerators, rice cookers, dish washers, vacuum cleaners and air conditioners; healthcare equipment such as massage machines, scales and sphygmomanometers; and electronic equipment such as portable storage devices of IC cards, memory cards and so on. In particular, the applications to the portable electronic equipment of portable telephones, portable information terminals, IC cards, memory cards, portable computers, portable game machines, digital cameras, portable animation players, portable music players, electronic dictionaries and watches are effective. It is to be noted that the semiconductor storage device of embodiments of the present invention may be integrated as at least part of the control circuit of electronic equipment or a data storage circuit or detachably integrated at need.

Embodiments of the semiconductor storage device and the portable electronic equipment of the present invention will be described in detail below with reference to the drawings.

(The First Embodiment)

The semiconductor storage device of this embodiment is provided with a memory element 1 that serves as one example of the nonvolatile memory element as shown in FIG. 1.

In the memory element 1, a gate electrode 104 is formed on a P-type well region 102 formed via a gate insulation film 103 on the surface of a semiconductor substrate 101. A silicon nitride film 109, which has a trap level for retaining electric charges and serves as a charge retaining film, is arranged on the upper surface and the side surfaces of the gate electrode 104, and the portions of the silicon nitride film 109 located on both side walls of the gate electrode 104 serve as memory function bodies 105a and 105b for actually retaining electric charges. In this case, the memory function body means a portion where electric charges are actually accumulated by the rewrite operation in the memory function body or the charge retaining film. N-type diffusion regions 107a and 107b, which function as a source region and a drain region, respectively, are formed on both sides of the gate electrode 104 and inside the P-type well region 102. The diffusion regions 107a and 107b have an offset structure. That is, the diffusion regions 107a and 107b do not reach the region 121 located under the gate electrode, and the offset regions 120 under the charge retaining film (silicon nitride film 109) constitute part of the channel region.

Figure 2A:
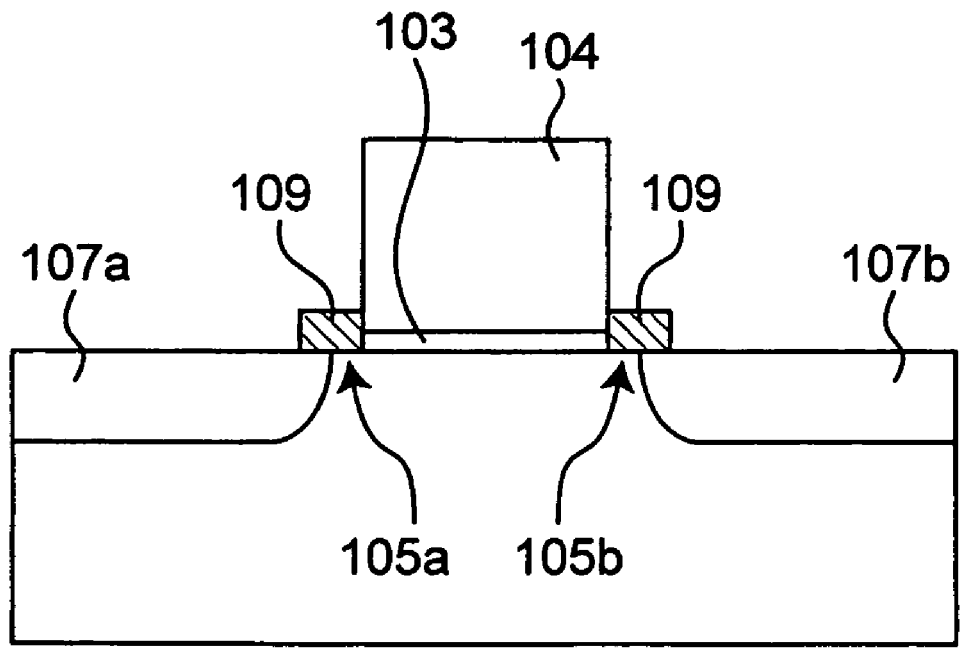
FIGS. 2A and 2B are schematic sectional views of part of memory elements in the semiconductor storage device of the modified first embodiment of the present invention.
Figure 2B:
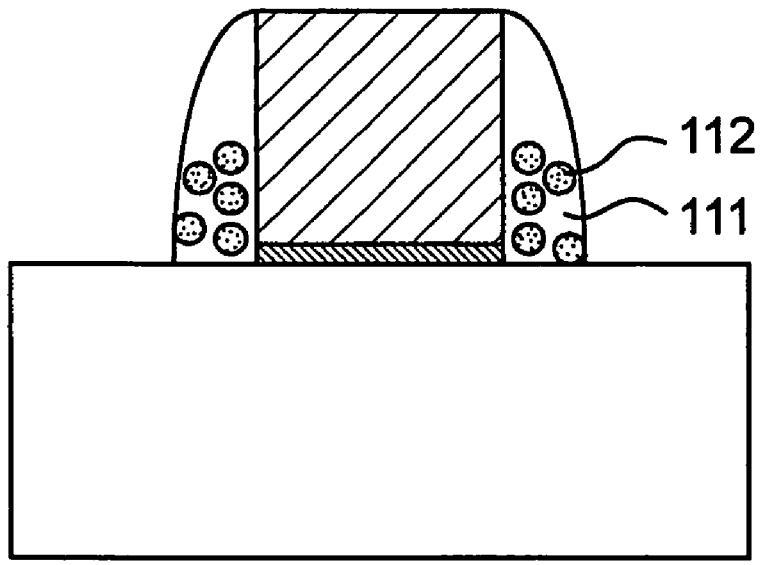

It is to be noted that the memory function bodies 105a and 105b, which substantially retain electric charges, are both sides wall portions of the gate electrode 104. Therefore, the silicon nitride film 109 is only required to be formed in the regions corresponding to these portions (see FIG. 2A). Moreover, the memory function bodies 105a and 105b may have a structure in which particles 112 constructed of a conductor or a semiconductor of a nanometer size are distributed in scattered dots in an insulation film 111 (see FIG. 2B). In this case, it is difficult for an electric charge to tunnel its way through the dots since the quantum effect is excessive when the particle 112 has a size smaller than 1 nm, and no remarkable quantum effect appears at the room temperature when the size exceeds 10 nm. Therefore, the diameter of the particle 112 should preferably be within a range of 1 nm to 10 nm. Furthermore, the silicon nitride films 109, which become charge retaining films, may be formed in a side wall spacer shape on the side surfaces of the gate electrode (see FIG. 3).

The principle of write operation of the memory element will be described with reference to FIG. 3 and FIG. 4. In this case, the description is based on the case where the entire bodies of the memory function bodies 131a and 131b have a function to retain electric charges. Moreover, the term of "write" means the injection of electrons into the memory function bodies 131a and 131b when the memory element is the N-channel type. Hereinafter, the description is provided on the assumption that the memory element is the N-channel type.

Figure 3:
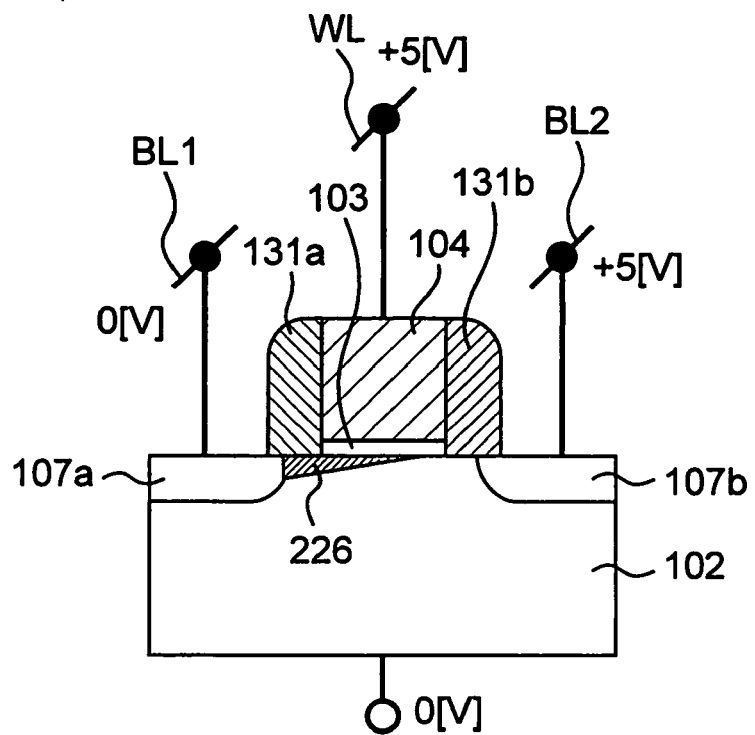
FIG. 3 is a view for explaining the write operation of the memory element in the semiconductor storage device of the first embodiment.

In order to inject an electron (execute write) into the second memory function body 131b, as shown in FIG. 3, an N-type first diffusion region 107a and an N-type second diffusion region 107b are made to serve as a source electrode and a drain electrode, respectively. For example, a voltage of 0 V is applied to the first diffusion region 107a and the P-type well region 102, a voltage of +5 V is applied to the second diffusion region 107b, and a voltage of +5 V is applied to the gate electrode 104. According to the above-mentioned voltage conditions, an inversion layer 226 extends from the first diffusion region 107a (source electrode), but it does not reach the second diffusion region 107b (drain electrode), generating a pinch-off point. An electron is accelerated from the pinch-off point to the second diffusion region 107b (drain electrode) by a high electrical field and becomes a so-called hot electron (high energy conduction electron). Write is performed by the injection of this hot electron into the second memory function body 131b. Since no hot electron is generated in the vicinity of the first memory function body 131a, write is not performed.

Figure 4:
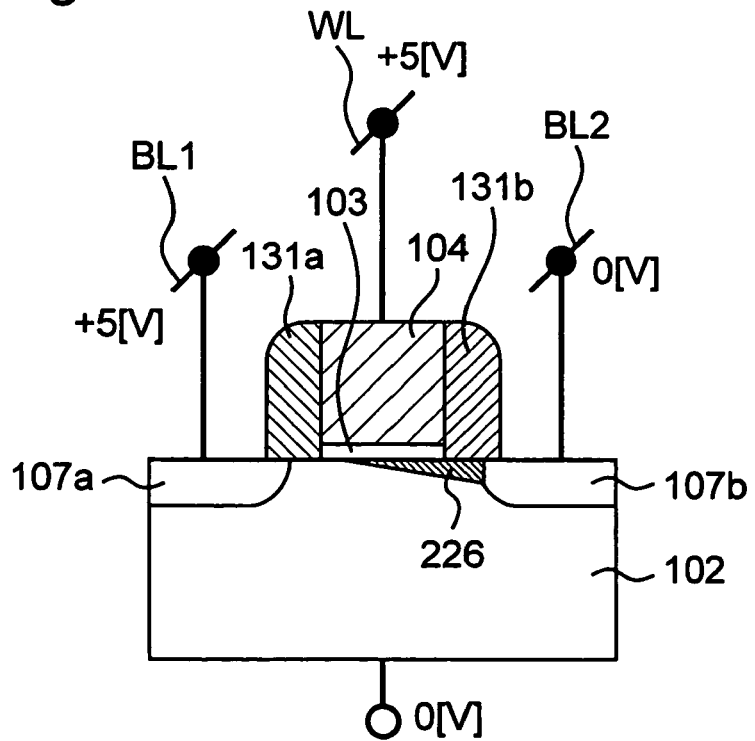
FIG. 4 is a view for explaining the write operation of the memory element in the semiconductor storage device of the first embodiment.

On the other hand, in order to inject an electron (execute write) into the first memory function body 131a, as shown in FIG. 4, the second diffusion region 107b and the first diffusion region 107a are made to serve as the source electrode and the drain electrode, respectively. For example, a voltage of 0 V is applied to the second diffusion region 107b and the P-type well region 102, a voltage of +5 V is applied to the first diffusion region 107a, and a voltage of +5 V is applied to the gate electrode 104. As described above, by exchanging the source and drain regions reversely to the case where an electron is injected into the second memory function body 131b, write can be performed by injecting an electron into the first memory function body 131a.

Next, the principle of erase operation of the memory element will be described with reference to FIG. 5 and FIG. 6.

Figure 5:
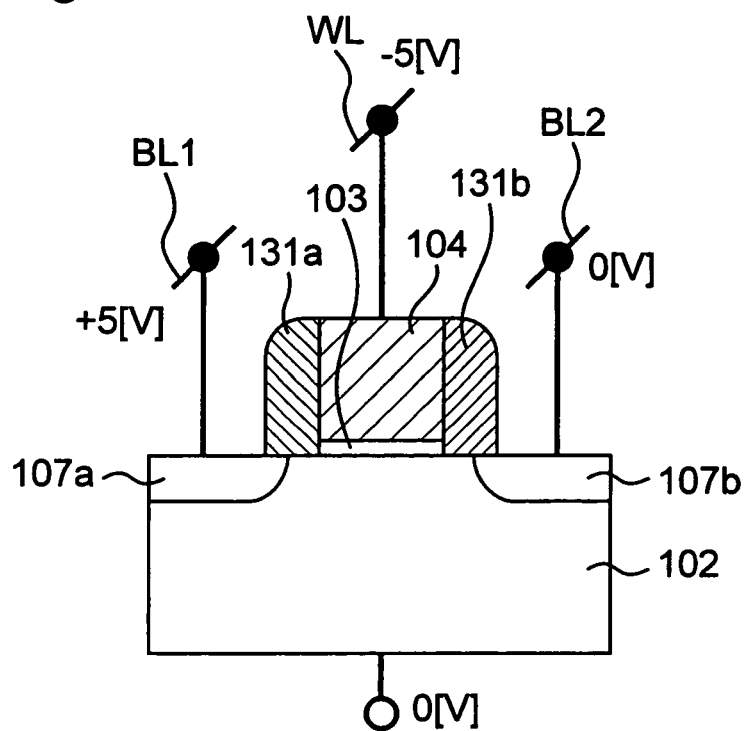
FIG. 5 is a view for explaining the erase operation of the memory element in the semiconductor storage device of the first embodiment.

According to a first method for erasing the information stored in the first memory function body 131a, as shown in FIG. 5, a positive voltage (e.g., +5 V) is applied to the first diffusion region 107a, a voltage of 0 V is applied to the P-type well region 102, a reverse bias is applied to a PN junction of the first diffusion region 107a and the P-type well region 102, and a negative voltage (e.g., −5 V) is further applied to the gate electrode 104. At this time, the potential slope becomes steep, in particular, in the vicinity of the gate electrode 104 at the PN junction due to the influence of the gate electrode to which the negative voltage is applied. Accordingly, a hot hole (high energy hole) is generated on the P-type well region 102 side of the PN junction due to band-to-band tunneling. This hot hole is drawn toward the gate electrode 104 that has a negative potential, and consequently, the hole is injected into the first memory function body 131a. As described above, the erase of the first memory function body 131a is performed. In this case, it is proper to apply a voltage of 0 V to the second diffusion region 107b.

When erasing the information stored in the second memory function body 131b, it is proper to exchange the potential of the first diffusion region with the potential of the second diffusion region in the aforementioned case.

Figure 6:
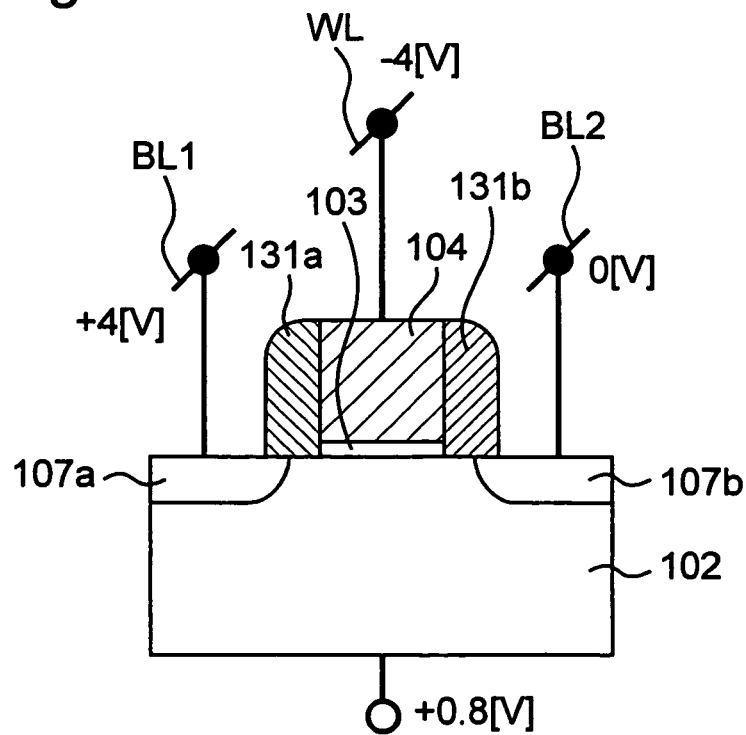
FIG. 6 is a view for explaining the erase operation of the memory element in the semiconductor storage device of the first embodiment.

According to a second method for erasing the information stored in the first memory function body 131a, as shown in FIG. 6, a positive voltage (e.g., +4 V) is applied to the first diffusion region 107a, a voltage of 0 V is applied to the second diffusion region 107b, a negative voltage (e.g., −4 V) is applied to the gate electrode 104, and a positive voltage (e.g., +0.8 V) is applied to the P-type well region 102. In this case, a forward voltage is applied across the P-type well region 102 and the second diffusion region 107b, injecting an electron into the P-type well region 102. The injected electron diffuses to a PN junction of the P-type well region 102 and the first diffusion region 107a and become hot electrons by being accelerated there by an intense electric field. This hot electron generates an electron-hole pair at the PN junction. That is, by applying the forward voltage across the P-type well region 102 and the second diffusion region 107b, the electron injected into the P-type well region 102 becomes a trigger to generate a hot hole at the PN junction located on the opposite side. The hot hole generated at the PN junction is drawn toward the gate electrode 104 that has a negative potential, and consequently, the hole is injected into the first memory function body 131a.

According to this method, even when only a voltage insufficient for the generation of a hot hole by band-to-band tunneling is applied to the PN junction of the P-type well region and the first diffusion region 107a, the electron injected from the second diffusion region 107b becomes a trigger to generate an electron-hole pair at the PN junction, allowing a hot hole to be generated. Therefore, the voltage during the erase operation can be lowered. Particularly, when an offset region 120 (see FIG. 1) exists, the effect that the PN junction becomes steep due to the gate electrode to which the negative potential is applied is a little, and therefore, it is difficult to generate a hot hole by band-to-band tunneling. The second method makes up for the defect, and the erase operation can be achieved at a low voltage.

In erasing the information stored in the first memory function body 131a, a voltage of +5 V must to be applied to the first diffusion region 107a according to the first erase method, whereas a voltage of +4 V is sufficient according to the second erase method. As described above, according to the second method, the voltage during erase can be reduced. Therefore, power consumption is reduced, and the deterioration of the memory element due to the hot carrier can be restrained.

Moreover, by either one of the erase methods, overerase does not easily occur in the memory element. The term of "overerase" here is a phenomenon that the threshold value is lowered without saturation as the amount of holes accumulated in the memory function body increases. This is a serious problem in EEPROM (Electrically Erasable Programmable Read-Only Memory) represented by a flash memory, and there occurs a fatal malfunction that memory cell selection becomes impossible particularly when the threshold value becomes negative. On the other hand, in the memory element of the semiconductor storage device of the present invention, only electrons are induced under the memory function bodies even when a large amount of holes are accumulated in the memory function body, and almost no influence is exerted on the potential of the channel region under the gate insulation film. The threshold value during erase is determined by the potential under the gate insulation film, and therefore, overerase does not easily occur.

Figure 7:
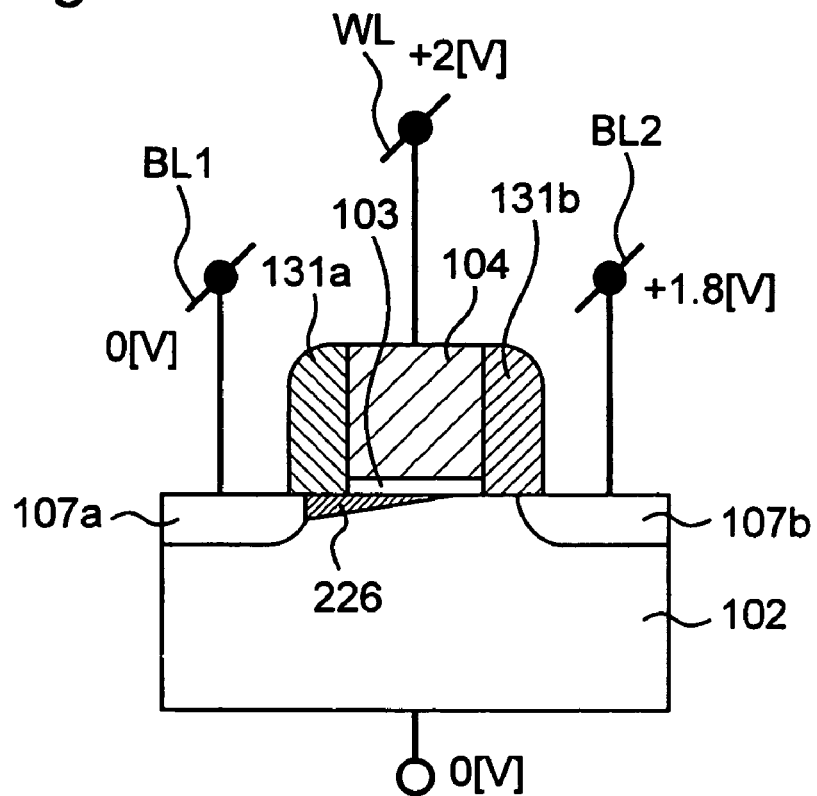
FIG. 7 is a view for explaining the read operation of the memory element of the semiconductor storage device of the first embodiment.

The principle of read operation of the memory element will be further described with reference to FIG. 7.

In reading the information stored in the first memory function body 131a, the transistor is operated by making the first diffusion region 107a and the second diffusion region 107b serve as a source electrode and a drain electrode, respectively. For example, a voltage of 0 V is applied to the first diffusion region 107a and the P-type well region 102, a voltage of +1.8 V is applied to the second diffusion region 107b, and a voltage of +2 V is applied to the gate electrode 104. In this case, when no electron is accumulated in the first memory function body 131a, a drain current easily flows. When electrons are accumulated in the first memory function body 131a, the inversion layer is not easily formed in the vicinity of the first memory function body 131a, and therefore, a drain current hardly flows. Therefore, by detecting the drain current, the storage information of the first memory function body 131a can be read. In particular, when read is performed by giving a voltage that causes the pinch-off operation, the state of charges accumulated in the first memory function body 131a can be more accurately determined without being influenced by the presence or absence of charges in the second memory function body 131b.

In reading the information stored in the second memory function body 131b, the transistor is operated by making the second diffusion region 107b and the first diffusion region 107a serve as the source electrode and the drain electrode, respectively. For example, it is proper to apply a voltage of 0 V to the second diffusion region 107b and the P-type well region 102, apply a voltage of +1.8 V to the first diffusion region 107a and apply a voltage of +2 V to the gate electrode 104. As described above, by exchanging the source and drain regions reversely to the case where the information stored in the first memory function body 131a is read, the information stored in the second memory function body 131b can be read.

If the channel region (offset regions 120) that is not covered with the gate electrode 104 is left, then the inversion layer is lost or formed depending on the presence or absence of surplus electric charges of the memory function bodies 131a and 131b in the channel region that is not covered with the gate electrode 104, and consequently, a great hysteresis (a change in the threshold value) is obtained. It is to be noted that the drain current is largely reduced when the width of the offset region 120 is excessively large, and the read speed is significantly slowed. Therefore, it is preferable to determine the width of the offset region 120 so that sufficient hysteresis and read speed can be obtained.

Even when the diffusion regions 107a and 107b reached the ends of the gate electrode 104, i.e., even when the diffusion regions 107a and 107b and the gate electrode 104 overlapped with each other, the threshold value of the transistor was scarcely changed by the write operation. However, a parasitic resistance at the ends of the source and drain is largely changed, and the drain current is largely reduced (by an order of magnitude or more). Therefore, read can be performed by detecting the drain current, and a function as a memory can be obtained. However, when a larger memory hysteresis effect is needed, it is preferred that the diffusion regions 107a and 107b do not overlap with the gate electrode 104 (the offset region 120 exists).

By the aforementioned operation method, 2-bit write and erase per transistor can be selectively achieved. Moreover, by arranging memory elements with a word line WL connected to the gate electrodes 104 of the memory elements and with a first bit line BL1 and a second bit line BL2 connected to the first diffusion regions 107a and the second diffusion regions 107b, respectively, a memory cell array can be constructed.

Moreover, according to the aforementioned operation method, the 2-bit write and erase per transistor are performed by exchanging the source electrode with the drain electrode. However, the device may be operated as a 1-bit memory by fixing the source electrode and the drain electrode. In this case, it is possible to make one of the source and drain regions have a common fixed voltage, and the number of bit lines connected to the source and drain regions can be reduced by half.

As is apparent from the above description the memory function bodies are formed independently of the gate insulation film and formed on both sides of the gate electrode, and therefore, the 2-bit operation can be achieved. Moreover, the memory function bodies are separated by the gate electrode, and therefore, interference during rewrite is effectively restrained. Furthermore, the gate insulation film, which is separated from the memory function body, can therefore restrain the short-channel effect by being reduced in film thickness. Therefore, the miniaturization of the memory element and also the semiconductor storage device is facilitated.

(The Second Embodiment)

Figure 8:
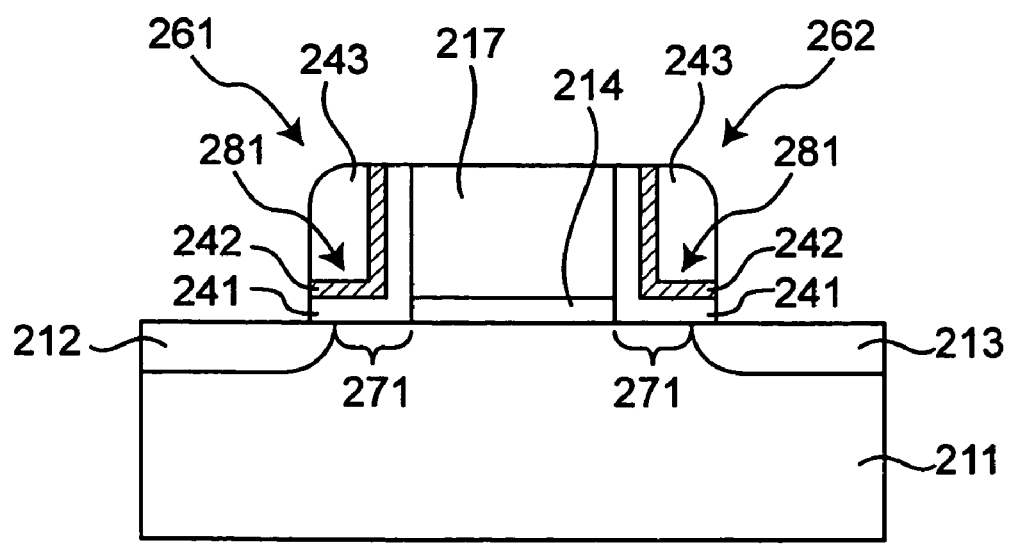
FIG. 8 is a schematic sectional view of part of a memory element in the semiconductor storage device of the second embodiment of the present invention.

As shown in FIG. 8, the memory element in the semiconductor storage device of the present embodiment has a construction substantially similar to that of the memory element 1 of FIG. 1 except for the memory function bodies 261 and 262 are constructed of a region for retaining electric charges (this may be a region for storing electric charges, or a film having the function to retain electric charges) and a region for restraining the escape of electric charges (this may be a film that has a function to restrain the escape of electric charges).

From the point of view of improving the retention characteristic of the memory, the memory function body should preferably include a charge retaining film having the function to retain electric charges and an insulation film. This embodiment employs a silicon nitride film 242 that has a level for trapping electric charges as a charge retaining film and silicon oxide films 241 and 243 that have the function of preventing the dissipation of electric charges accumulated in the charge retaining film as an insulation film. By the memory function body that including the charge retaining film and the insulation film, the retention characteristic can be improved by preventing the dissipation of electric charges. Moreover, the volume of the charge retaining film can be moderately reduced in comparison with the case where the memory function body is constructed only of the charge retaining film, and the occurrence of a characteristic change due to the movement of electric charges during the retention of the storage can be restrained by limiting the movement of electric charges in the charge retaining film. Furthermore, with the structure in which the silicon nitride film 242 is held between the silicon oxide films 241 and 243, charge injection efficiency during the rewrite operation is increased, and higher-speed operation becomes possible. In this memory element, the silicon nitride film 242 may be replaced by a ferroelectric substance.

Also, the region (silicon nitride film 242) for holding electric charges in the memory function bodies 261, 262 are overlapped with the diffusion layer regions 212, 213. Herein, the term "overlap" is used to refer to the state that at least part of the region (silicon nitride film 242) for holding electric charges is present on at least part of the diffusion layer regions 212, 213. It is noted that there are shown a semiconductor substrate 211, a gate insulating film 214, a gate electrode 217 and an offset region 271 between the gate electrode 217 and the diffusion layer regions 212, 213. Though unshown in the drawing, the uppermost surface of the semiconductor substrate 211 under the gate insulating film 214 is a channel region.

An effect produced by the arrangement that the silicon nitride film 242 serving as the region for retaining electric charges in the memory function bodies 261 and 262 overlap with the diffusion regions 212 and 213 will be described.

Figure 9:
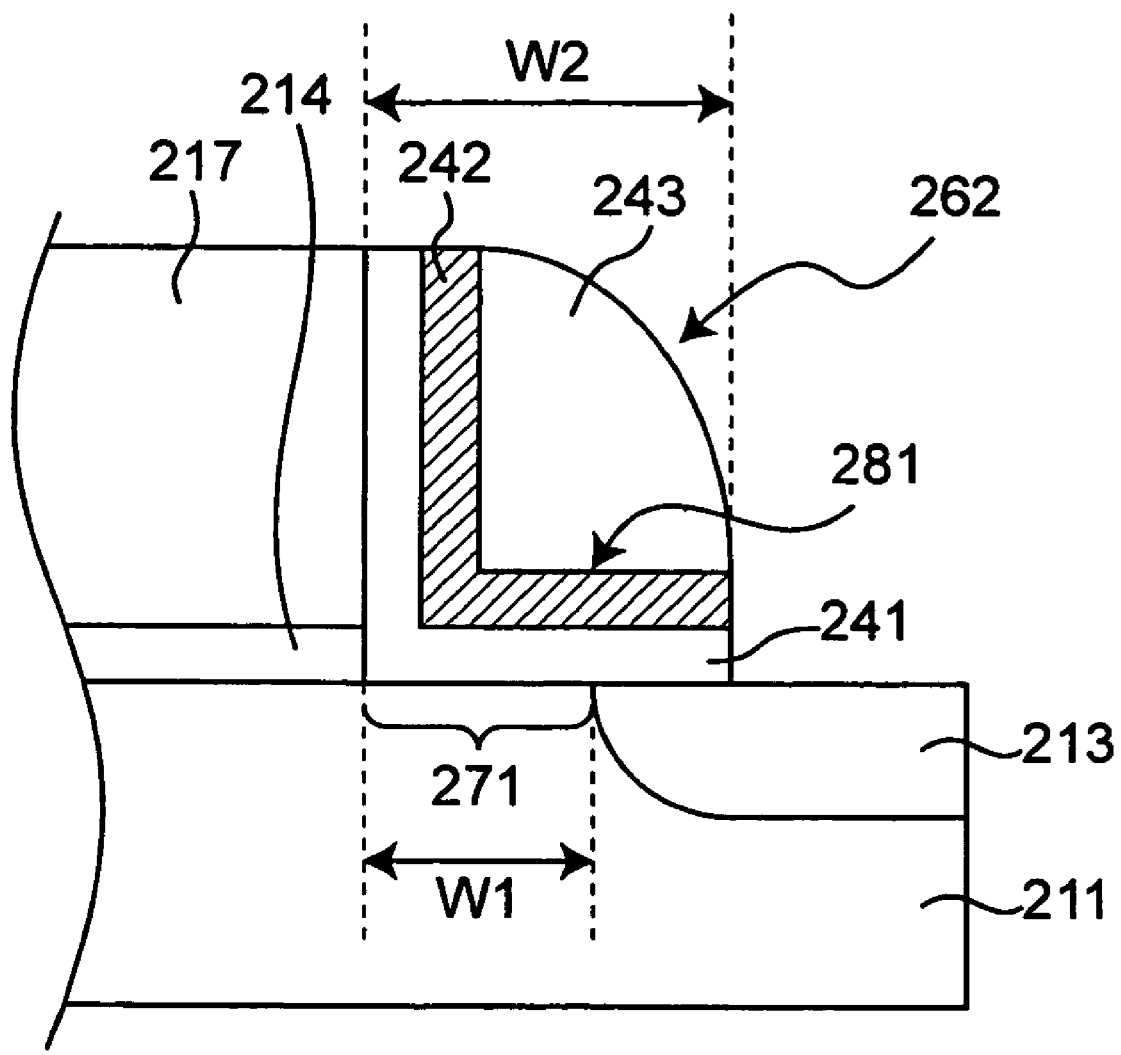
FIG. 9 is an enlarged schematic sectional view of the part of the semiconductor storage device of FIG. 8.

As shown in FIG. 9, assuming that the amount of offset of a gate electrode 217 with respect to a diffusion region 213 is W1 and that the width of a memory function body 262 in a cross-sectional plane in the channel-length direction of the gate electrode 217 is W2 in the peripheral portions of the memory function body 262, then the amount of overlap of the memory function body 262 with the diffusion region 213 is expressed by W2−W1. What is important here is that the memory function body 262 constructed of the silicon nitride film 242 of the memory function body 262 overlaps with the diffusion region 213, i.e., the arrangement that the relation: W2>W1 is satisfied.

In FIG. 9, the end of the silicon nitride film 242 remote from the gate electrode 217 coincided with the end of the memory function body 262 remote from the gate electrode 217 at the memory function body 262. Therefore, the width of the memory function body 262 was defined as W2.

Figure 10:
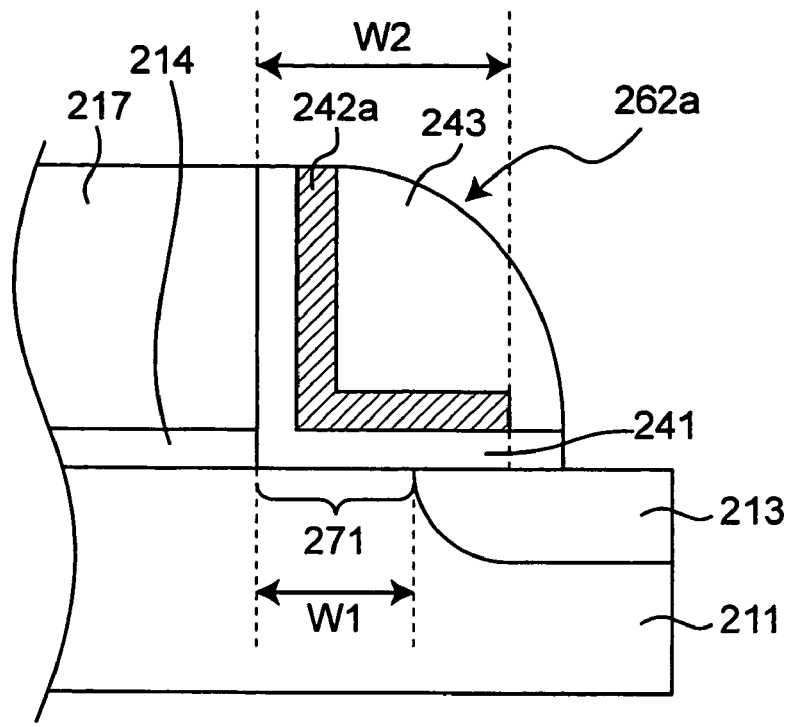
FIG. 10 is an enlarged schematic sectional view of the part of the modified semiconductor storage device of FIG. 8.

In the case where an edge of a silicon nitride film 242a on the side away from the gate electrode in a memory function body 262a is not aligned with an edge of the memory function body 262a on the side away from the gate electrode 217 as shown in FIG. 10, W2 may be defined as the width from the edge of the gate electrode to the edge of the silicon nitride film 242a on the side away from the gate electrode 217.

Figure 11:
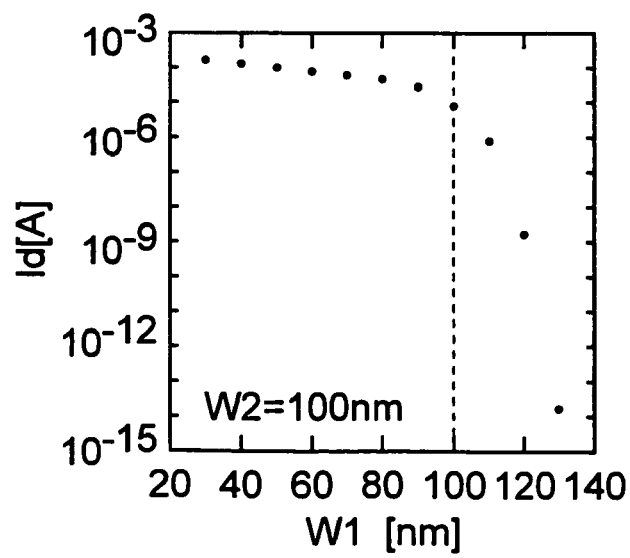
FIG. 11 is a graph showing the electrical characteristic of the memory element in the semiconductor storage device of the second embodiment.

FIG. 11 shows a drain current Id in the structure of FIG. 9 with the width W2 of the memory function body 262 being fixed to 100 nm and the offset amount W1 being varied. Herein, the drain current is obtained by device simulation performed under the conditions that the memory function body 262 is in erase state (positive holes are stored), and the diffusion layer regions 212, 213 are set to be a source electrode and a drain electrode, respectively. As shown in FIG. 11, with W1 being 100 nm or more (i.e., when the silicon nitride film 242 and the diffusion layer region 213 are not overlapped), the drain current shows rapid reduction. Since a drain current value is almost in proportion to a read operation speed, memory performance is rapidly deteriorated when W1 is 100 nm or more. In the range where the silicon nitride film 242 and the diffusion layer region 213 are overlapped, the drain current shows mild reduction. Therefore, taking a manufacturing dispersion into consideration, it is difficult to obtain a memory function unless at least part of the silicon nitride film 242 that is a film having a function of holing electric charges is overlapped with the source/drain region.

Based on the above-described result of the device simulation, a memory cell array is manufactured with W2 being fixed to 100 nm, and W1 being set to 60 nm and 100 nm as design values. When W1 is 60 nm, the silicon nitride film 242 is overlapped with the diffusion layer regions 212, 213 by 40 nm as a design value, and when W1 is 100 nm, there is no overlap as a design value. As a result of measuring read time of these memory cell arrays in comparison with the worst cases in consideration to dispersion, it was found out that the case where W1 was 60 nm as a design value was 100 times faster in readout access time. From a practical standpoint, it is preferable that the read access time is 100 nanoseconds or less per bit. It was found out, however, that this condition was never satisfied in the case of W1=W2. It was also found out that W2−W1>10 nm was more preferable in consideration to manufacturing dispersion.

It is preferable for reading information stored in the memory function body 261 (region 281) to set the diffusion layer region 212 as a source electrode and the diffusion layer region 213 as a drain region similar to the embodiment 1 and to form a pinchoff point on the side closer to the drain region in the channel region. More specifically, in reading information stored in either one of two memory function bodies, the pinch-off point is preferably formed in a region closer to the other memory function body in the channel region. This makes it possible to detect memory information in the memory function body 261 with good sensitivity regardless of the storage condition of the memory function body 262, resulting in large contribution to implementation of two-bit operation.

In the case of storing information only in one side out of the two memory function bodies, or in the case of using these two memory function bodies in the same storing condition, an pinch-off point is not necessarily formed in read operation.

Although not shown in FIG. 8, a well region (P type well in the case of N-channel device) is preferably formed on the surface of the semiconductor substrate 211. Forming the well region facilitates control of other electric characteristics (withstand voltage, junction capacitance, and short channel effect) while maintaining impurity concentration of the channel region optimum for memory operation (rewrite operation and read operation).

Figure 12:
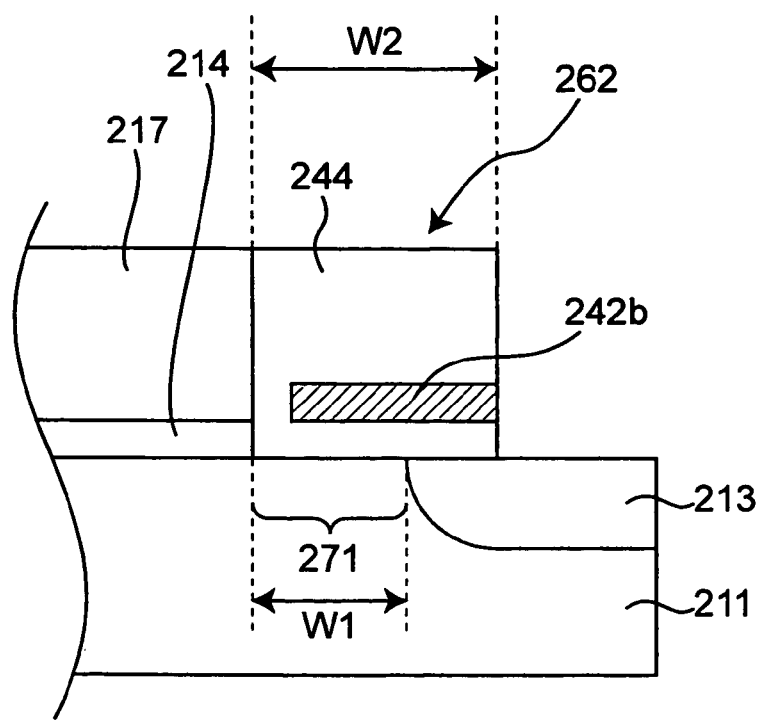
FIG. 12 is a schematic sectional view of part of a memory element in the semiconductor storage device of the modified second embodiment of the present invention.

Also, it is preferable that the memory function body contains a charge holding film disposed approximately parallel to the surface of the gate insulating film. In other words, it is preferable that the surface of the charge holding film in the memory function body is disposed so as to have a constant distance from the surface of the gate insulating film. More particularly, as shown in FIG. 12, a silicon nitride film 242b as an electric holding film in the memory function body 262 has a face approximately parallel to the surface of the gate insulating film 214. In other words, the silicon nitride film 242b is preferably formed to have a uniform height from the height corresponding to the surface of the gate insulating film 214.

The presence of the silicon nitride film 242b approximately parallel to the surface of the gate insulating film 214 in the memory function body 262 makes it possible to effectively control easiness of formation of an inversion layer in the offset region 271 with use of an amount of electric charges stored in silicon nitride film 242b, thereby enabling increase of memory effect. Also, by placing the silicon nitride film 242b approximately parallel to the surface of the gate insulating film 214, change of memory effect may be kept relatively small even with a dispersed offset amount (W1), enabling restraint of memory effect dispersion. In addition, movement of electric charges toward upper side of the silicon nitride film 242b may be suppressed, and therefore characteristic change due to the movement of electric charges during memory holding may be restrained.

Furthermore, the memory function body 262 preferably contains an insulating film (e.g., a portion of the silicon oxide film 244 on the offset region 271) that separates the silicon nitride film 242b approximately parallel to the surface of the gate insulating film 214 from the channel region (or the well region). This insulating film may restrain dispersion of the electric charges stored in the charge holding film, thereby contributing to obtaining a memory element with better holding characteristics.

It is noted that controlling the film thickness of the silicon nitride film 242b as well as controlling the film thickness of the insulating film under the silicon nitride film 242b (a portion of the silicon oxide film 244 on the offset region 271) to be constant make it possible to keep the distance from the surface of the semiconductor substrate to the electric charges stored in the charge holding film approximately constant. More particularly, the distance from the surface of the semiconductor substrate to the electric charges stored in the charge holding film may be controlled to be within the range from a minimum film thickness value of the insulating film under the silicon nitride 242b to the sum of a maximum film thickness of the insulating film under the silicon nitride film 242b and a maximum film thickness of the silicon nitride film 242b. Consequently, the concentration of electric line of force generated by the electric charges stored in the silicon nitride film 242b may be substantially controlled, and therefore dispersion of the degree of memory effect of the memory element may be minimized.

(The Third Embodiment)

Figure 13:
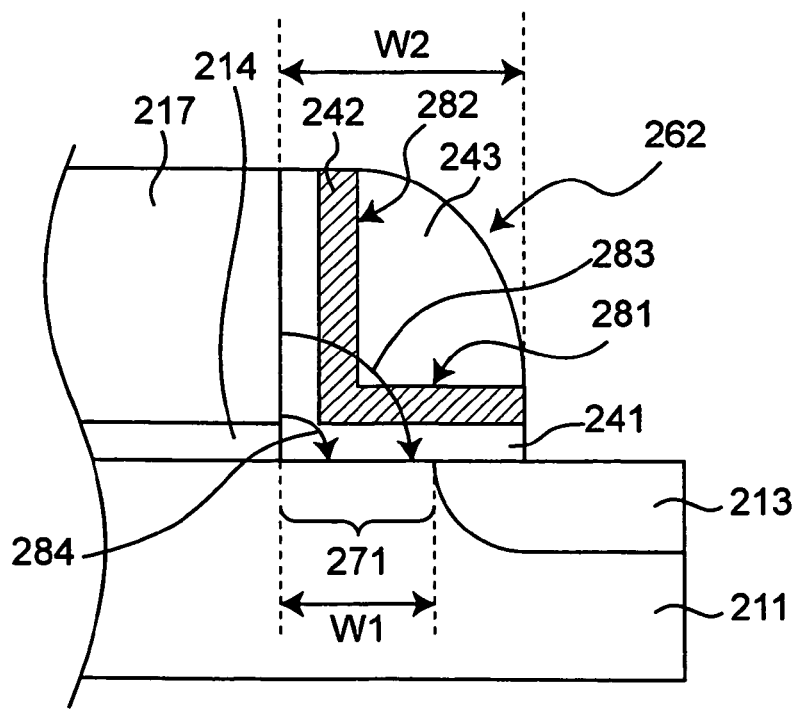
FIG. 13 is a schematic sectional view of part of a memory element in the semiconductor storage device of the third embodiment of the present invention.

In this embodiment, a silicon nitride film 242 as a film made of a first insulator in the charge holding portion 262 has an approximately uniform film thickness as shown in FIG. 13. Further, the silicon nitride film 242 as a charge holding film is configured such that a region 281 having a constant thickness and disposed approximately parallel to the surface of the gate insulating film 214 and a region 282 extending in direction approximately parallel to the side face of the gate electrode 217.

When a positive voltage is applied to the gate electrode 217, electric line of force in the memory function body 262 passes the silicon nitride film 242 total two times through the first portion 281 and the second portion 282 as shown with an arrow 283. It is noted that when a negative voltage is applied to the gate electrode 217, the direction of electric line of force is reversed. Herein, a dielectric constant of the silicon nitride film 242 is approx. 6, while a dielectric constant of silicon oxide films 241, 243 is approx. 4. Eventually, an effective dielectric constant of the memory function body 262 in the direction of electric line of force (arrow 283) becomes larger than that in the case where the charge holding film includes only the first portion 281, which makes it possible to decrease potential difference between the both edges of the electric line of force. More specifically, much part of the voltage applied to the gate electrode 217 is used to reinforce electric fields in the offset region 271.

Electric charges are injected into the silicon nitride film 242 in rewrite operation because generated electric charges are pulled by electric fields in the offset region 271. As a consequence, the silicon nitride film 242 including the second portion 282 increases the electric charges injected into the memory function body 262 in rewrite operation, thereby increasing a rewrite speed.

In the case where the portion of the silicon oxide film 243 is a silicon nitride film, more specifically, in the case where the charge holding film is not flat against the height corresponding to the surface of the gate insulating film 214, movement of electric charges toward upper side of the silicon nitride film becomes outstanding, and holding characteristics are deteriorated.

Instead of silicon nitride film, the charge holding film is more preferably formed from high-dielectric substances such as hafnium oxide having extremely large dielectric constant.

Further, the memory function body more preferably includes an insulating film (a portion of the silicon oxide film 241 on the offset region 271) that separates the charge holding film approximately parallel to the surface of the gate insulating film from the channel region (or the well region). This insulating film may restrain dispersion of the electric charges stored in the charge holding film, thereby enabling further improvement of holding characteristics.

Also, the memory function body more preferably includes an insulating film (a portion of the silicon oxide film 241 in contact with the gate electrode 217) that separates the gate electrode from the charge holding film extending in the direction approximately parallel to the side face of the gate electrode. This insulating film may prevent injection of electric charges from the gate electrode into the charge holding film and prevent change of electric characteristics, which may increase reliability of the memory element.

Further, similar to the second embodiment, it is preferable that the film thickness of the insulating film under the silicon nitride film 242 (a portion of the silicon oxide film 241 on the offset region 271) is controlled to be constant, and further the film thickness of the insulating film disposed on the side face of the gate electrode (a portion of the silicon oxide film 241 in contact with the gate electrode 217) is controlled to be constant. Consequently, the concentration of electric line of force generated by the electric charges stored in the silicon nitride film 242 may be substantially controlled, and leakage of electric charges may be prevented.

(The Fourth Embodiment)

In this embodiment, optimization of the distance between a gate electrode, a memory function body, and a source/drain region is explained.

Figure 14:
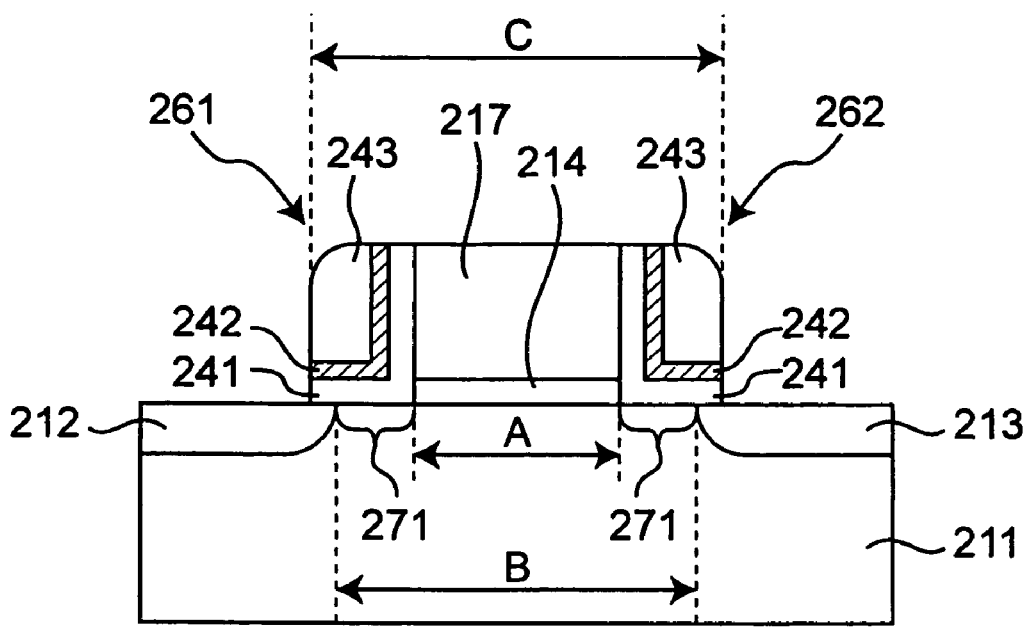
FIG. 14 is a schematic sectional view of part of a memory element in the semiconductor storage device of the fourth embodiment of the present invention.

As shown in FIG. 14, reference symbol A denotes a gate electrode length in the cross section in channel length direction, reference symbol B denotes a distance (channel length) between source and drain regions, and reference symbol C denotes a distance from the edge of one memory function body to the edge of the other memory function body, more specifically a distance from the edge of a film (the side away from the gate electrode) having a function of holding the electric charges in one charge holding portion in the cross section in channel length direction to the edge of a film (the side away from the gate electrode) having a function of holding the electric charges in the other memory function body.

An equation A<B is preferable. When this equation is satisfied, in the channel region, there is present an offset region 271 between a portion under the gate electrode 217 and the source/drain regions 212, 213. Thereby, the electric charges stored in the memory function bodies 261, 262 (silicon nitride film 242) effectively change easiness of inversion in the entire part of the offset region 271. As a result, memory effect is increased, and high-speed read operation is particularly enabled.

Also, when the gate electrode 217 and the source/drain regions 212, 213 are offset, that is when an equation A<B is satisfied, easiness of inversion of the offset region when a voltage is applied to the gate electrode 217 is largely changed by an electric charge amount stored in the memory function bodies 261, 262. Consequently, memory effect increases and short channel effect can be reduced.

However, as long as the memory effect is effective, the offset region is not necessarily required. Even when the offset region 271 is not present, if the impurity concentration in the source/drain regions 212, 213 is sufficiently small, the memory effect can still be effective in the memory function bodies 261, 262 (silicon nitride film 242). Also, as described referring to FIG. 11, a memory function can not substantially be obtained unless at least part of the silicon nitride film 242a is overlapped with the source/drain region 212, 213. Therefore, the state of A<B<C is most preferable.

(The Fifth Embodiment)

Figure 15:
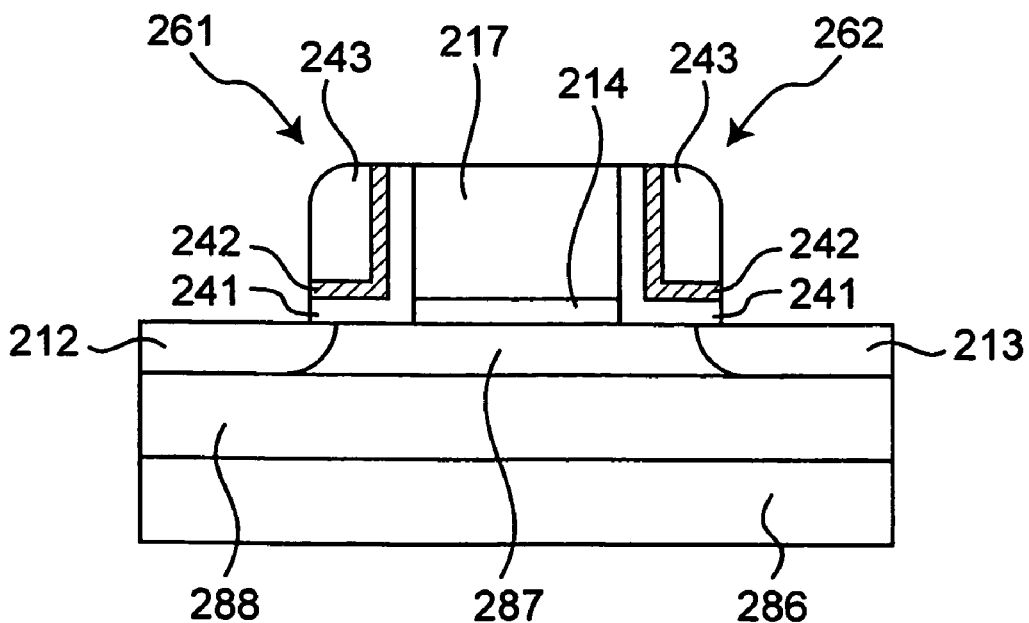
FIG. 15 is a schematic sectional view of part of a memory element in the semiconductor storage device of the fifth embodiment of the present invention.

A memory element of semiconductor storage device according to this embodiment has essentially the same structure as that in the second embodiment except that the semiconductor substrate is SOI substrate as shown in FIG. 15.

The memory element is structured such that an embedded oxide film 288 is formed on a semiconductor substrate 286, and on top of the embedded oxide film 288, SOI layer is further formed. In the SOI layer, there are formed diffusion regions 212, 213, and other areas constitute a body region 287.

This memory element also brings about the functions and effects similar to those of the memory element in the second embodiment. Further, since the junction capacitance between the diffusion regions 212, 213 and the body region 287 may be considerably reduced, it becomes possible to increase a device speed and to decrease power consumption.

(The Sixth Embodiment)

Figure 16:
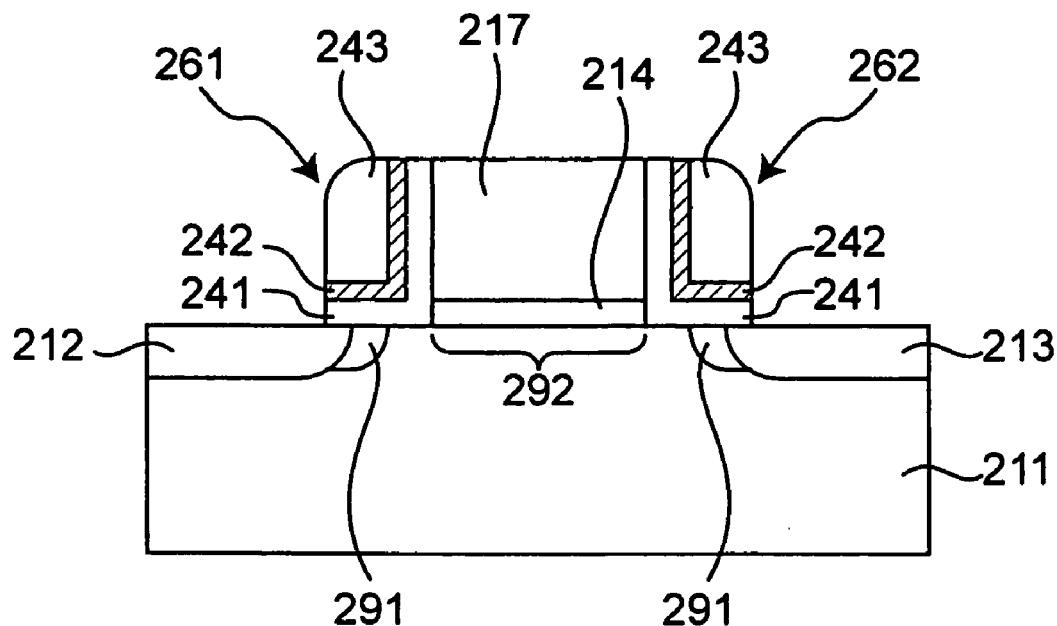
FIG. 16 is a schematic sectional view of part of a memory element in the semiconductor storage device of the sixth embodiment of the present invention.

A memory element in this embodiment has essentially the same structure as that in the second embodiment except that in the vicinity of the channel side of N type diffusion regions 212, 213, a P type highly-concentrated region 291 is added as shown in FIG. 16.

More specifically, the concentration of P type impurity (e.g., boron) in the P type highly-concentrated region 291 is higher than the concentration of P type impurity in the region 292. An appropriate value of the P type impurity concentration in the P type highly-concentrated region 291 is, for example, around $5\times10^{17}$ to $1\times10^{19}$ $cm^{-3}$. Also, a value of the P type impurity concentration in the region 292 may be set to, for example, $5\times10^{16}$ to $1\times10^{18}$ $cm^{-3}$.

Thus, providing the P type highly-concentrated region 291 makes the junction between the diffusion regions 212, 213 and the semiconductor substrate 211 steep right under the memory function bodies 261, 262. This facilitates generation of hot carriers in write and erase operation, thereby enabling reduction of voltage in write operation and erase operation or implementing high-speed write operation and erase operation. Further, since the impurity concentration in the region 292 is relatively small, a threshold value when the memory is in erased state is small and so the drain current becomes large. Consequently, a read speed is increased. This makes it possible to provide a memory element having low rewrite voltage or a high rewrite speed, and having a high read speed.

Also in FIG. 16, by providing the P type highly-concentrated region 291 in a position adjacent to the source/drain region and on the lower side of the memory function bodies 261, 262 (that is a position not right under the gate electrode), a threshold value of the entire transistor shows considerable increase. The degree of this increase is extremely larger than that in the case where the P type highly-concentrated region 291 is right under the gate electrode. When write electric charges (electrons in the case where the transistor is N channel type) are stored in the memory function bodies 261, 262, the difference becomes larger. When enough erase electric charges (positive holes in the case where the transistor is N channel type) are stored in the memory function body, a threshold value of the entire transistor is decreased down to a value determined by the impurity concentration in the channel region (region 292) under the gate electrode 217. More specifically, the threshold value in the erased state is not dependent on the impurity concentration in the P type highly-concentrated region 291, whereas the threshold value in the written state receives extremely large influence. Therefore, disposing the P type highly-concentrated region 291 under the memory function bodies and adjacent to the source/drain region imparts extremely large fluctuation only to the threshold value in the written state, thereby enabling remarkable increase of memory effect (difference of threshold values in the erased state and the written state).

(The Seventh Embodiment)

Figure 17:
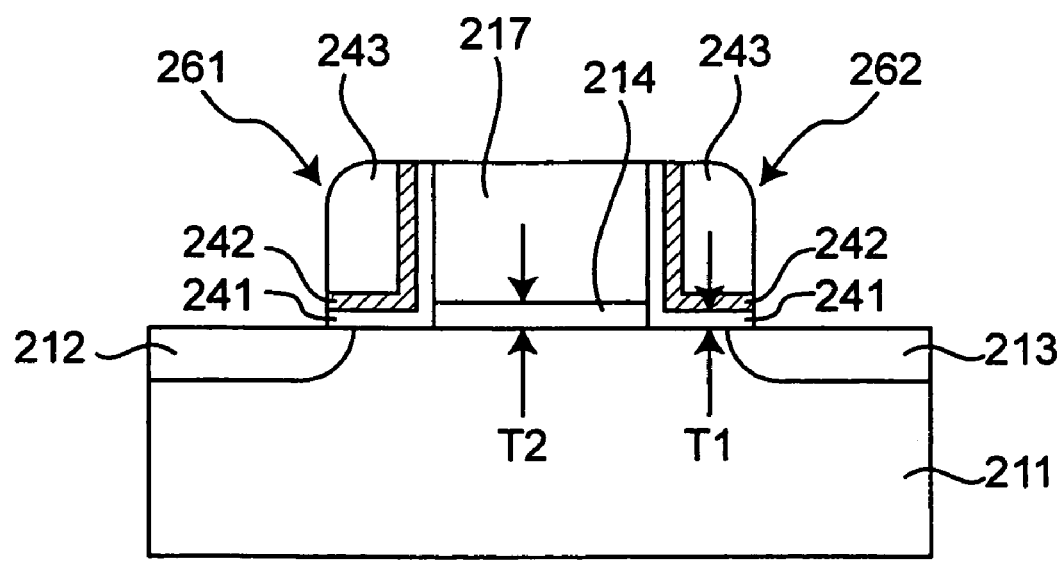
FIG. 17 is a schematic sectional view of part of a memory element in the semiconductor storage device of the seventh, embodiment of the present invention.

A memory body of a semiconductor storage device in this embodiment has essentially the same structure as that in the second embodiment except that the thickness T1 of the insulating film 241 that separates the charge holding film (silicon nitride film 242) from the channel region or the well region 211 is smaller than the thickness T2 of the gate insulating film 214 as shown in FIG. 17.

The gate insulating film 214 has a lower limit of the thickness T2 because of the request for withstand voltage in memory rewrite operation. However, the thickness T1 of the insulating film 241 can be smaller than T2 regardless of the request for withstand voltage.

The thickness T1 of the insulating film has high design freedom as stated above because of the following reason.

In the memory element, the insulating film 241 that separates the charge holding film (silicon nitride film 242) from the channel region or the well region is not interposed in between the gate electrode 217 and the channel region or the well region. Consequently, the insulating film 241 that separates the charge holding film (silicon nitride film 242) from the channel region or the well region does not receive direct influence from the high-electric fields that affect in between the gate electrode 217 and the channel region or the well region, but receives influence from relatively weak electric fields expanding from the gate electrode 217 in lateral direction. As a result, despite the request for withstand voltage to the gate insulating film 214, it becomes possible to make T1 smaller than T2. Decreasing the thickness T1 of the insulating film facilitates injection of electric charges into the memory function bodies 261, 262, decreases voltage for write operation and erase operation, or enables high-speed write operation and erase operation. In addition, since an electric charge amount induced in the channel region or the well region increases when electric charges are stored in the silicon nitride film 242, increased memory effect may be implemented.

Some electric lines of force having short length in the memory function body do not pass the silicon nitride film 242 as shown with an arrow 284 in FIG. 13. Since electric field strength is relatively large on such a short electric line of force, the electric fields along the electric line of force plays an important role in rewrite operation. By decreasing the thickness T1 of the insulating film 241, the silicon nitride film 242 moves to the lower side of the FIG. 13, so that the electric line of force shown with the arrow 284 passes the silicon nitride film 242. As a consequence, an effective dielectric constant in the memory function body along the electric line of force in the direction of arrow 284 becomes large, which makes it possible to make potential difference between the both ends of the electric line of force smaller. Therefore, most part of voltage applied to the gate electrode 217 is used to strengthen the electric fields in the offset region, thereby implementing high-speed write operation and erase operation.

Contrary to this, for example in EEPROM as typified by flash memory, an insulating film that separates a floating gate from the channel region or the well region is interposed in between a gate electrode (control gate) and the channel region or the well region, so that the insulating film receives direct influence from high electric fields of the gate electrode. In EEPROM, therefore, the thickness of the insulating film that separates the floating gate from the channel region or the well region is limited, which hinders optimization of the functions of a memory element.

As is clear from the above, by setting the thickness T1 of the insulating film 241 and the thickness T2 of the gate insulating film 214 as T1<T2, it becomes possible to decrease voltage in write operation and erase operation or implement high-speed write operation and erase operation, and to enable further increase of memory effect without degrading withstand voltage capability of the memory. It is noted that the thickness T1 of the insulating film is preferably 0.8 nm or more, that is the limit range in which uniformity in manufacturing process or certain level of film quality may be maintained and holding characteristics do not suffer extreme deterioration.

More specifically, in the case of liquid crystal driver LSI which has a severe design rule and requires high withstand voltage, maximum 15 to 18 V voltage is necessary for driving liquid crystal panel TFT (Thin Film Transistor). Eventually, it is not possible to make the gate oxide film thinner. In the case of mounting a nonvolatile memory of the present invention as an image adjuster together with other devices on the liquid crystal driver LSI, the memory element of an embodiment of the present invention enables optimum design of the thickness of the insulating film that separates the charge holding film (silicon nitride film 242) from the channel region or the well region independently of the thickness of the gate insulating film. For example, in a memory cell with a gate electrode length (word line width) of 250 nm, there may be separately set like T1=20 nm and T2=10 nm, fulfilling a memory cell with good write efficiency. (Short channel effect is not generated even though T1 is larger than that of normal logic transistors, because the source/drain region is offset from the gate electrode.)

(The Eighth Embodiment)

Figure 18:
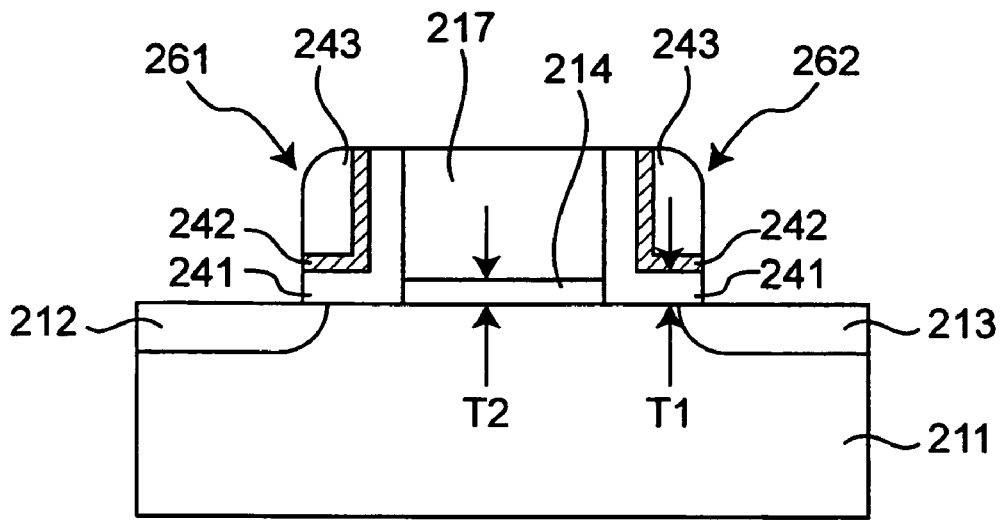
FIG. 18 is a schematic sectional view of part of a memory element in the semiconductor storage device of the eighth embodiment of the present invention.

A memory element of a semiconductor storage device according to this embodiment has essentially the same structure as that in the second embodiment except that the thickness (T1) of the insulating film that separates the charge holding film (silicon nitride film 242) from the channel region or the well region is larger than the thickness (T2) of the gate insulating film as shown in FIG. 18.

The gate insulating film 214 has an upper limit of the thickness T2 because of the request for prevention of short channel effect of the device. However, the thickness T1 of the insulating film 241 can be larger than T2 regardless of the request for prevention of short channel effect. More specifically, as miniaturization scaling proceeds (thinning of the gate insulating film proceeds), the thickness of the insulating film that separates the charge holding film (silicon nitride film 242) from the channel region or the well region may be optimally designed independently of the thickness T2 of the gate insulating film, which implements the effect that the memory function body will not disturb scaling.

In the memory element of the present embodiment, the thickness T1 of the insulating film has high design freedom as stated above because, as is already described, the insulating film that separates the charge holding film from the channel region or the well region is not interposed in between the gate electrode and the channel region or the well region. As a result, despite the request for prevention of short channel effect to the gate insulating film, it becomes possible to make T1 larger than T2.

Increasing the thickness of the insulating film makes it possible to prevent dispersion of the electric charges stored in the memory function body and to improve holing characteristics of the memory.

Therefore, setting as T1>T2 enables improvement of holding characteristics without deteriorating short channel effect of the memory.

It is noted that the thickness T1 of the insulating film is preferably 20 nm or less in consideration of reduction of a rewrite speed.

More specifically, a conventional nonvolatile memory as typified by flash memory is structured such that a selection gate electrode constitutes a write/erase gate electrode, and a gate insulating film (including a floating gate) corresponding to the write/erase gate electrode serves also as an electric charge storage film. Consequently, since the request for miniaturization (creation of thinner devices is essential for restraining short channel effect) conflicts the request for securing reliability (in order to control leakage of stored electric charges, the thickness of an insulating film that separates a floating gate from the channel region or the well region cannot be decreased to smaller than approx. 7 nm), miniaturization of the device is difficult. In fact, according to ITRS (International Technology Roadmap for Semiconductors), miniaturization of a physical gate length down to approx. 0.2 micron or lower is not yet in sight. In the memory element of the present invention, independent designing of T1 and T2 is available as described above, and therefore miniaturization becomes possible.

For example, in a memory cell with a gate electrode length (word line width) of 45 nm, there is separately set like T2=4 nm and T1=7 nm, fulfilling a semiconductor storage device free from generation of short channel effect. Short channel effect is not generated even though T2 is set larger than that of normal logic transistors, because the source/drain region is offset from the gate electrode.

Also, since the source/drain region is offset from the gate electrode, miniaturization is further facilitated compared to normal logic transistors.

As described above, since an electrode for supporting write and erase operation is not present above the memory function body, the insulating film that separates the charge holding film from the channel region or the well region does not directly receive the influence of high electric fields that affect in between the electrode that supports write and erase operation and the channel region or the well region, but receives influence only from relatively weak electric fields expanding from the gate electrode in lateral direction. This makes it possible to fulfill a memory cell having the gate length miniaturized more than the gate length of the logic transistors in comparison with the same processing accuracy.

(The Ninth Embodiment)

This embodiment relates to changes of electric characteristics when rewrite operation is performed in the memory element of the semiconductor storage device according an embodiment of to the present invention.

Figure 19:
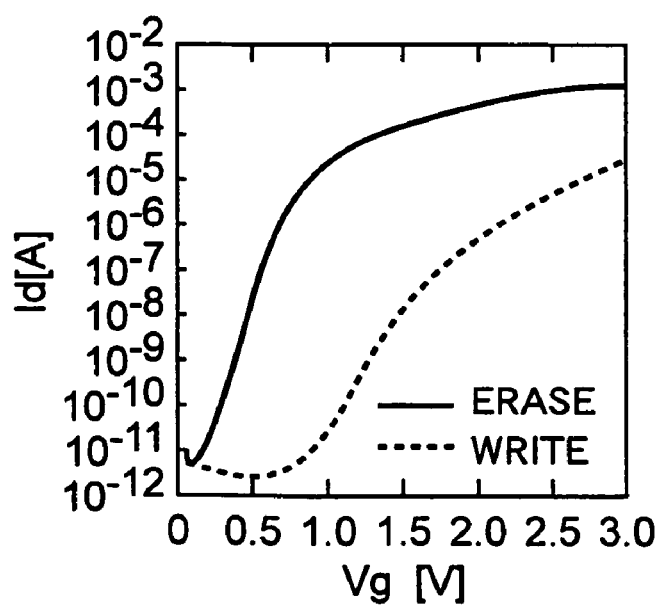
FIG. 19 is a graph showing the electrical characteristic of the memory element in the semiconductor storage device of the ninth embodiment.

FIG. 19 is a view showing characteristic curves of a drain current (Id) versus a gate voltage (Vg) (measured values) where an electric charge amount in the memory function body of an N-channel type memory element varies between erase state and written state.

Figure 35:
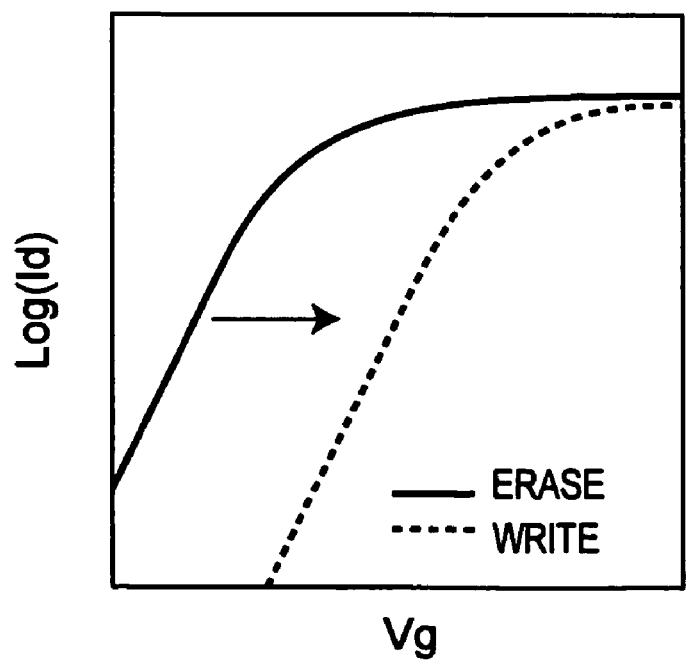
FIG. 35 is a graph showing the electrical characteristic of the conventional flash memory.

As clearly shown in FIG. 19, when write operation is performed in the erased state (a solid line), as shown by a broken line, not only the threshold value simply rises, but inclination of the graph dramatically falls especially in sub-threshold region. Therefore, even in the region with relatively high gate voltage (Vg), a drain current ratio of the erased state to the written state is large. For example in the point of Vg=2.5 V, the current ratio is still two digits or more. This characteristic is largely different from that in the case of a flash memory shown in FIG. 35.

The appearance of the above characteristic in the memory element is a phenomenon peculiar to the case where the gate electrode and the diffusion region are offset and therefore the gate electric fields are difficult to reach the offset region. When the memory element is in the written state, an inversion layer is extremely difficult to be generated in the offset region below the memory function body even if a positive voltage is applied to the gate electrode. This causes smaller inclination of the Id-Vg curve line in the sub-threshold region in the written state.

When the memory element is in the erased state, high-density electrons are induced in the offset region. Further, when 0 V is applied to the gate electrode (i.e., in OFF state), electrons are not induced in the channel below the gate electrode (and therefore an off current is small). This causes large differential coefficient of the Id-Vg curve line in the sub-threshold region in the erased state and a large increase rate of current (conductance) even in the voltage region over the threshold.

As is clear from the above description, the memory element of the semiconductor storage device according to an embodiment of the present invention makes it possible to make the drain current ratio of the erased state to the written state particularly large.

(The Tenth Embodiment)

This embodiment is related to a semiconductor storage device, in which a plurality of memory elements described in connection with the first through eighth embodiments are arranged and into which a rewrite and read circuit is incorporated and to a method for operating the device.

Figure 20:
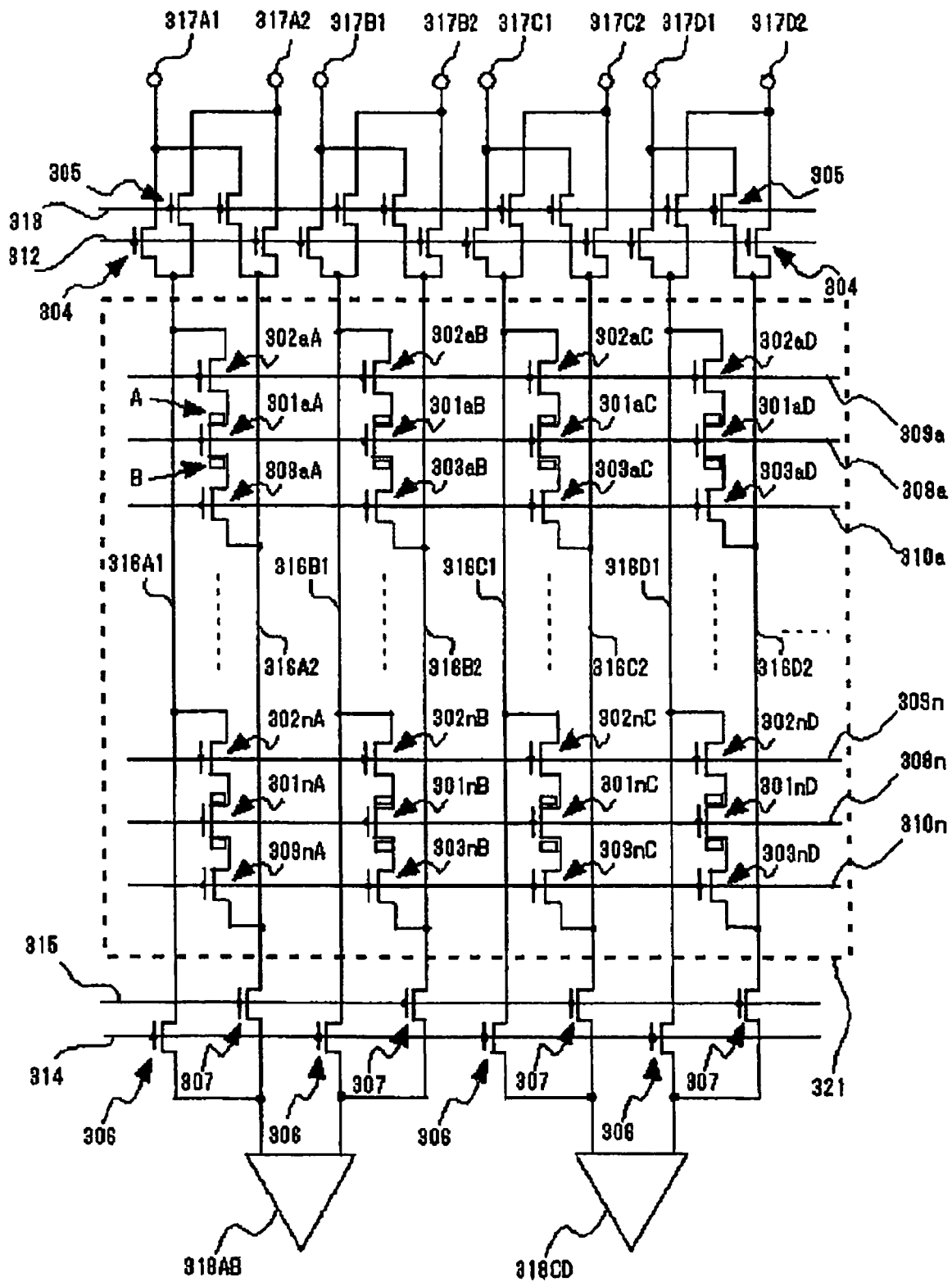
FIG. 20 is a circuit diagram of a semiconductor storage device of the tenth embodiment of the present invention.

As shown in the circuit diagram of FIG. 20, this semiconductor storage device includes a memory element array region (memory cell array) 321, a circuit section for giving a predetermined rewrite or read voltage to each memory element, a sense amplifier and a circuit section that connects the sense amplifier to each memory element. It is to be noted that the other peripheral circuits are not shown.

Memory elements 301aA–301aD, . . . , 301nA–301nD in the section (memory cell array) 321 where the memory elements are arranged are the memory elements described in connection with the first through eighth embodiments. Each of these memory elements has two memory function bodies, and in order to distinguish them from each other, only the memory element 301aA is indicated by an arrow A and an arrow B, and no indication is provided for the other memory elements in FIG. 20.

To each memory element is connected a total of two select transistors located on both sides of the element. For example, select transistors 302aA and 303aA are connected in series with the memory element 301aA.

The gate electrodes of the memory elements 301aA–301aD are connected to a word line 308a. The gate electrodes of the other memory elements are each similarly connected to a word line. Moreover, the gate electrodes of the select transistors 302aA–302aD are connected to a select transistor word line 309a, while the gate electrodes of the select transistors 303aA–303aD are connected to a select transistor word line 310a. The gate electrodes of the other select transistors are each similarly connected to a select transistor word line.

The select transistors 302aA–302nA are connected to a first bit line 316A1, while the select transistors 303aA–303nA are connected to a second bit line 316A2. The other select transistors are similarly connected to either the first or second bit line.

A pair of operation select transistors 304 and 305 are connected to each bit line. The operation select transistors 304 and 305 are connected to first voltage input terminals 317A1–317D1 or second voltage input terminals 317A2–317D2. The gate electrodes of the operation select transistors 304 and 305 are connected to operation select lines 312 and 313, respectively. With the above interconnections, if the operation select line 312 is selected, then, for example, the first bit line 316A1 is connected to the first voltage input terminal 317A1, while the second bit line 316A2 is connected to the second voltage input terminal 317A2. If the operation select line 313 is selected, then, for example, the first bit line 316A1 is connected to the second voltage input terminal 317A2, while the second bit line 316A2 is connected to the first voltage input terminal 317A1. That is, a pair of bit lines 316A1 and 316A2 are connected to mutually different voltage input terminals, and the voltage input terminal to be connected can be interchanged by changing the selection of the operation select line.

Two bit line pairs (e.g., the bit line pair 316A1 and 316A2 and the pair 316B1 and 316B2) are connected to one input and the other input of a sense amplifier that has two inputs via a switchover transistor. More concretely, the bit line pairs are connected as follows.

The first bit lines 316A1–316D1 are connected to a first switchover transistor 306. The second bit lines 316A2–316D2 are connected to a second switchover transistor 307. The gate electrodes of the switchover transistors 306 and 307 are connected to switchover transistor select lines 314 and 315, respectively. With the interconnections as described above, if the switchover transistor select line 314 is selected, then, for example, one input of a sense amplifier 318AB is connected to the first bit line 316A1, while the other input of the sense amplifier 318AB is connected to the first bit line 316B1. If the switchover transistor select line 315 is selected, then, for example, one input of the sense amplifier 318AB is connected to the second bit line 316A2, while the other input of the sense amplifier 318AB is connected to the second bit line 316B2.

It is to be noted that the sense amplifier is merely required to be an amplifier capable of detecting an output current from the memory element, and, for example, a differential amplifier can be employed therefor.

Although four pairs of bit lines are arranged in FIG. 20, it is possible to arrange an arbitrary number of pairs of bit lines. Moreover, in FIG. 20, two pairs of bit lines are connected to one sense amplifier. This is because the selected two memory elements serve as a pair to be connected to one and the other inputs of one sense amplifier as described later.

However, as another example of the application of the memory elements to such a semiconductor storage device, it is acceptable to connect one memory element to one input of a sense amplifier and connect an external reference cell to the other input of the sense amplifier.

A method for operating this semiconductor storage device will be described. The operation of this semiconductor device includes rewrite operation and read operation, and the rewrite operation includes write operation and erase operation.

Reference is first made to a method for performing the write operation. As one example of the write operation, it is herein described the case where the memory element 301aA is subjected to write.

The operation select line 312 is selected to turn on the operation select transistor 304. By this operation, for example, the first bit line 316A1 is connected to the first voltage input terminal 317A1, while the second bit line 316A2 is connected to the second voltage input terminal 317A2. The same thing can be said for the other bit lines.

Further, the select transistor word lines 309a and 310a are selected. By this operation, one (located on the memory function body A side) in the diffusion regions (source/drain) of the memory element 301aA is connected to the first voltage input terminal 317A1, while the other (located on the memory function body B side) is connected to the second voltage input terminal 317A2. The same thing can be said for the memory elements 301aB–301aD connected to the word line 308a.

In this case, predetermined voltages for write are applied to the word line 308a and the first and second voltage input terminals 317A1 and 317A2. First of all, a voltage of, for example, +5 V is applied to the word line 308a. Further, a voltage of +5 V is applied to the first voltage input terminal 317A1, and a voltage of 0 V is applied to the second voltage input terminal 317A2. By this operation, write is selectively performed on the memory function body A side of the memory element 301aA.

At this time, if a predetermined voltage is applied to the other voltage input terminals, it is possible to execute write also in the memory elements 301aB–301aD. Moreover, concerning the memory elements that are not subjected to write, the voltage input terminal receives a voltage of 0 V or is put in an open state.

When write is performed on the memory function body B side of the memory element 301aA, it is proper to select an operation select line 313 instead of selecting the operation select line 312 and make other selection operations and voltage application conditions similar. It is acceptable to interchange the voltage applied to the first voltage input terminal 317A1 with the voltage applied to the second voltage input terminal 317A2.

Reference is next made to a method of the erase operation. As one example of the erase operation, it is herein described the case where the memory element 301aA is subjected to erase.

Similarly to the case of the write operation, the operation select line 312 is selected to turn on the operation select transistor 304 and select the select transistor word lines 309a and 310a.

In this case, predetermined voltages for erase are applied to the word line 308a and the first and second voltage input terminals 317A1 and 317A2. First of all, a voltage of, for example, −5 V is applied to the word line 308a. Further, a voltage of +5 V is applied to the first voltage input terminal 317A1, and a voltage of 0 V is applied to the second voltage input terminal 317A2. By this operation, erase is selectively performed on the memory function body A side of the memory element 301aA.

At this time, if predetermined voltages are applied to the other voltage input terminals, erase can also be performed in the memory elements 301aB–301aD. Moreover, concerning the memory elements that are not subjected to erase, the voltage input terminal receives a voltage of 0 V or is put in the open state.

When erase is performed on the memory function body B side of the memory element 301aA, it is proper to select the operation select line 313 instead of selecting the operation select line 312 and make the other selection operation and voltage application conditions similar. It is acceptable to interchange the voltage applied to the first voltage input terminal 317A1 with the voltage applied to the second voltage input terminal 317A2.

Reference is next made to a method of the read operation. As one example of the read operation, it is herein described the case where the information stored in the memory element 301aA is read.

When reading the storage information on the memory function body A side of the memory element 301aA, the operation select line 313 is selected to turn on the operation select transistor 305, and the switchover transistor select line 314 is selected to turn on the first switchover transistor 306. Further, a voltage of, for example, +2 V appropriate for the read operation is applied to the word line 308a. Subsequently, a voltage of, for example, +1.8 V is applied to the first voltage input terminal 317A1. The second voltage input terminal 317A2 is put in the open state.

According to the aforementioned selection operation and voltage application conditions, a current flows from the first voltage input terminal 317A1 via the memory element 301aA to one input of the sense amplifier 318AB. By detecting this current value, the information stored in the memory element 301aA can be distinguished. At this time, the memory function body A side of the memory element 301aA serves as a source, and therefore, the amount of electric charge accumulated in the memory function body A mainly exerts influence on the value of the current flowing through the memory element 301aA. Therefore, only the storage information on the memory function body A side can be selectively read.

As described in connection with the ninth embodiment, in the disclosed semiconductor storage device, a ratio of a drain current during write and a drain current during erase can be particularly increased in the memory element, and therefore, it is easy to distinguish between the written state and the erased state.

When reading the storage information on the memory function body B side of the memory element 301aA, it is proper to select the operation select line 312 instead of selecting the operation select line 313, select the switchover transistor select line 315 instead of selecting the switchover transistor select line 314 and make the other selection operation and voltage application conditions similar.

If a voltage of, for example, +1.8 V for read is further applied to the first voltage input terminal 317B1 during the read operation, a current corresponding to the storage information of the memory element 301aB is inputted to the other input of the sense amplifier 318AB. Therefore, in the present embodiment, a difference between the currents flowing through the two memory elements 301aA and 301aB can be detected by the sense amplifier 318AB. In this case, two memory elements store one-bit or two-bit information. As described in the explanation of the read operation, if the direction of the current flowing in the memory element is reversed during the read operation and the pieces of information stored in the memory function body A and the memory function body B are independently read, then two-bit operation can be performed by two memory elements. If the direction of the current flowing in the memory element during the read operation is exclusively limited to one direction, then the one-bit operation is to be performed by two memory elements.

With a construction in which one memory element is connected to one input of the sense amplifier, and an external reference element is connected to the other input of the sense amplifier, two-bit information can be stored in one memory element.

However, it is preferable that the outputs of two memory elements (memory element pair) are inputted to an identical sense amplifier as in the present embodiment. When the above-mentioned construction is possessed, by detecting the difference between the currents flowing in the two memory elements that have similar element structures, the storage information of the memory element can be read. When, for example, a transistor of an ordinary structure is employed as an external reference, a difference in the temperature characteristic between the memory element and the transistor of an ordinary structure becomes the cause of obstructing the reliability of the read operation. Therefore, by inputting the outputs of the memory element pair to the identical sense amplifier, the reliability of the read operation can be improved.

In the semiconductor storage device of an embodiment of the present embodiment, a total of two select transistors are connected, one for each, to both sides of each memory element. Therefore, a rewrite voltage applied to the bit line during the rewrite operation is applied only to the selected sole memory element and not applied to the other memory elements connected to the same bit line pair. Therefore, it becomes possible to prevent the rewrite error of the non-selected cells during the rewrite operation.

Moreover, the problem that the off-state currents of the non-selected cells are added to the read current of the selected cell during the read operation and the margin of the read operation is reduced is alleviated. This effect becomes remarkable particularly when the number of word lines is great and the number of cells connected to an identical bit line is great.

In the case where one select transistor is provided only on one side of each memory element, the off-state current of the non-selected cells can be reduced during the read operation.

The word lines 308a–308n can be formed by connecting the gate electrodes of the memory elements by means of, for example, top metal interconnections. However, it is preferable that the gate electrodes of the memory elements (at least one pair of memory elements) integrally function as a word line, and the memory function bodies of the memory element pair are integrally shared on both sides of the respective gate electrodes. For example, if a linear polysilicon electrode extends over the active regions of a plurality of semiconductor layers, and the polysilicon electrode and the active regions of the semiconductor layers are insulated from each other by a gate insulator, then the polysilicon functions as a gate electrode on each active region and the linear polysilicon electrode itself functions as a word line. In this case, the number of contacts, which connect the gate electrodes with the top metal interconnections, is largely reduced, and the degree of integration of the semiconductor storage device can be improved. Moreover, since the gate electrode has the memory function bodies, there is no need to separate the memory function bodies every memory element, so that the manufacturing process can be simplified and a semiconductor storage device that is inexpensive and has high reliability can be obtained.

The semiconductor storage device of an embodiment of the present embodiment and a logic transistor should preferably be consolidated on an identical semiconductor chip.

Figure 23:
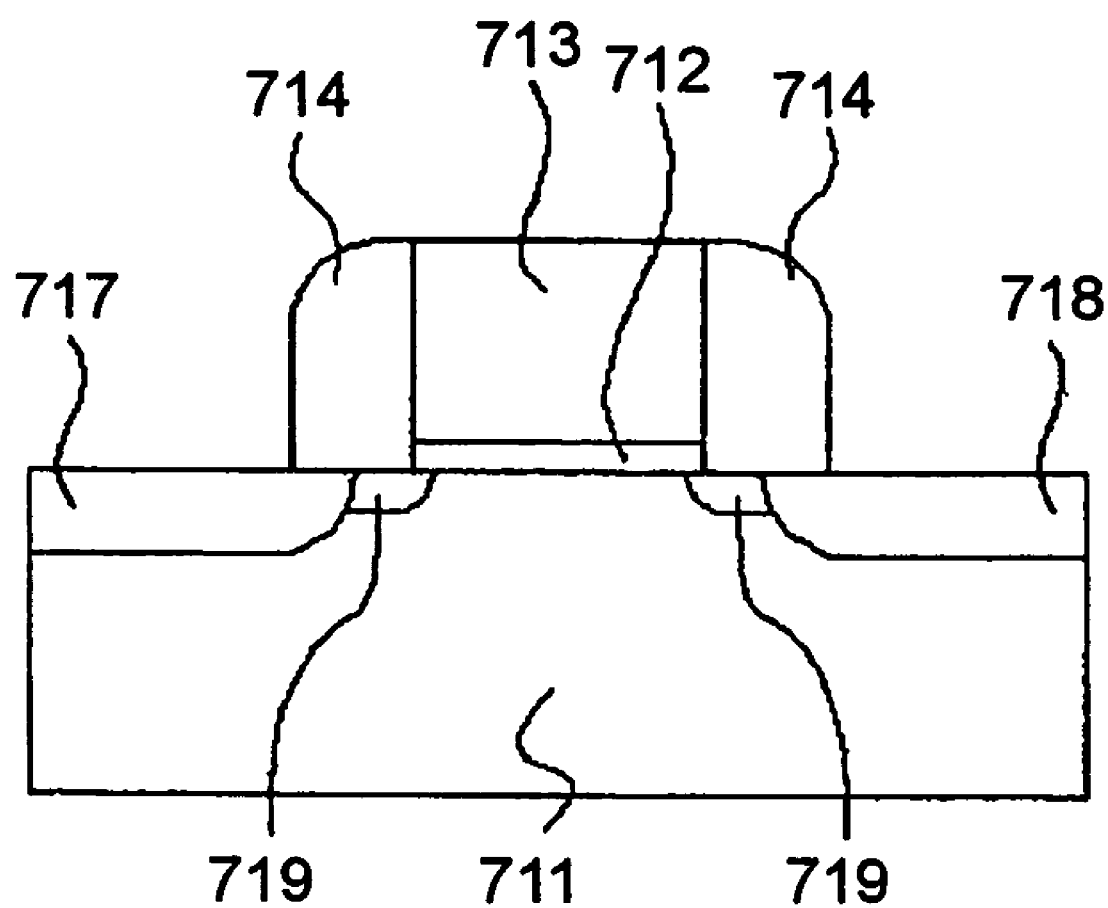
FIG. 23 is a schematic sectional view of part of an ordinary transistor.

A procedure for forming the memory element of various embodiments of the present embodiment has a very high affinity for the ordinary standard transistor formation processes, and therefore, a process for consolidating a semiconductor storage device, i.e., the memory element and a logic transistor becomes very simple. As shown in FIG. 23, in the standard transistor that constitutes a logic circuit section and an analog circuit section, a gate electrode 713 that has sidewall spacers 714 constructed of insulators on its sidewalls is normally formed on a semiconductor substrate 711 via a gate insulator 712, and a source region 717 and a drain region 718 are formed on both sides of the gate electrode 713. The source region 717 and the drain region 718 have an LDD (Lightly Doped Drain) region 719. Therefore, this standard transistor has a close resemblance to the construction of the memory element of the semiconductor storage device. In order to modify the standard transistor to the memory element, it is only required to add a function of a memory function section to, for example, the sidewall spacer 714 and form no LDD region 719.

More concretely, it is proper to modify the sidewall spacers 714 to a structure similar to that of, for example, the memory function bodies 261 and 262 of FIG. 8. In this case, a film thickness constituent ratio of the silicon oxides 241 and 243 and the silicon nitride 242 can be properly adjusted so that the memory element appropriately operates. Even if the side wall spacer of the transistor that constitutes the standard logic section has a structure similar to that of the memory function bodies 261 and 262 of FIG. 8, the transistor performance is not impaired so long as the sidewall spacer width (i.e., the total film thickness of the silicon oxides 241 and 243 and the silicon nitride 242) is appropriate and the transistor is operated within a voltage range in which no rewrite operation occurs.

Moreover, in order to form an LDD region in the transistor that constitutes the standard logic section, it is proper to carry out impurity implantation for forming the LDD region after the formation of the gate electrode and before the formation of the memory function bodies (sidewall spacers). Therefore, by merely masking the memory element with a photoresist in carrying out the impurity implantation for the formation of the LDD region, the memory element and the standard transistor can be concurrently formed and easily consolidated.

It is to be noted that conventional flash memory has a formation process significantly different from those of the standard logic process. Therefore, the number of masks and the number of processes of the semiconductor storage device of the embodiments of present invention can be remarkably reduced in comparison with the conventional case where a logic circuit, an analog circuit and a flash memory used as a nonvolatile memory are consolidated. Therefore, the yield of the chip in which the logic circuit, the analog circuit and the nonvolatile memory element are consolidated is improved, and the manufacturing cost is reduced, consequently allowing an inexpensive semiconductor storage device of high reliability to be obtained.

It is preferable to operate the semiconductor storage device of the present embodiment so as to make two memory elements connected to one sense amplifier store mutually opposite pieces of storage information and detect a difference between the values of the currents flowing in the two memory elements by the sense amplifier during read. When the mutually opposite pieces of storage information are stored in the two memory elements connected to one sense amplifier, the reliability of read is more improved than when one memory element and an external reference cell are connected to one sense amplifier. Moreover, the read speed can be improved, and the read current value can be reduced. The reason why the reliability of read is improved when the mutually opposite pieces of storage information are stored in the two memory elements connected to one sense amplifier is that the rewrite frequencies of the two memory elements can be made to coincide with each other, and therefore, characteristic changes of the two memory cells become almost equivalent and the difference between the values of the currents flowing in the two memory elements is hard to change even when the characteristic change caused by device deterioration occurs. The values of the currents flowing in the two memory elements can easily be maintained large for similar reasons, and therefore, the read speed can be improved. Moreover, it is easy to reduce the read current value by raising the sensitivity of the sense amplifier for similar reasons. If the read current value can be reduced, the degree of integration of the memory cell array can be improved by reducing the gate width of the memory elements.

The method of operating the two memory elements connected to one sense amplifier so as to store the mutually opposite pieces of storage information and detect the difference between the values of the currents flowing in the two memory elements by the sense amplifier during read is preferable particularly when the semiconductor storage device of an embodiment of the present invention is employed.

As described in connection with the ninth embodiment, in the memory element of an embodiment of the present invention, the drain current ratio between write and erase can be particularly increased. Therefore, the difference between the values of the currents flowing in the two memory elements can be increased, allowing high-speed read to be achieved. Otherwise, the required difference in the current value can be obtained even if the gate width of the memory elements is reduced, and therefore, it becomes particularly easy to improve the degree of integration of the memory cell array by reducing the gate width of the memory elements.

It is acceptable to independently execute rewrite in one (A) and the other (B) of the memory function bodies in the two memory elements connected to one sense amplifier. Also, in this case, it is preferable to make the one (A) of the memory function bodies store mutually opposite pieces of storage information and make the other (B) of the memory function bodies store mutually opposite pieces of storage information. In this case, two-bit information can be stored in two memory cells. It is required to make reversible the direction of the current flowing in the memory element during the read operation.

Moreover, it is also acceptable to operate the two memory elements connected to one sense amplifier so that the one (A) and the other (B) of the memory function bodies have same storage state. In this case, one-bit information can be stored in two memory cells. As described above, by making same the storage states of the memory function bodies on both sides, the reliability of the read operation can be further improved.

That is, during the read operation, the drain current sensitively responds to the amount of electric charge in the memory function body located on the source side and is not so sensitive to the amount of electric charge in the memory function body located on the drain side. However, the drain current of the memory element is not completely free from the influence of the amount of electric charge in the memory function body located on the drain side. This influence produces an interference effect to change the value of the current inputted to the sense amplifier and increase the margin of the read current. Therefore, if the two memory elements connected to one sense amplifier operate so that the one (A) and the other (B) of the memory function bodies have same storage state, then the change in the value of the current inputted to the sense amplifier is reduced, and the reliability of the read operation can be improved.

With regard to the memory element employed in the present embodiment, it is preferable to employ the memory element of the seventh embodiment. That is, the thickness (T1) of the insulator that insulates the charge retention film (silicon nitride 242) from the channel region or the well region should preferably be thinner than the thickness (T2) of the gate insulator and not smaller than 0.8 nm. If such a memory element is employed in the semiconductor storage device of the present embodiment, it becomes possible to reduce the voltage of the write operation and the erase operation or increase the speed of the write operation and the erase operation. Moreover, the memory effect of the memory element is increased, and therefore, the read speed of the semiconductor storage device can be made high.

With regard to the memory element used in the present embodiment, it is preferable to employ the memory element of the eighth embodiment. That is, the thickness (T1) of the insulator that insulates the charge retention film (silicon nitride 242) from the channel region or the well region should preferably be thicker than the thickness (T2) of the gate insulator and not greater than 20 nm. If such a memory element is employed in the semiconductor storage device of the present embodiment, it becomes possible to improve the retention characteristic without degrading the short-channel effect of the memory element, and therefore, a sufficient storage performance can be obtained even if the semiconductor storage device is made to have high degree of integration.

As described in connection with the second embodiment, in the memory element employed in the present embodiment, the region (silicon nitride 242) that retains electric charge in the memory function bodies 261 and 262 should preferably overlap the diffusion regions 212 and 213, respectively. If such a memory element is employed in the semiconductor storage device of the present embodiment, the read speed of the semiconductor storage device can be sufficiently increased.

As described in connection with the second embodiment, in the memory element employed in the present embodiment, the memory function bodies should preferably include a charge retention film arranged roughly parallel to the surface of the gate insulator. If such a memory element is employed in the semiconductor storage device of the present embodiment, variations in the memory effect of the memory elements can be reduced, and therefore, variations in the read current of the semiconductor storage device can be restrained. Furthermore, the characteristic change of the memory element during storage retention can be reduced, and therefore, the storage retention characteristic of the semiconductor storage device is improved.

As described in connection with the third embodiment, in the memory element employed in the present embodiment, the memory function bodies should preferably include a charge retention film arranged roughly parallel to the surface of the gate insulator and include a portion extended roughly parallel to the side surface of the gate electrode. If such a memory element is employed in the semiconductor storage device of the present embodiment, the rewrite speed of the memory element is increased, and therefore, the rewrite operation of the semiconductor storage device can be made high.

With regard to the memory element employed in the present embodiment, it is most preferable to employ a memory element of the best form that has already been described. With this arrangement, the performance of the semiconductor storage device can be made best.

(The Eleventh Embodiment)

According to the semiconductor storage device of the present embodiment, no select transistor is arranged in the semiconductor storage device of the tenth embodiment.

Figure 21:
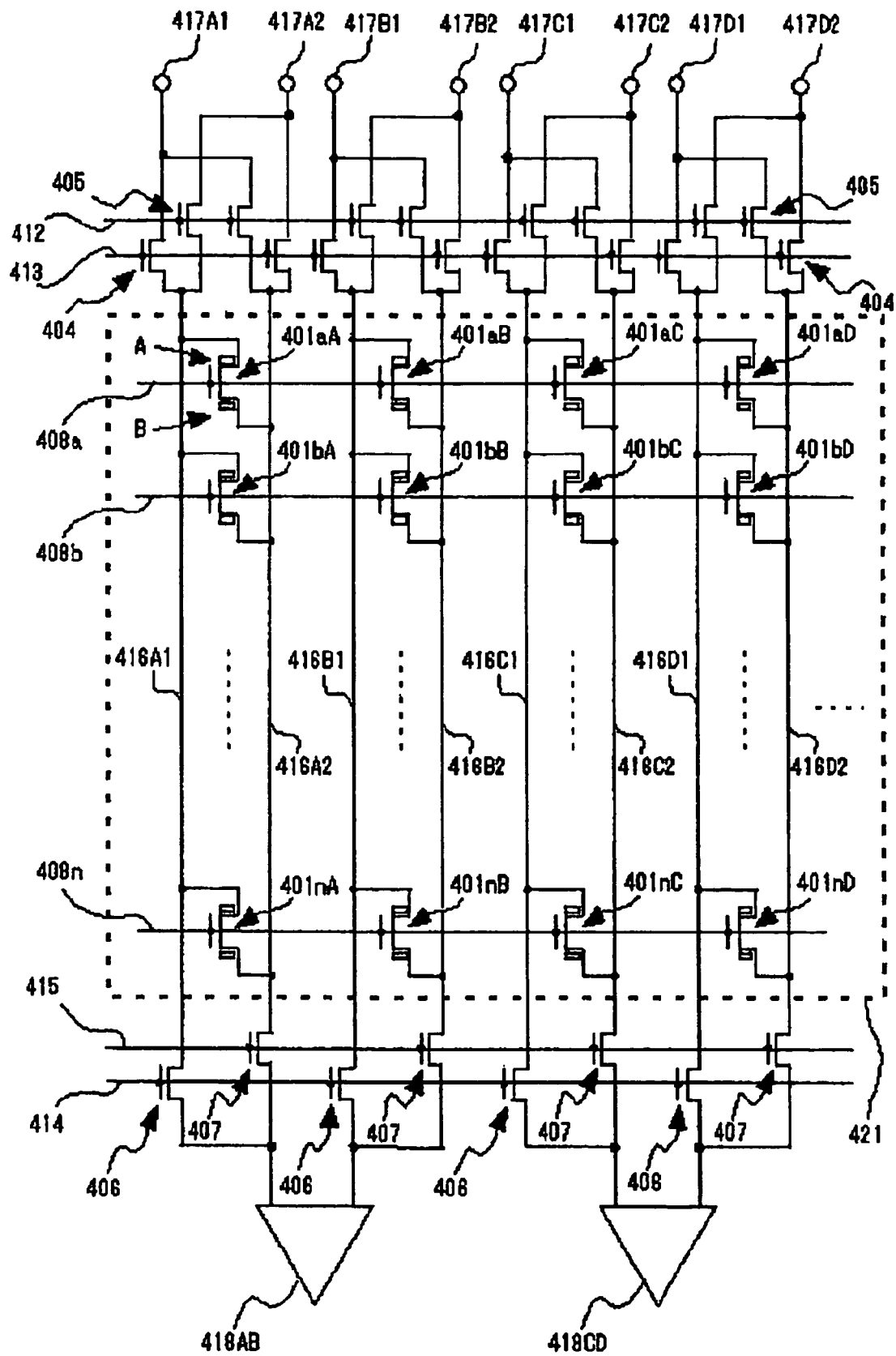
FIG. 21 is a block diagram of the semiconductor storage device of the eleventh embodiment of the present invention.

FIG. 21 is a circuit diagram of a semiconductor storage device. This device differs from the device of FIG. 20 only in the memory element array region (memory cell array) 421. Operation select transistors 404 and 405, operation select lines 412 and 413, first voltage input terminals 417A1–417D1, second voltage input terminals 417A2–417D4, a first switchover transistor 406, a second switchover transistor 407, switchover transistor select lines 414 and 415, sense amplifiers 418AB and 418CD and word lines 408a–408n are similar to those of the semiconductor storage device (FIG. 20) of the tenth embodiment.

The memory elements 401aA–401aD, . . . , 401nA–401nD are connected directly to the first bit lines 416A1–416D1 and the second bit lines 416A2–416D2, respectively.

The operation methods are similar to those of the semiconductor storage device (FIG. 20) of the tenth embodiment. It is to be noted that the rewrite voltage is applied to the sources and the drains of all the memory elements connected to an identical bit line pair during the rewrite operation since there is no select transistor. Therefore, it is required to design the memory elements so that the memory element connected to the word lines other than the selected word line are not rewritten.

According to the semiconductor storage device of the present embodiment, the degree of integration can be largely improved since there is no select transistor. Therefore, the manufacturing cost is remarkably reduced, and an inexpensive semiconductor storage device can be obtained.

In the memory element of embodiments of the present invention, overerase, which poses a problem in an EEPROM, does not occur. Therefore, it is especially preferable to employ the memory element in a semiconductor storage device that has a plurality of word lines and no select transistor as in the present embodiment. The above is because a state of continuity is consistently provided between the first bit line 416A1 and the second bit line 416A2, and it becomes impossible to select the memory element connected between these bit lines when the threshold value of one (e.g., memory element 401aA) of the memory elements becomes negative due to overerase.

(The Twelfth Embodiment)

The semiconductor storage device of the present embodiment is related to a device in which the memory element array region (memory cell array) 521 has a higher density.

Figure 22:
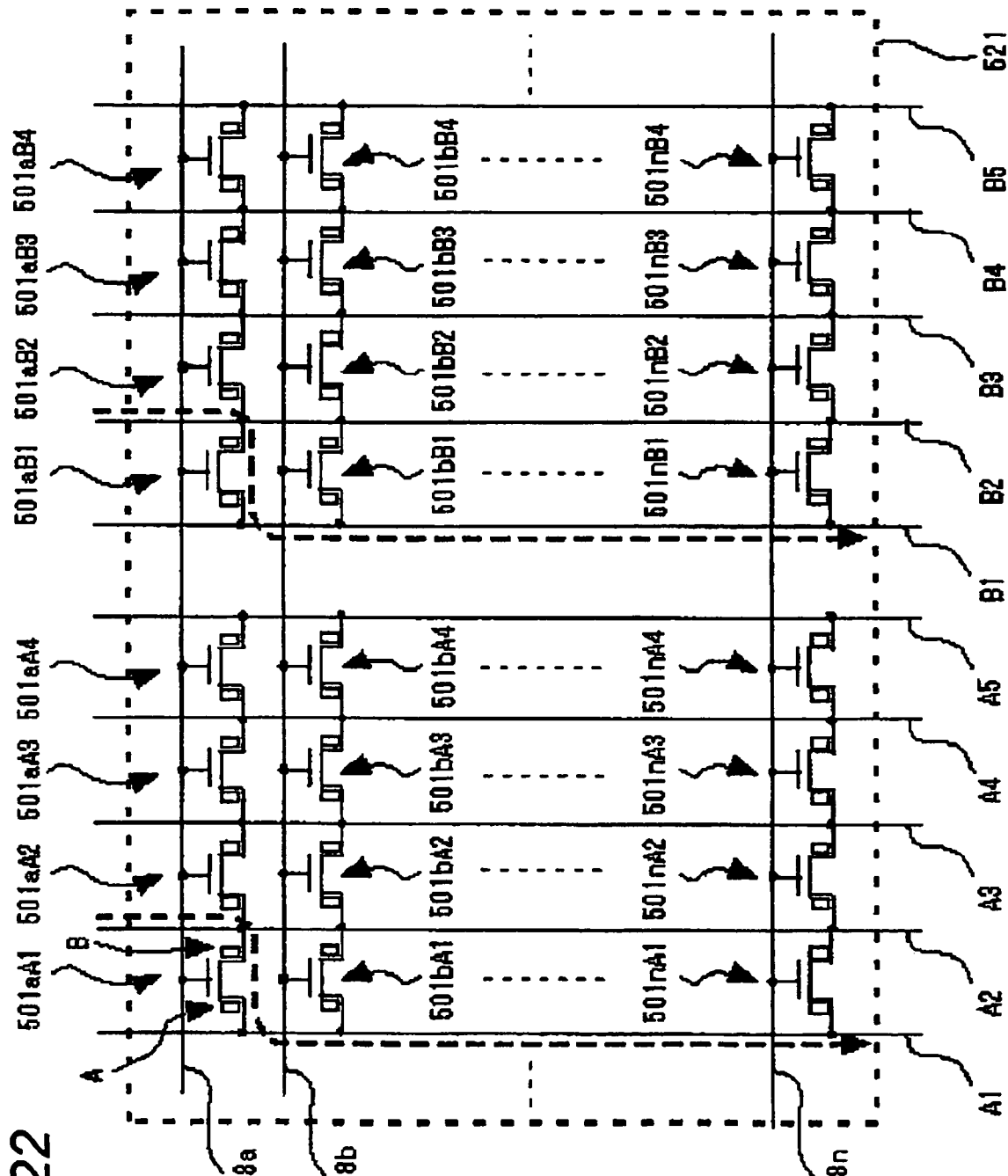
FIG. 22 is a block diagram of the semiconductor storage device of the twelfth embodiment of the present invention.

In FIG. 22, there are shown memory elements 501aA1–501aA4, 501aB1–501aB4, . . . , 501nB1–501nB4, word lines 508a–508n and bit lines BA1–BA5 and BB1–BB5. The portion, where the memory elements of this semiconductor storage device are arranged, differs from those of the tenth and eleventh embodiments in that the bit lines are shared by memory elements that belong to the mutually adjoining columns. In concrete, the bit lines A2–A4 and B2–B4 are shared. Although the memory elements arranged in four columns constitute one block in the present embodiment, the number of columns is not limited to this.

In this semiconductor storage device, the read operation is performed by inputting currents flowing in two memory elements that belong to different blocks, or, for example, the memory elements 501aA1 and 501bB1 to one input and the other input, respectively, of the sense amplifier and detecting a difference between the currents. In the above case, for example, one input of the sense amplifier is connected to the bit line A1, and the other input is connected to the bit line B1. Further, a voltage (e.g., +1.8 V) appropriate for the read operation is applied to the bit lines A2 and B2. The dashed lines of FIG. 22 indicate the path of currents that flow at this time. The currents flowing through these paths are respectively inputted to the two inputs of the sense amplifier, and a difference between the currents is detected. It is to be noted that a circuit and so on for connecting the memory element to the voltage input terminal and the sense amplifier are not shown in FIG. 22.

According to the semiconductor storage device of the present embodiment, the bit lines are shared by the memory elements that belong to mutually adjoining columns, and therefore, the degree of integration can be remarkably improved. Therefore, the manufacturing cost is largely reduced, and an inexpensive semiconductor storage device can be obtained.

(The Thirteenth Embodiment)

This thirteenth embodiment is related to a semiconductor storage device including a memory cell array in which a plurality of memory elements described in the first through ninth embodiments are arranged or a memory cell array described in the tenth through twelfth embodiments as well as a program verify circuit.

Figure 24:
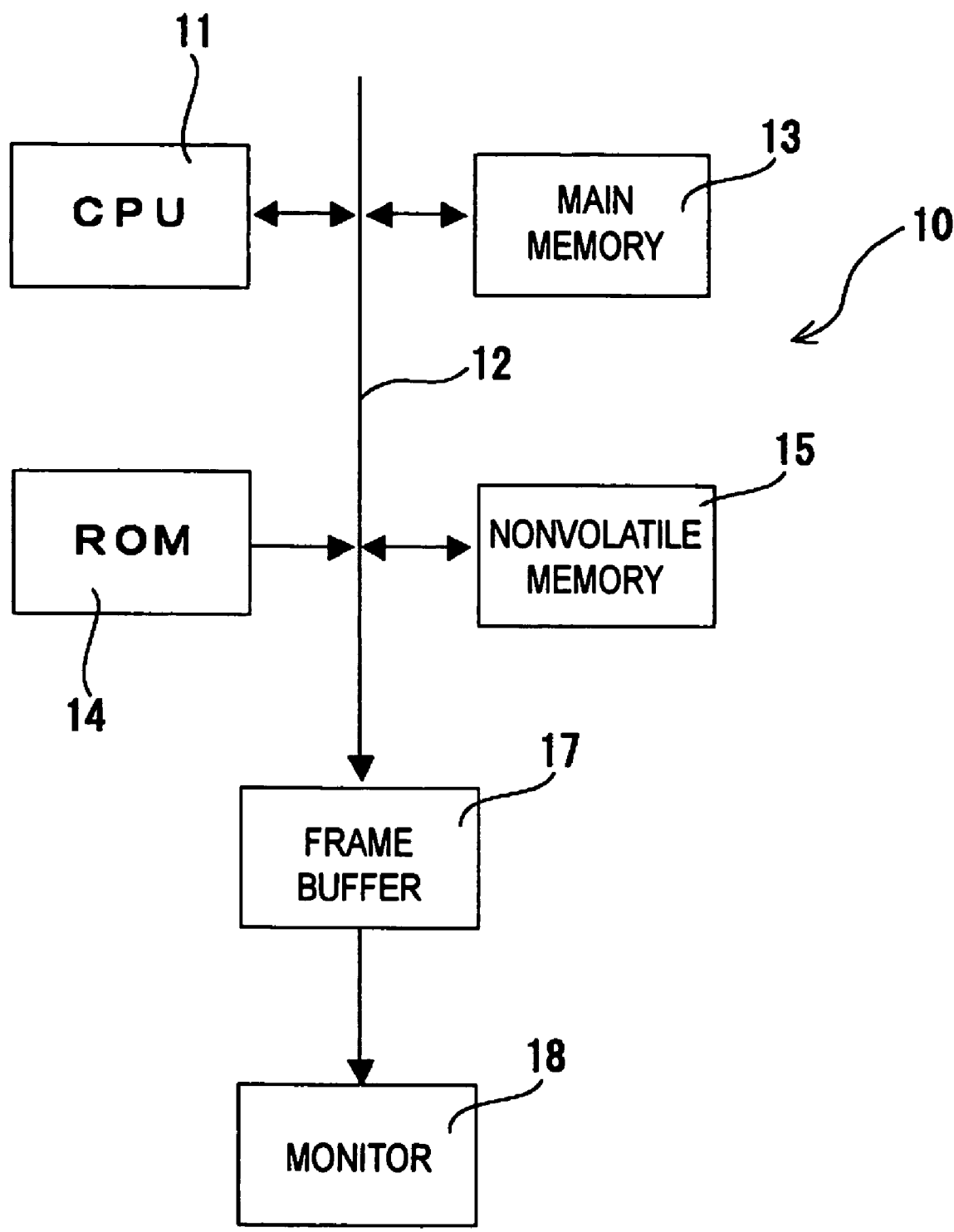
FIG. 24 is a block diagram of a computer utilizing a nonvolatile memory (semiconductor storage device) of the thirteenth embodiment of the invention.

FIG. 24 shows a system block diagram. This invention is applicable to any system employing a nonvolatile memory (nonvolatile semiconductor storage device) like computers. Such a computer 10 includes a CPU (central processing unit) 11 for executing various instructions given to control the operation of the computer 10. This CPU 11 is connected to a bus 12 so as to carry information to various parts of the computer 10. The bus 12 is connected to a main memory 13. This main memory 13, which is given by a DRAM (dynamic random access memory), keeps information stored while power is supplied to the computer 10. Also, the bus 12 is connected to various peripheral devices such as a nonvolatile memory 15 and circuits such as a frame buffer 17. Into this frame buffer 17, data which are to be transferred to a monitor 18 for use of display as an example of output devices are written. This nonvolatile memory 15 includes the memory cell array 21 shown in FIG. 26, and circuits for controlling all the operations of the memory cell array 21 associated with write (program), erase and verify operations of this memory cell array 21.

Figure 25:
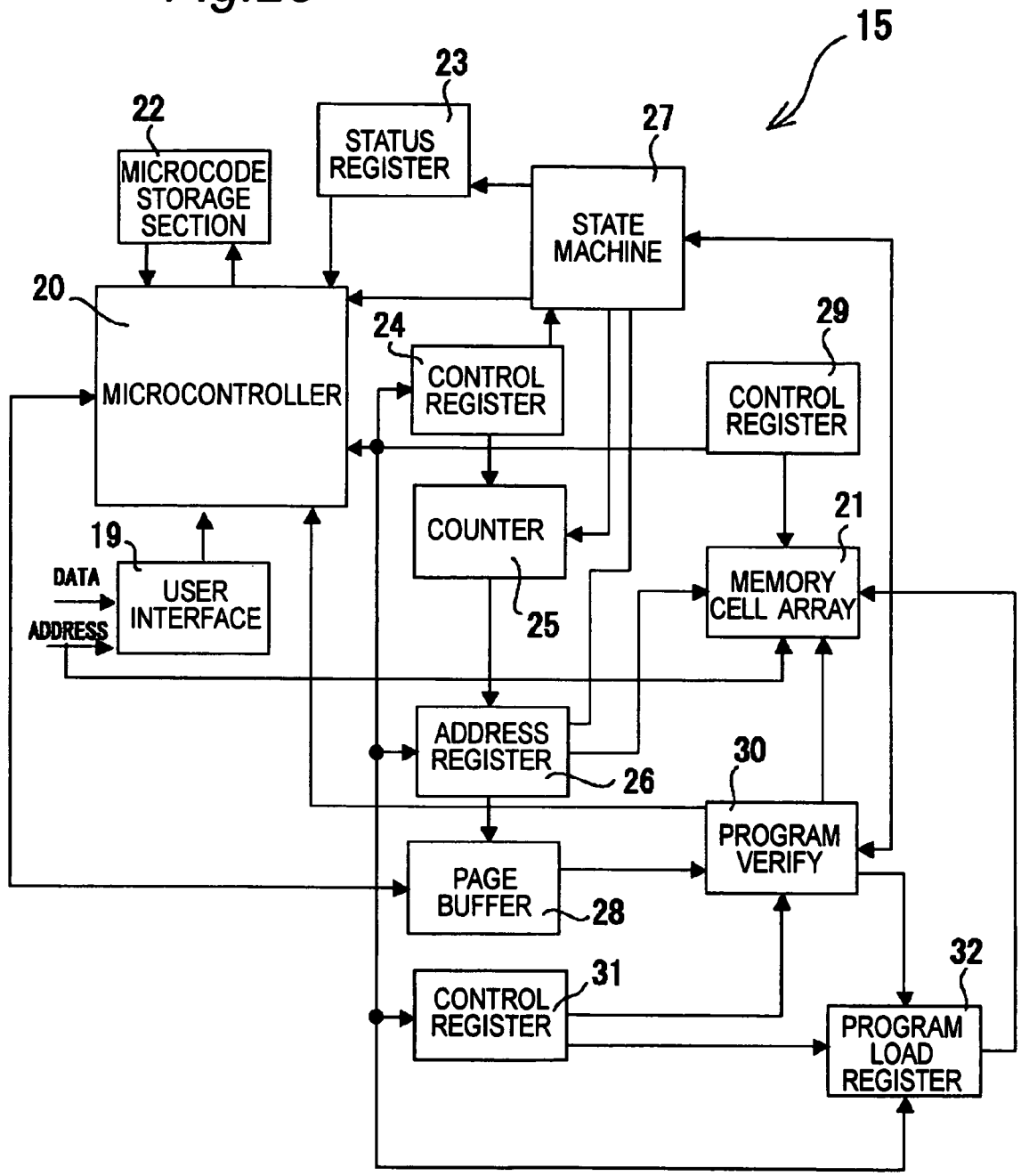
FIG. 25 is a block diagram of the semiconductor storage device using a memory cell array.

FIG. 25 is a block diagram of part of the nonvolatile memory 15, which is the semiconductor storage device shown in FIG. 24. This semiconductor storage device 15 is connected to the bus 12 (see FIG. 24) by a user interface 19. This user interface 19 gives a signal, which is derived from the bus, to a microcontroller 20. The microcontroller 20 performs operations necessary to control the memory cell array 21. In one embodiment, the microcontroller 20 and the memory cell array 21 are placed on one integrated circuit board together with the other elements of the semiconductor storage device 15. The microcontroller 20 cooperates with a microcode storage part 22, and the microcode storage part 22 can store instructions which are used by the microcontroller 20 to control the operation of the semiconductor storage device 15.

The microcontroller 20 cooperates with a status register 23, a state machine 27, a control register 24, a counter 25 and an address register 26. The status register 23 provides data regarding the state of the state machine 27. The state machine 27 controls various operations of the semiconductor storage device 15 such that the program verify circuit 30 is controlled during the verify stage of programming of the memory cell array 21. The address register 26 is used to execute the operations of the state machine 27 and the microcontroller 20 including addressing of the memory cell array 21. The semiconductor storage device 15 includes a page buffer 28 used in writing large amounts of data into the memory cell array 21, and a control register 29 used together with the memory cell array 21 to control its operations. Also, the semiconductor storage device 15 includes a program verify circuit 30, a control register 31 associated therewith, and a program load register 32 as storage means.

During an operation, the microprocessor (CPU) 11 generates commands for write (program), erase and read of the memory cells (memory elements) within the memory cell array 21. By using the structure of the commands, the microprocessor 11 specifically determines the type of an operation (e.g., read, program/verify, erase/verify) and addresses of memory elements on which the operation is performed. The microcontroller 20, upon receiving a command from the microprocessor 11, causes or directs the state machine 27 to execute a particular operation in the memory cell array 21. The microcontroller 20 generates the timing, control and address operations necessary to associate the memory cell array 21 with the microprocessor 11.

Figure 26:
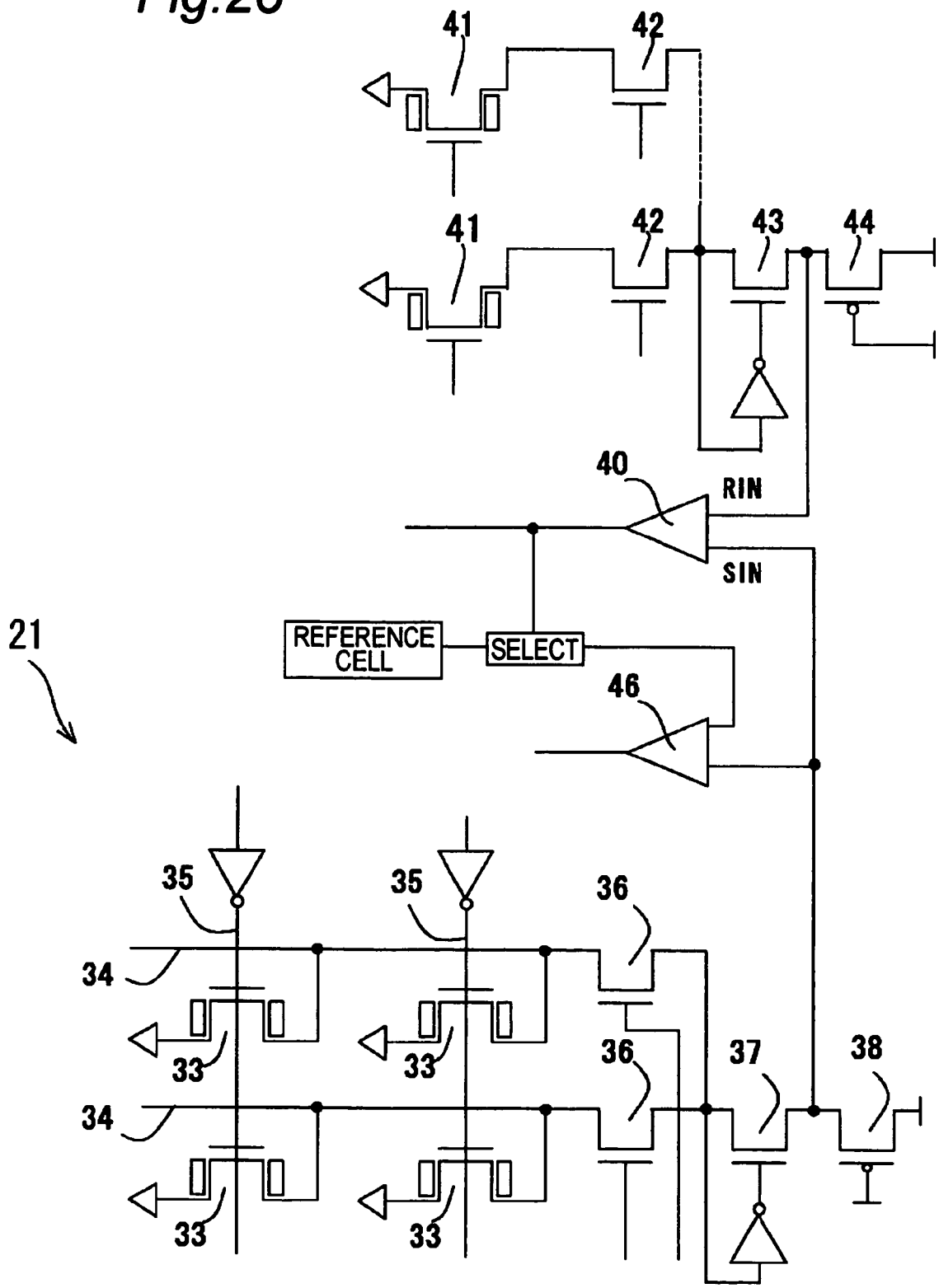
FIG. 26 is a circuit diagram of a memory cell array that can be used in FIG. 25.

FIG. 26 shows part of the memory cell array 21. As can be understood from FIG. 26, the memory cell array 21 includes a plurality of memory elements 33 implemented by field effect transistors arrayed in rows and columns. A circuit that selects particular rows and columns to thereby address particular memory elements 33 is provided. The memory cell array 21 shown in this FIG. 26 is of reading data stored in one of the memory function bodies disposed on both sides of the gate electrode.

However, in another embodiment, the read circuit is connected to both the source and drain of a memory element, and controlling this makes it possible to selectively read data stored in the memory function bodies on both sides of one memory element. For example, a memory cell array 321 shown in FIG. 20, a memory cell array 421 shown in FIG. 21, and a memory cell array 521 shown in FIG. 22 are usable.

Figure 27:
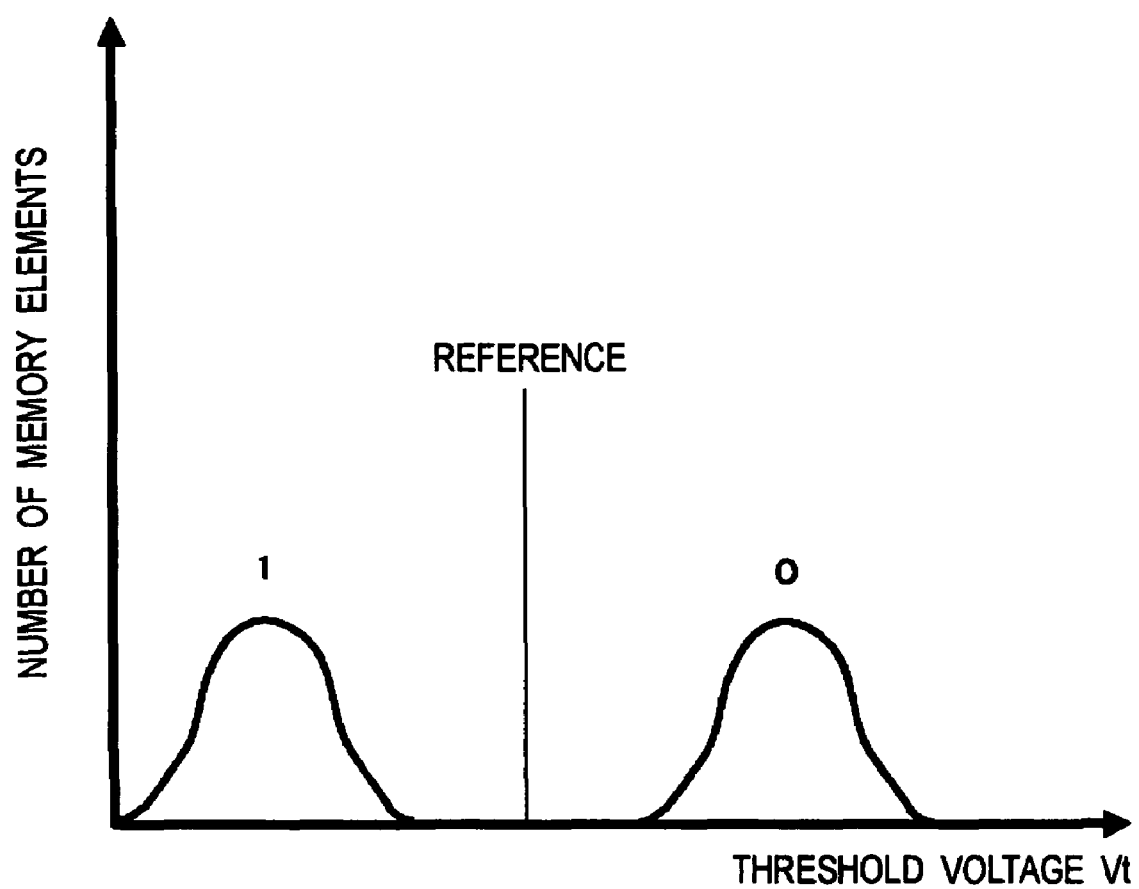
FIG. 27 is a chart showing a threshold voltage to number-of-memory-elements characteristic of the memory elements in the memory cell array of FIG. 26.
Figure 28:
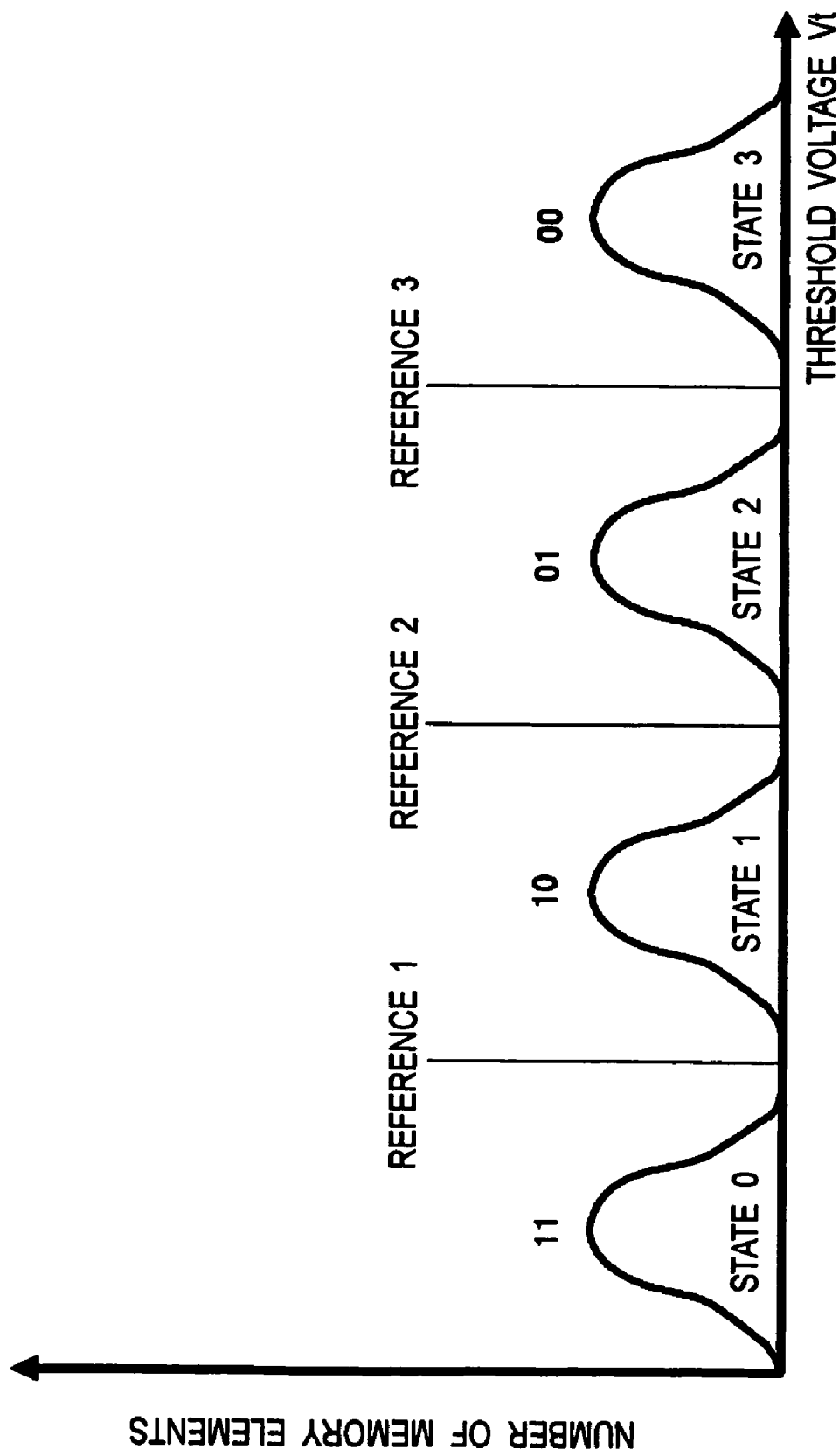
FIG. 28 is a chart showing a threshold voltage to number-of-memory-elements characteristic of the memory elements in the memory cell array of FIG. 26.

FIG. 27 shows a population of memory elements (memory cells) 33 having particular threshold voltages in erase and write states. Memory elements 33 in each of which one of the memory function bodies provided on both sides of the gate electrode has been written with substantial electric charge allow only a small current to pass therethrough, while erased memory elements 33 each allow a substantially large amount of current to pass therethrough.

Reference elements 41 are used to determine the level of electric charge stored by the memory function bodies of each memory element 33 of the memory cell array 21. Each of these reference elements 41 is essentially identical to the memory element 33. The reference elements 41 are written to precise values by placing electric charge on the memory function bodies. In reading of a memory element 33, the value of electric charge stored by the memory element 33 is compared with the value of electric charge stored by the reference element 41, so that the charge level (state) of the memory element 33 is determined. In a typical memory cell array 21 that can take only two charge levels with respect to one memory function body of each memory element 33, the reference element 41 is written, i.e., programmed so as to be put into an intermediate state between written state and erased state of the memory element 33 so that a particular value is generated upon inquiry.

FIG. 26 shows one embodiment of the circuit for reading the memory elements 33. Each of the memory elements 33 has a gate terminal connected to a word line 35, a source terminal connected to the ground, and a drain terminal connected to a bit line 34. N-type FETs (Field Effect Transistors) 36 are arranged as columns select devices that allow memory elements 33 of particular columns to be selected. The drain terminals of the N-type FETs 36, connected to an N-type FET 37 arrayed in cascade, give a drain bias to the memory elements 33. The drain terminal of the N-type FET 37 is connected to a load-use P-type FET 38 connected to Vcc. As shown in the first embodiment, when a voltage of 2 V is applied to the gate electrode of the memory element 33, there flows a drain current depending on the level of charge stored in the memory function body. This current passes through the N-type FET 37 and the load-use P-type FET 38, causing a voltage drop to occur. A voltage of the drain terminal of the P-type FET 38 is fed to one input of a sense amplifier 40. The sense amplifier 40, at the other input, receives a voltage generated in response to a current that passes through the reference element 41 which is arranged in a similar current path with FETs 42, 43 and 44 of the same characteristics as the FETs 36, 37 and 38. If a read-out current that passes through the memory elements 33 is greater than the current that passes through the reference element 41, then the sense amplifier 40 generates one output signal. If the read-out current that passes through the memory elements 33 is less than the current that passes through the reference element 41, then the sense amplifier 40 generates a different output signal.

In recent years, while area reduction of the memory element (memory transistor) has been progressing by the advancement of microprocessing techniques, variations in memory performance due to variations in processes have been increasing along therewith. Therefore, as shown in FIG. 27, even when one bit is stored with respect to one memory function body, it has been of increasing importance to program the memory elements 33 with high precision.

With respect to the above-described memory cell array 21 in which more than one bit may be stored by each memory element (memory transistor) 33, since larger numbers of levels have to be tested in order to determine the value stored by the memory function body of a memory element 33, larger numbers of reference elements 41 are utilized. Because of measurement of a large number of levels and relatively narrow boundaries between charge levels, the values stored by the reference elements 41 needs to be determined with very high accuracy.

Referring to FIG. 26, in order to enable more than one bit storage by each memory element 33, a plurality of reference elements 41 are connected via a FET 43 connected in cascade to selection FETs 42, respectively, so as to be coupled to a reference column-load use FET 44. Different reference elements 41 have their memory function bodies programmed into different levels so as to be tested for such different reference levels and the value of charge stored in any memory element 33. Enabling a particular FET 42 causes desired one of the reference elements 41 to be connected so that a voltage generated by a current passing therethrough is inputted to an RIN terminal of the sense amplifier 40.

In a memory cell array of one embodiment in which four different levels of charge are used for one memory function body, individual levels of charge assigned to the memory element designate two different bits. Those states are represented by 11, 10, 01 and 00 so that the memory element (memory cell) can be used for both 1-bit storage and multi-bit storage. Thus, an erased memory cell shows a charge level of 11. A memory cell having a slightly higher threshold voltage shows a 10. A memory cell having an even higher threshold voltage shows a 01. A cell having the highest threshold voltage that is usable in this embodiment shows a 00. For detection of these levels, a pair of sense amplifiers are used. A first sense amplifier 40 detects whether stored charge becomes above or below a first reference level that is an essentially center of possible charge levels which might be stored. An output of this first sense amplifier 40 is fed back and controls the next stage of detection. If the charge level is below the first reference level, then the output of the first sense amplifier 40 causes the output of the memory cell to be sent to a sense amplifier 46 and compared with a reference value midway between the charge level of 11 and the charge level of 10. If the charge level is above the first reference level, then the output of the first sense amplifier 40 causes the output of the memory cell to be sent to the sense amplifier 46 and compared with a reference value midway between the charge level of 01 and the charge level of 00. The value of the reference value is chosen by a select circuit depending on the output value generated by the first sense amplifier 40.

The memory cells of the memory cell array 21 may also be used for storage of only 1 bit. If the first sense amplifier 40 and the first reference voltage are used for measurement of the condition of charge on the memory function body of the memory element 33, the value of the charge is either above or below the value of the charge of the reference element 41, thus capable of indicating a 1 for an erased condition and a 0 for a programmed condition.

In one embodiment, a memory element (memory cell) 33 is programmed (written) by applying a voltage to the gate terminal and drain terminal of the memory element 33 while grounding the source terminal of the memory element 33. In one embodiment, 16 bits for 1 word are written in one operation. For current saving with low power supply, four memory cells are written at once, followed by four memory cells, and so on in sequence until the word is written. If a memory cell stores a single bit, then 16 memory function bodies are used for storage of the word in this embodiment. If the memory function bodies each store 2 bits, then 8 memory function bodies are required to store 16 bits.

Those skilled in the art will recognize that it is quite difficult to program a plurality of memory cells to different threshold levels during a sequence of continuing operations as described for multi-bit memory cells. The memory cells of the memory cell array and the other circuitry portions are not identical, and cannot be made identical. As a result, the memory cells cannot be programmed at the same rate. With variations in program rate like this, there would arise such problems as occurrence of variations in erase time even in storing 1 bit for one memory function body. Further, on condition that four multilevel cells are programmed to different levels having different charge values by gradually increasing voltages applied to the gate terminals of those cells until those voltages reach their individual correct charge levels, then the programming must be much more closely controlled so that the actually reached charge levels fall within a very limited range. Otherwise, some memory cells will not be sufficiently charged, while the other memory cells will be charged excessively. Furthermore, even if a memory cell is charged to enough level to give a particular desired charge level when the memory cell is read, a verify operation necessary to ascertain that the charge is within a proper range is performed in such a very narrow range that the memory cells is properly programmed, so that an amount of charge such that it is impossible to verify is lost while the other memory cells of the same word are still being charged. To charge the memory cells by an additional amount could be potentially to charge the memory cells beyond proper levels. Thus, unless verify is not done later, memory cells that have been verified are desirably prevented from being rewritten.

On the other hand, memory cells to be written into the 00 state can be written too fast because of their structure. The 00 state requires a sufficiently high charge that a somewhat greater charge would cause the memory cells to be damaged, and therefore charging the memory cells at high speed is desirably suppressed so that the memory cells are not overcharged when operated in the multi-bit mode.

One of the methods for achieving this is to program the memory cells in steps. For achievement of this, in a write algorithm to be used by the controller during write operations, a first initial pulse of a relatively long duration is applied to gate terminals of memory cells to be written in order to shift those memory cells to saturated ranges. Within the saturated ranges, changes in gate voltage cause similar changes in threshold voltages Vt of the memory cells, and therefore the control of write is carried out with relatively high precision. Then, each memory cell is checked to determine whether the memory cell has reached a desired state. If it has not reached, a pulse of a much shorter duration is applied in order to make the memory cell closer to the desired charge state. This pulse is of a slightly higher voltage. Its charge level is checked again. Then, the voltage is raised again and a shorter pulse is applied again until the memory cell reaches a first charge level. When the memory cell reaches the first charge level, pulses which are much shorter in length and which are equal in voltage to the last pulse are applied so that the memory cell is shifted to the final charge level. Each of the latter pulses is just enough to shift the state of the memory cell to within the permissible range for a specific state, such that a single pulse can not shift the state of the memory cell beyond a desired range.

Figure 29:
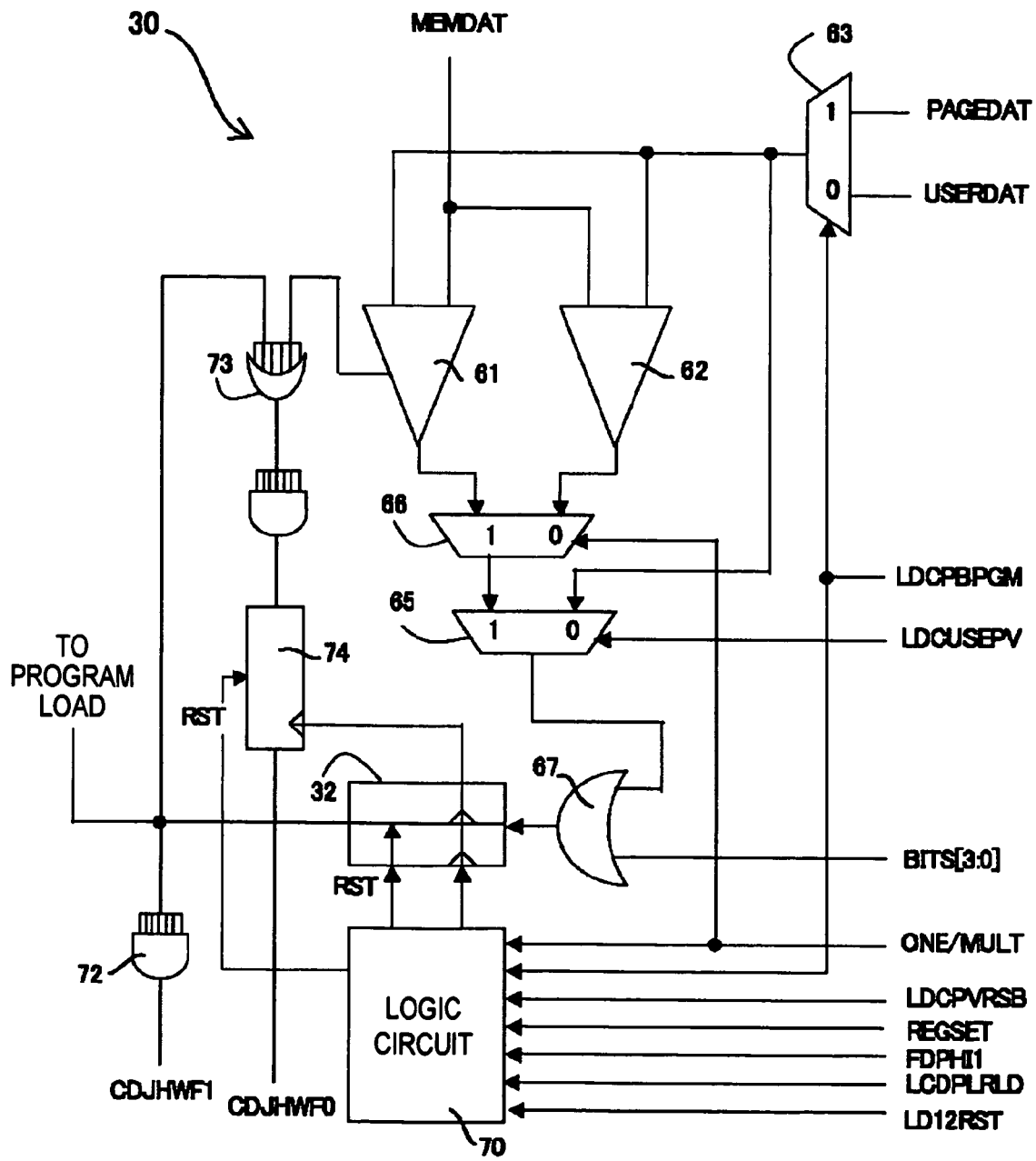
FIG. 29 is a detailed block diagram of a program verify circuit for the memory cell array of embodiments of the invention.

In order to achieve these desired results, embodiments of the present invention are utilized. The present invention is embodied by the verify circuit 30 described in FIG. 29. The verify circuit 30 includes a pair of comparators 61, 62, by which comparisons with logical values of 16 bits of 1 word are performed subsequent to respective write steps in order to determine whether or not a particular desired level of charge has been reached. The comparator 61 compares values when the memory elements (memory cells) 33 are used in their multi-bit states, while the comparator 62 compares values when the memory elements 33 are used in their single-bit states. Inputs to the comparators 61, 62 are fed from the memory cell array as 16-bit signals designated as MEMDAT. A desired state to which each of the memory elements 33 is to be programmed is fed by a multiplexer 63. The multiplexer 63 outputs 16-bit data from the user as a signal USERDAT or from a page buffer as a signal PAGE-DAT. The desired data is transferred to each of the comparators 61, 62 and a multiplexer 65. The multiplexer 65 receives a control signal from the microcontroller 20 that makes verify data or user data transferred.

If the comparator 62 is used because 1-bit data are stored in each memory function body, an output of the comparator 62 is transferred to the multiplexer 66 in which the output of the comparator 62 is selected by a control signal ONE/MULT indicating that the single bit mode is being used, and transferred to the multiplexer 65. If the comparator 61 is used because a plurality of bit of data are stored in each memory function body, an output of the comparator 61 is transferred to the multiplexer 66 in which the output of the comparator 61 is selected by the control signal ONE/MULT indicating that the multi-bit mode is used, and transferred to the multiplexer 65. An output from the comparator 61 is eight individual signals indicating for each memory function body whether or not the level stored in the memory function body is compared with two bits out of desired 16 bits. This output is repeated on both the high and low eight bits given by the multiplexer 66 so that a total of 16 signals can be utilized. An output from either of the two comparators 61, 62 indicates whether or not a state to which the memory cell 33 should be written has been reached, with respect to each particular memory element 33 yet.

An output of the multiplexer 65 is fed to an OR gate 67. The other input to the OR gate 67 is a signal BITS[3:0] indicating that particular four bits have been written. These bits allow less than all of program load registers to be written at once. For example, only four bits are written at a time in the above-described current-saving operation. These four possible bits correspond to four program load registers 32, respectively. An output of the OR gate 67 is transferred to the program load registers 32. The program load registers 32 are latches that store indications as to whether or not particular associated memory cells are to be written at the next step. The program load registers 32 are divided into two sets each composed of eight registers. If the multilevel programming is performed, then only eight memory cells are verified at a time, and only a half of these registers are used. A proper set of registers in use are activated in the page buffer mode with a 2-bit clock signal transferred from a logic circuit 70 and derived from the lowest order bit of an address used for addressing the memory cell array. In the single-word programming mode, all of 16 registers are active, but the registers are selected by using a BITS[3:0] signal.

Each of the latches within the program load registers (storage means) 32 stores one value, and outputs either a 1 (one) or a 0 (zero) as an output. A 0 indicates that an associated memory cell should continue to be written, while a 1 indicates that the memory cell should not be further written. If the comparator 61 or 62, which is used to determine whether or not the correct write state has been reached, actually indicates that the state of the memory cell matches a desired state given to the input of the multiplexer 63, a 1 is written to the latch for a particular memory element 33.

In order to assure that a memory cell which has once been written into a correct state (charge level) is not further written even if the charge leaks from the memory function body and that the charge level does not become below enough level to verify the state, each of the latches includes a feedback path which, after the charge level is once verified, precludes any state change until the latches are reset. This is achieved by inhibiting a 0, which indicates a failure of comparison, from being written into the latch once the value of 1 is written into the latch. A reset occurs only when a new write operation is begun or when the programming of all memory cells to lower levels has been completed.

An output of each of latches of the program load registers 32 is transferred to cause the drain voltage to be applied to memory cells while a voltage is applied to the gate terminal of a column selector FET 36 shown in FIG. 26, in order to select a particular column of the memory cell array so that the particular memory cells (memory elements) 33 are written. These latches that provide a zero cause the column selection FETs 36 to be enabled, while the latches that provide a one cause column selection FETs 36 associated therewith to be disabled.

In order to eliminate the problem of overcharge, the outputs from the program load registers 32 are transmitted to an AND gate 72. When the AND gate 72 receives the value of 1 from all of the program load registers 32, a signal CDJHWF1 is generated to indicate that the programming of a particular word has been completed. The outputs from each of the program load registers 32 are transferred to an OR gate 73. Also, eight signals from the comparator 61 are transferred to the OR gate 73, and each of those eight signals indicates whether or not two bits of the particular memory cell compare with the desired data. An AND gate transfers the signals from the OR gate 73 to a level ½ flag circuit 74. The level ½ flag circuit 74 indicates when each of the memory cells 33 has been written to the level of the 10 or 01 level, or when all of the program load registers 32 provide the value of 1 to indicate that the programming has been completed. The level ½ flag circuit 74 is used to prohibit over-programming when one memory cell has been programmed to a point just above the 01 level. This is achieved by providing a reference element (reference cell) 41 which is charged to a level just beyond the 01 level but less than the 00 level. This reference cell is used to test cells which are written to the 00 level so that those cells are not overcharged. This reference cell provides a confirmation that a memory cell has reached to the 00 level, before an overcharge actually occurs. When this confirmation is performed, the program load register 32 for this memory cell 33 is disabled. Once all the memory cells are written to the 10 level and the 01 level, the level ½ flag circuit is so set that memory cells written to the 00 level may continue programming. To allow this, the flag circuit and program load registers associated with the memory cells that have been written into the 00 level are reset by a signal from the logic circuit 70. This allows the continued write of memory cells which are being written into the 00 level. During this continued writing, a new reference cell is selected to provide a correct reference value for reaching the 00 level.

Figure 30:
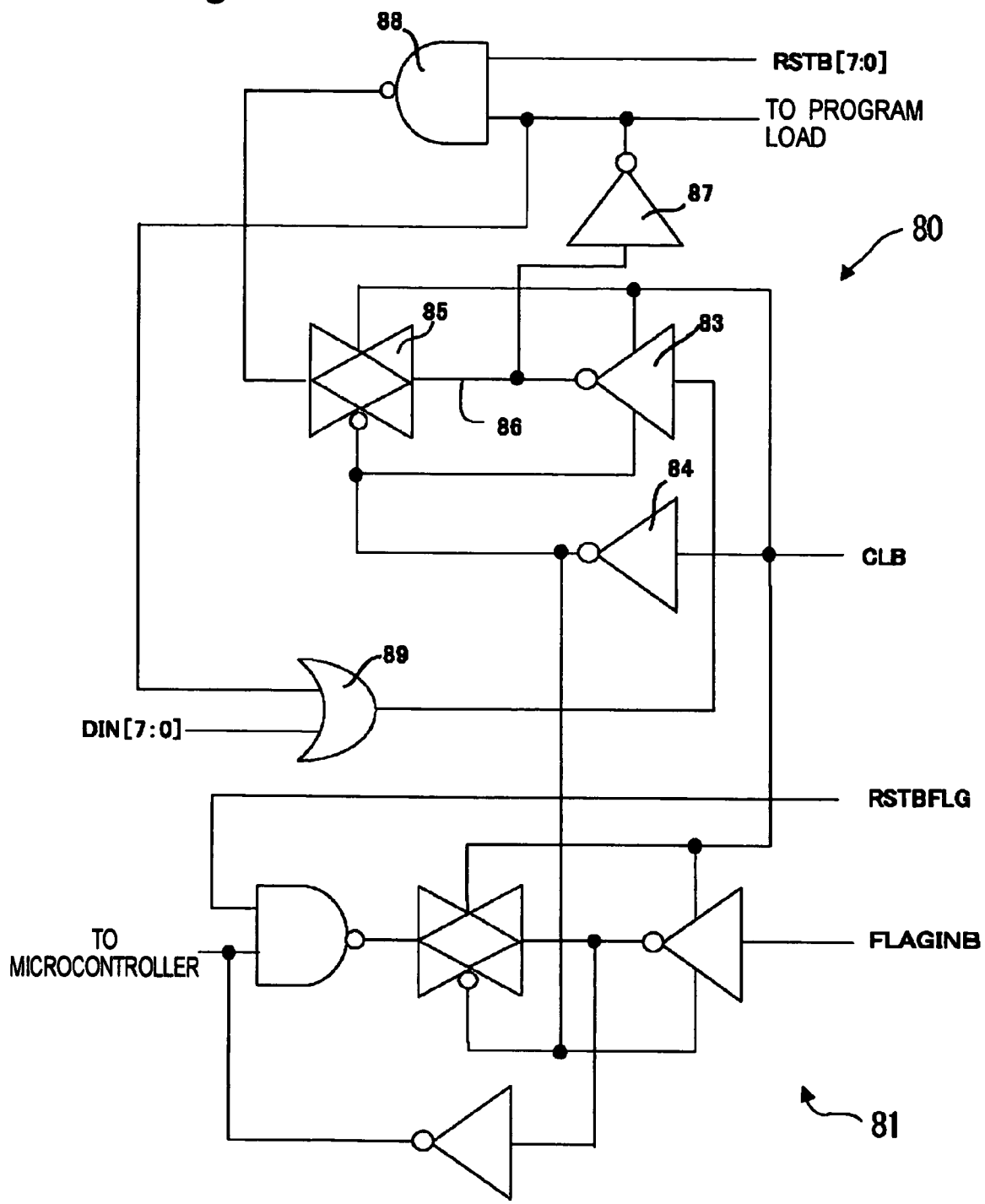
FIG. 30 is a circuit diagram showing part of the circuit of FIG. 29 in detail.

FIG. 30 is a circuit diagram illustrating eight latches 80 (only one latch 80 is shown) used in this program load register 32 and a flag circuit latch 81 associated with eight of latches 80 as a half of the program load register 32. Although shown as they are in FIG. 30, these circuits are part of an identical integrated circuit in one embodiment. Each of the latches 80 and 81 receive a clock input signal CLB. This clock signal is inverted and transferred by an inverter 84 to control (gate) the passage of an input to a tristate inverters 83. The clock input signal CLB is directly transferred to gate the input to a transmission gate 85. Once the clock is removed from the tristate inverter 83, the transmission gate 85 gives feedback to maintain a node 86 in a desired state. The tristate inverter 83 for each memory cell in the program load register 32 receives one bit of data signal DIN[7:0] indicating for each memory cell whether or not the program level has been reached, and clocks the signal to the node 86. This value is given to the output of each of the program load registers 32 by an inverter 87. This value is inverted and transferred through the feedback path to an OR gate 89 so that the program load register 32 cannot be placed in a condition of outputting a 0 once any of the cells has been placed in a condition of outputting a value of 1. This eliminates the problem that a memory cell which has been written to a proper level and thereafter leaked charge (no longer verified) is reprogrammed by a programming circuitry. A reset signal RSTB[7:0] is fed by a NAND gate 88 and the transmission gate 85 to reset the state of the program load register from a state at the node 86 which causes a memory cell to be further written. This reset signal is applied in two cases. The first case is when the programming of memory cells representing one word has been completed and the programming of a new word is to begin. This signal is initiated by the input signal LDCPVRSPB from the microcontroller to the logic circuit 70. The second case of using the reset signal RSTB[7:0] is to allow the programming signals to be provided once 10 and 01 levels have been achieved by all the memory cells that should be written to those levels. In this second case, the output associated with the flag circuit latch 81 is transferred to the microcontroller 22 when the flag circuit latch receives an indication representing that all the memory cells to be written to the 10 and 01 levels have reached the levels. In this second case, once all the memory cells have reached the 01 level, the reset signal RSTB[7:0] is generated only for the registers 32 which are to be written to the 00 level once all of the memory cells have reached the 01 level. This makes it possible that the memory cells being programmed to the 00 level receive further programming pulses after all the other memory cells are raised to those lower charge levels, and eliminates overprogramming.

The flag circuit latch 81 responds in a similar manner to the signal FLAGINB and a flag reset signal RSTBFLG. The signal FLAGINB is generated when all memory cells that should be written to the 10 and 01 states have been written into the 10 and 01 states. The flag reset signal RSTBFLG is generated and causes the microcontroller 20 to generate the signal LD12RST that causes the logic circuit 70 to initiate the reset signal RSTB[7:0] when latches of the register 32 being written to the 00 level are reset.

These program load registers 32 and the associated flag circuits provide a desired capability that when a memory cell has already reached a correct programming level, the problems associated with overprogramming and leakage from the memory cell can be overcome. Further, the circuitry also provides a hardware means for verifying in quite a few cycles the write at a plurality of levels to which memory cells have been written. This allows the verify operation to be achieved much faster than has been enabled by conventional software verify process. The hardware process disclosed herein accomplishes the verify operation in about 2 microcode cycles required by the microcontroller 20 to achieve the operations. With respect to some verify operations, particularly verify operations accompanied by multi-level write, the hardware verification is order-of-magnitude faster than the software verification. For example, in order to verify in software where only 1 bit is stored in each memory cell, first data within the memory cell must be accessed, then desired data must be accessed, and then data must be compared, and then the program load circuit must be written to for those memory cells to be programmed. Each of these steps needs a microcode cycle. Verification in which multi-level storage is involved needs much more cycles to achieve it.

Figure 31:
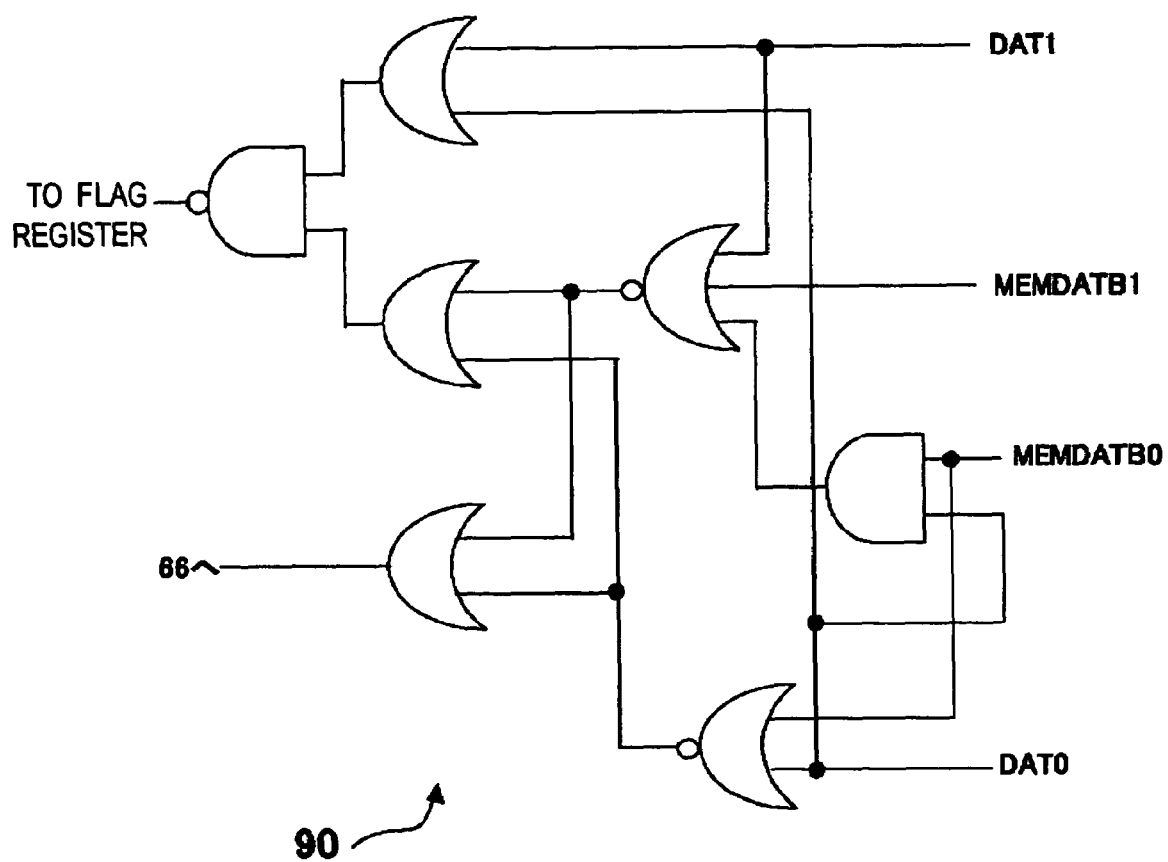
FIG. 31 is a circuit diagram showing another part of the circuit of FIG. 29 in detail.

FIG. 31 shows a circuit 90 to be used for comparison between levels to which the memory cells 33 should be written and current states of those individual cells. This circuit 90 may be provided two for each of memory cells, and used as the comparator 60 for example. The circuit 90 receives two bits of data DAT0 and DAT1 indicating two bits that should be written into the memory, as well as two or more bits of data MEMDATB0 and MEMDATB1 indicating current states of the memory cells. With respect to each of the memory elements 33, values of the data are compared, by which a flag signal FLAG is given. If two desired bits are not the same as the two actual bits, then a 0 is given as a flag bit. If the two desired bits are the same as the two actual bits, then a 1 is given as a flag bit. This value is inverted, and a summed flag signals are transferred as a FAGINB signal to the flag register via the OR gate 73 of FIG. 29. A second output of the circuit 90 is transferred as various DIN[7:0] signals by the multiplexers 66 and 65 and the OR gate 67, and is used in the above-described manner when a desired charge level is reached.

(The Fourteenth Embodiment)

Figure 32:
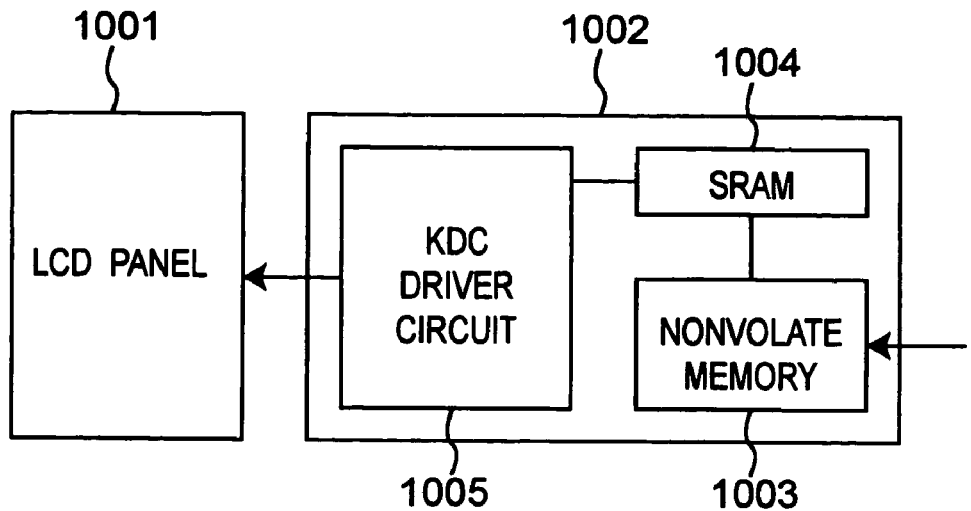
FIG. 32 is a schematic structural view of a liquid crystal display (the fourteenth embodiment) in which the semiconductor storage device of an embodiment of the present invention is incorporated.

As an application example of the aforementioned semiconductor storage device, there can be enumerated, for example, a rewritable nonvolatile memory for the image adjustment of an LCD panel as shown in FIG. 32.

The LCD panel 1001 shown in FIG. 32 is driven by an LCD driver 1002. Inside the LCD driver 1002, there exist a nonvolatile memory section 1003 as a semiconductor storage device, an SRAM section 1004 and an LCD driver circuit 1005. The nonvolatile memory section 1003 includes the nonvolatile memory element of an embodiment of the present invention preferably constructed of the semiconductor storage device described in connection with the tenth through thirteenth embodiments. The nonvolatile memory section 1003 has an externally rewritable construction.

The information stored in the nonvolatile memory section 1003 is transferred to the SRAM section 1004 when the power supply of the equipment is turned on. The LCD driver circuit 1005 can read the storage information from the SRAM section 1004 at need. By providing the SRAM section, the storage information can be read with very high speed.

The LCD driver 1002 may either be externally attached to the LCD panel 1001 as shown in FIG. 32 or formed on the LCD panel 1001.

The LCD panel changes the gradation displayed by giving multi-step voltages to the pixels, where the relation between the given voltage and the displayed gradation has a variation depending on each product. Therefore, by storing information for correcting the variations of individual products after the completion of each product and performing correction based on the information, the image qualities of products can be uniformed. Therefore, it is preferable to mount the rewritable nonvolatile memory for storing the correction information on the LCD driver. It is preferable to employ the nonvolatile memory element of an embodiment of the present invention as this nonvolatile memory and particularly preferable to employ the semiconductor storage device described in connection with the tenth through thirteenth embodiments in which the nonvolatile memory elements of the present invention are integrated.

If the memory element of an embodiment of the present invention is employed as the nonvolatile memory for adjusting the image of the LCD panel, the manufacturing cost can be reduced since the process of consolidation with the circuits such as the LCD driver and so on is easy. Moreover, the semiconductor storage devices described in connection with the tenth through fourteenth embodiments have a comparatively small memory scale and are particularly suitable for the case where reliability and stability are valued. Normally, the nonvolatile memory for adjusting the image of the LCD panel has a capacity of several kilobytes, and this memory scale is comparatively small. Therefore, it is especially preferable to employ the semiconductor storage device described in connection with the tenth through fourteenth embodiment as the nonvolatile memory for adjusting the image of the LCD panel.

(The Fifteenth Embodiment)

Figure 33:
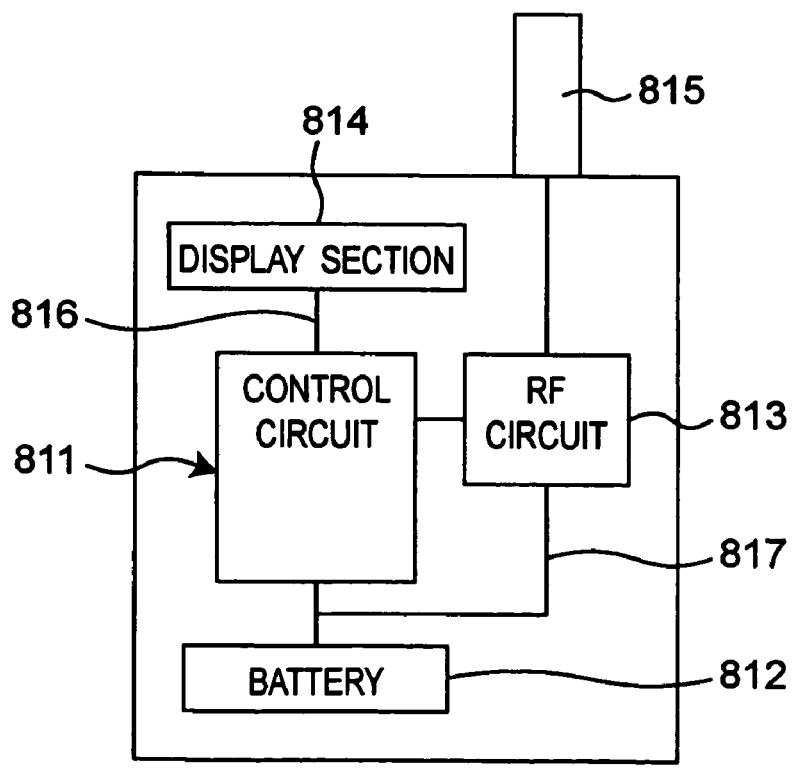
FIG. 33 is a schematic structural view of portable electronic equipment (the fifteenth embodiment) in which the semiconductor storage device of an embodiment of the present invention is incorporated.
Figure 34:
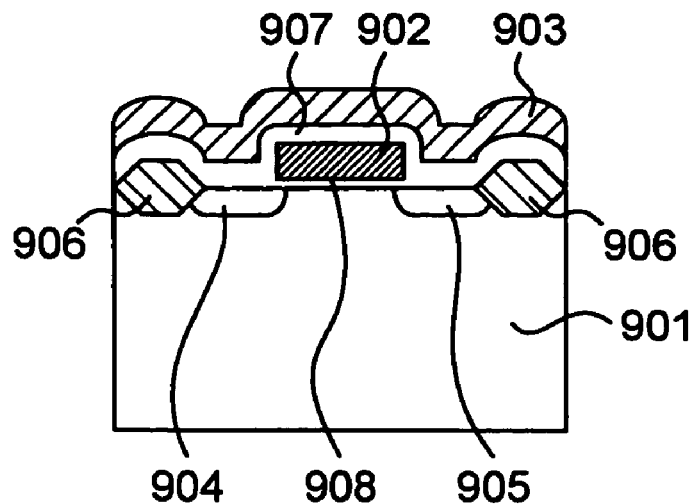
FIG. 34 is a schematic sectional view of part of a conventional flash memory.

FIG. 33 shows a portable telephone that is the portable electronic equipment into which the aforementioned semiconductor storage device is incorporated.

This portable telephone is constructed mainly of a control circuit 811, a battery 812, an RF (Radio Frequency) circuit 813, a display section 814, an antenna 815, a signal line 816, a power line 817 and so on, and the aforementioned semiconductor storage device of the present invention is incorporated into the control circuit 811. The control circuit 811 should preferably be an integrated circuit that employs elements of an identical structure for a memory circuit element and a logical circuit element. This arrangement facilitates the manufacturing of the integrated circuit and allows particularly the manufacturing cost of the portable electronic equipment to be reduced.

As described above, by employing a semiconductor storage device that allows an easy consolidation process of the memory section and the logic circuit section and permits high-speed read operation for portable electronic equipment, it becomes possible to improve the operating speed of the portable electronic equipment and reduce the manufacturing cost, allowing inexpensive portable electronic equipment of high reliability and high performance to be obtained.

As is apparent from the above, according to the semiconductor storage device of embodiments of the present invention, the memory element of the memory cell array comprises the memory function bodies located on both sides of the gate electrode in place of the conventional floating gate, and therefore, the thickness of the gate insulator can be reduced, allowing the semiconductor storage device to be minute.

Furthermore, the formation process of the memory element has a high affinity for the formation process of the ordinary transistor and is able to remarkably reduce the number of masks and the number of processes in comparison with the case where a memory cell array of the conventional EEPROM and the peripheral circuit are consolidated. Therefore, the yield of chips can be improved, and the cost can be reduced.

Furthermore, in the memory element, the memory function borne by the memory function bodies is separated from the transistor operation function borne by the gate insulator. Therefore, it is easy to restrain the short-channel effect by reducing the film thickness of the gate insulator with a sufficient memory function possessed. Furthermore, the value of the current flowing between the diffusion regions due to rewrite changes more largely than in an EEPROM. Therefore, it becomes easy to distinguish between the write state and the erase state of the semiconductor storage device.

Further, the semiconductor storage device of embodiments of the present invention comprises a program verify circuit having a program load circuit including a circuit for, once the memory element has first been verified as having been written by the comparator, excluding storage of a value indicating that the memory element needs to be further written with respect to each memory element. Therefore, programming pulses are not applied to memory elements that have been correctly written although not having been verified because of dissipation of electric charge. Thus, the memory elements can be programmed fast and verified fast, and yet can eliminate the possibility that overcharged memory elements may occur during the write operation.

Furthermore, portable electronic equipment according to an embodiment of the present invention includes the aforementioned semiconductor storage device. Therefore, the consolidation process of the memory elements and the logic circuit becomes simple, and the operation speeds can be improved and the manufacturing cost can be reduced. Further, the portable electronic equipment has advantages of low price and high reliability.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor storage device comprising a memory cell array having a plurality of memory elements, and a program verify circuit for controlling application of programming voltages into the plurality of memory elements, wherein
   each of the memory elements comprises:
   a gate electrode formed on a semiconductor layer via a gate insulator;
   a channel region arranged below the gate electrode via the gate insulator;
   diffusion regions which are arranged on opposite sides of the channel region and which have a conductive type opposite to that of the channel region; and
   memory function bodies which are formed on opposite sides of the gate electrode and which have a function of retaining electric charge or polarization, and wherein
   the program verify circuit comprises:
   a comparator for comparing a current state of each memory element being programmed with a state to which the memory element is to be programmed; and
   a program load circuit which is connected to the comparator and which stores, for each memory element, a value outputted from the comparator and indicating whether or not the memory element should be further programmed,
   the program load circuit including a circuit for, once the memory element has initially been verified by the comparator as having been programmed, precluding storing for each memory element a value indicating that the memory element needs to be further programmed.

2. The semiconductor storage device as claimed in claim 1, wherein the circuit for precluding storing for each memory element the value comprises a latch and a feedback circuit for controlling an input to the latch depending on a state of the latch when a value outputted from the comparator is applied.

3. The semiconductor storage device as claimed in claim 1, further comprising a flag circuit for prohibiting overprogramming of the memory element.

4. The semiconductor storage device as claimed in claim 3, wherein the flag circuit comprises a register for receiving an input from the program load circuit indicating whether the memory element is programmed or to be programmed.

5. The semiconductor storage device as claimed in claim 3, further comprising a controller circuit for resetting the program load circuit and the flag circuit.

6. The semiconductor storage device as claimed in claim 1, wherein at least part of each of the memory function bodies of the memory element are overlapped with part of each of the diffusion regions.

7. The semiconductor storage device as claimed in claim 1, wherein each of the memory function bodies of the memory element includes a film having a surface roughly parallel to a surface of the gate insulator and having a function of retaining electric charge.

8. The semiconductor storage device as claimed in claim 1, wherein each of the memory function bodies of the memory element further includes a charge retention film extending roughly parallel to a side face of the gate electrode.

9. The semiconductor storage device as claimed in claim 1, wherein the semiconductor layer of the memory element has a region located between the diffusion region and the channel region and doped more heavily than vicinities of a semiconductor layer surface below the gate electrode.

10. The semiconductor storage device as claimed in claim 1, wherein the memory element has an insulation film which insulates a film having a surface roughly parallel to a surface of the gate insulator and a function of retaining electric charge from the channel region or the semiconductor layer, and the insulation film has a film thickness thinner than a film thickness of the gate insulator and is not smaller than 0.8 nm.

11. Portable electronic equipment comprising the semiconductor storage device claimed in claim 1.

12. A semiconductor storage device comprising a memory cell array having a plurality of memory elements, and a program verify circuit for controlling application of programming voltages into the plurality of memory elements, wherein
    each of the memory elements comprises:
    a gate electrode formed on a semiconductor layer via a gate insulator;
    a channel region arranged below the gate electrode via the gate insulator;
    diffusion regions which are arranged on opposite sides of the channel region and which have a conductive type opposite to that of the channel region; and
    memory function bodies which are formed on opposite sides of the gate electrode and which have a function of retaining electric charge or polarization, and wherein
    the program verify circuit comprises:
    comparator means for comparing a current state of each memory element being programmed with a state to which the memory element is to be programmed; and
    storage means which is connected to the comparator means and which stores, for each memory element, a value outputted from the comparator means and indicating whether or not the memory element should be further programmed,
    the storage means including means for, once the memory element has initially been verified by the comparator as having been programmed, precluding storing for each memory element a value indicating that the memory element needs to be further programmed.

13. The semiconductor storage device as claimed in claim 12, wherein the means for precluding storing for each memory element the value comprises a latch and a feedback circuit for controlling an input to the latch depending on a state of the latch when a value outputted from the comparator means is applied.

14. The semiconductor storage device as claimed in claim 12, further comprising means for prohibiting overprogramming of the memory element.

15. The semiconductor storage device as claimed in claim 14, wherein the means for prohibiting overprogramming of the memory element comprises a register for receiving an input from the storage means indicating whether the memory element is programmed or to be programmed.

16. The semiconductor storage device as claimed in claim 14, further comprising a controller circuit for resetting the storage means and the means for prohibiting overprogramming of the memory element.

17. The semiconductor storage device as claimed in claim 12, wherein at least part of each of the memory function bodies of the memory element are overlapped with part of each of the diffusion regions.

18. The semiconductor storage device as claimed in claim 12, wherein each of the memory function bodies of the memory element includes a film having a surface roughly parallel to a surface of the gate insulator and having a function of retaining electric charge.

19. The semiconductor storage device as claimed in claim 12, wherein each of the memory function bodies of the memory element further includes a charge retention film extending roughly parallel to a side face of the gate electrode.

20. The semiconductor storage device as claimed in claim 12, wherein the semiconductor layer of the memory element has a region located between the diffusion region and the channel region and doped more heavily than vicinities of a semiconductor layer surface below the gate electrode.

21. The semiconductor storage device as claimed in claim 12, wherein the memory element has an insulation film which insulates a film having a surface roughly parallel to a surface of the gate insulator and a function of retaining electric charge from the channel region or the semiconductor layer, and the insulation film has a film thickness thinner than a film thickness of the gate insulator and is not smaller than 0.8 nm.

22. Portable electronic equipment comprising the semiconductor storage device claimed in claim 12.

* * * * *